(12) United States Patent
Lai et al.

(10) Patent No.: US 12,336,273 B2
(45) Date of Patent: Jun. 17, 2025

(54) METHOD FOR FORMING SEMICONDUCTOR STRUCTURE USING FLUORINE TO TREAT GATE STACK

(71) Applicant: Taiwan Semiconductor Manufacturing Company, Ltd., Hsinchu (TW)

(72) Inventors: Pei Ying Lai, Hsinchu (TW); Chia-Wei Hsu, Taipei (TW); Tsung-Da Lin, Pingtung County (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 451 days.

(21) Appl. No.: 17/709,766

(22) Filed: Mar. 31, 2022

(65) Prior Publication Data
US 2023/0317523 A1    Oct. 5, 2023

(51) Int. Cl.
*H10D 84/03* (2025.01)
*H10D 84/01* (2025.01)
*H10D 84/83* (2025.01)

(52) U.S. Cl.
CPC ....... *H10D 84/038* (2025.01); *H10D 84/0144* (2025.01); *H10D 84/0158* (2025.01); *H10D 84/834* (2025.01)

(58) Field of Classification Search
CPC ..... H01L 29/36–365; H01L 21/823431; H01L 21/02694; H01L 29/66803; H01L 21/823821; H01L 21/845; H01L 27/0886; H01L 27/0924; H01L 27/1211; H01L 29/41791; H10B 12/36; H10B 12/056
See application file for complete search history.

(56) References Cited

U.S. PATENT DOCUMENTS

| 2016/0365347 | A1* | 12/2016 | Bao | H01L 29/4958 |
| 2017/0125413 | A1* | 5/2017 | Wu | H01L 21/76224 |
| 2020/0098640 | A1* | 3/2020 | Savant | H10D 30/024 |
| 2020/0135915 | A1* | 4/2020 | Savant | H10D 64/017 |
| 2022/0130679 | A1* | 4/2022 | Wang | H01L 21/28568 |

FOREIGN PATENT DOCUMENTS

| TW | 201905985 A | 2/2019 |
| TW | 201911390 A | 3/2019 |
| TW | 202201561 A | 1/2022 |

* cited by examiner

*Primary Examiner* — Evren Seven
*Assistant Examiner* — Cole Leon Lindsey
(74) *Attorney, Agent, or Firm* — Birch, Stewart, Kolasch & Birch, LLP

(57) ABSTRACT

A method for forming a semiconductor structure is provided. The method includes forming a first fin structure over a first region of a substrate and forming a second fin structure over a second region of a substrate, forming a first gate dielectric layer around the first fin structure and forming a second gate dielectric layer around the second fin structure, forming a barrier layer over the first gate dielectric layer, treating the substrate with a first fluorine-containing gas, forming a work function layer over the second gate dielectric layer after treating the substrate with the first fluorine-containing gas, and treating the substrate with a second fluorine-containing gas after forming the work function layer over the second gate dielectric layer.

20 Claims, 40 Drawing Sheets

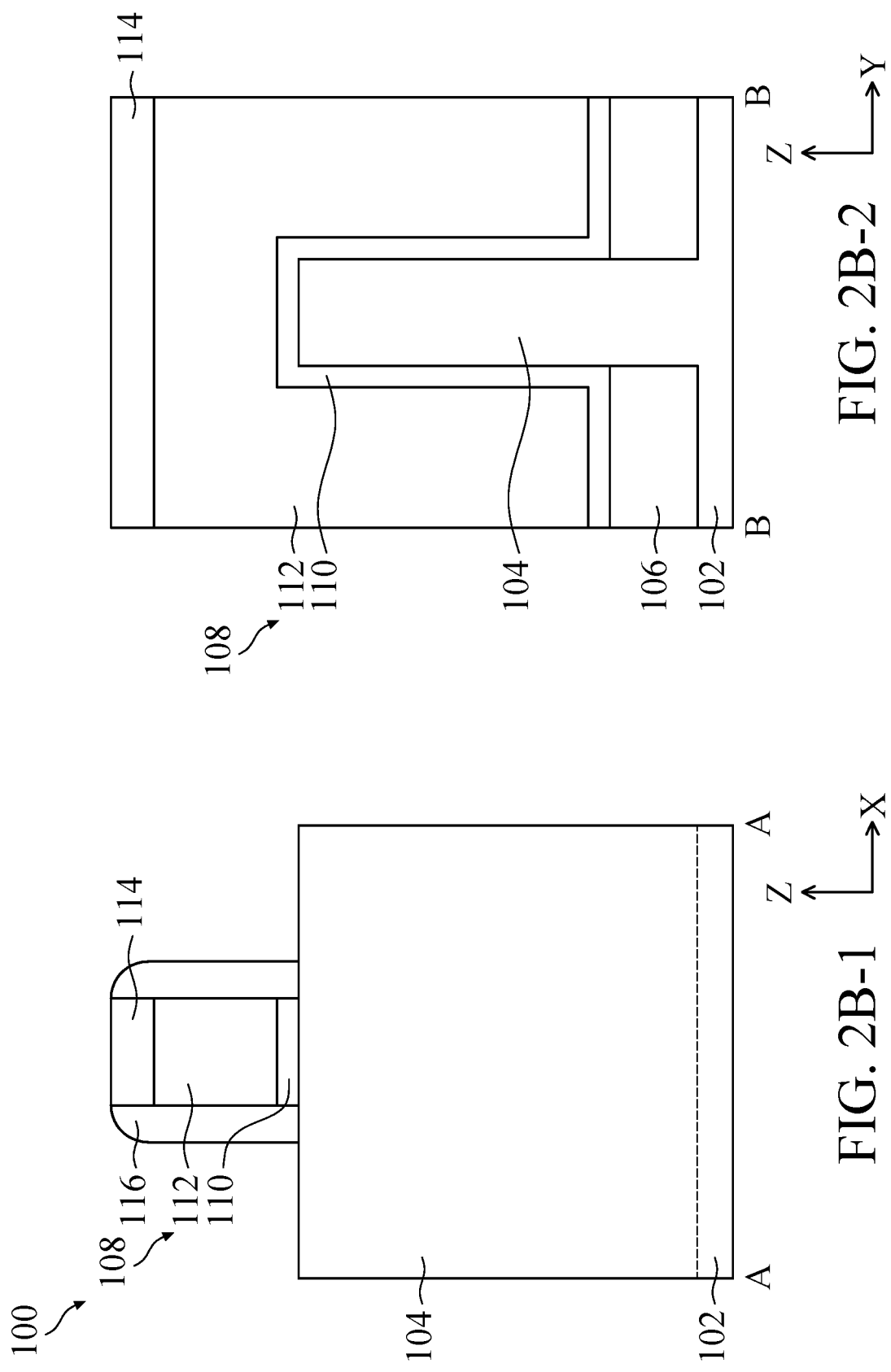

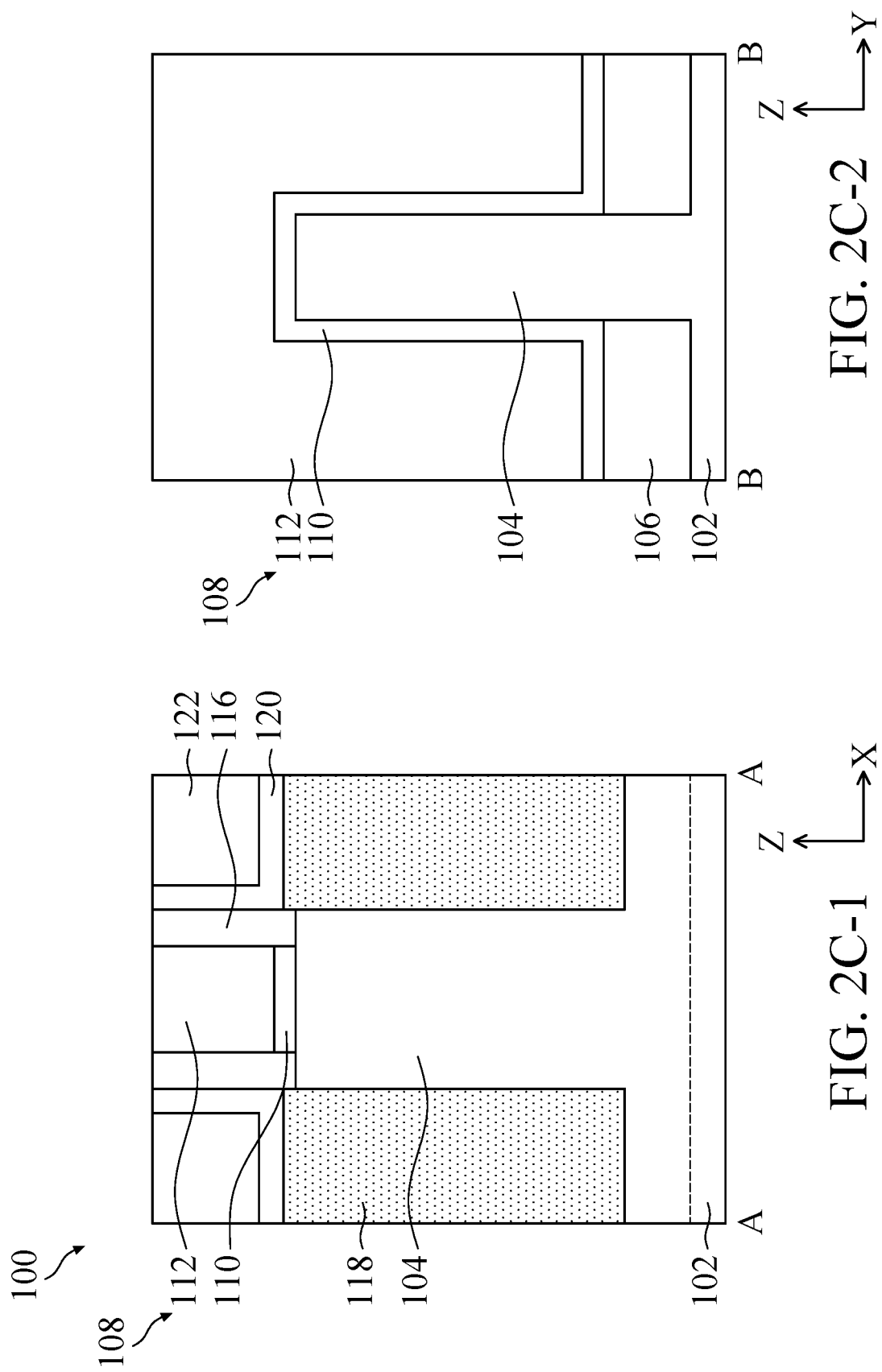

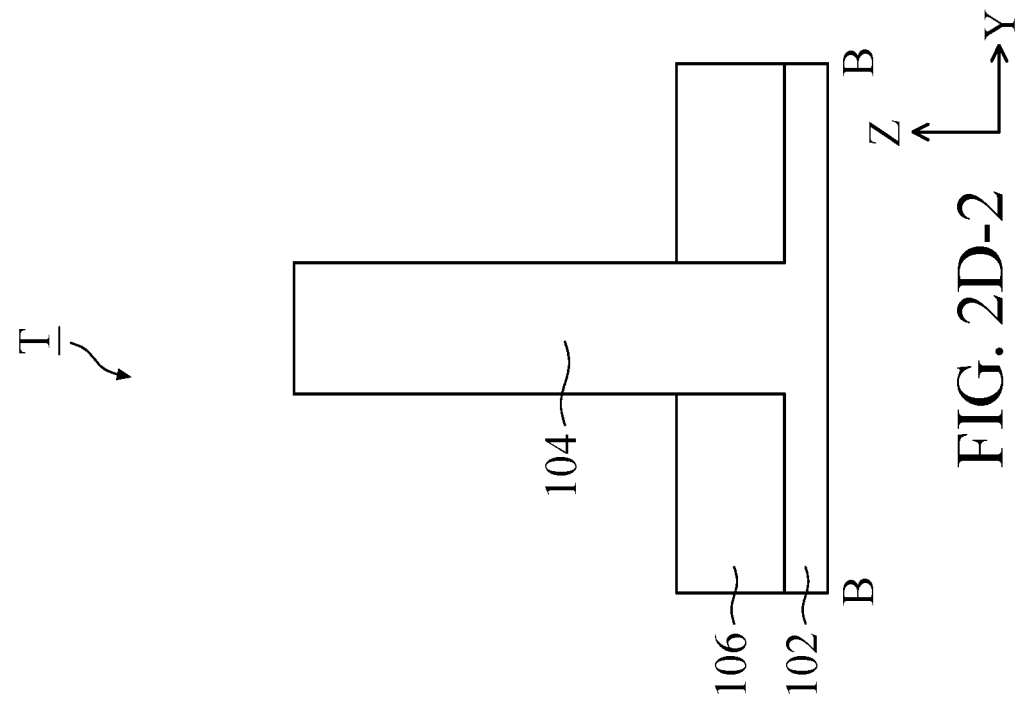
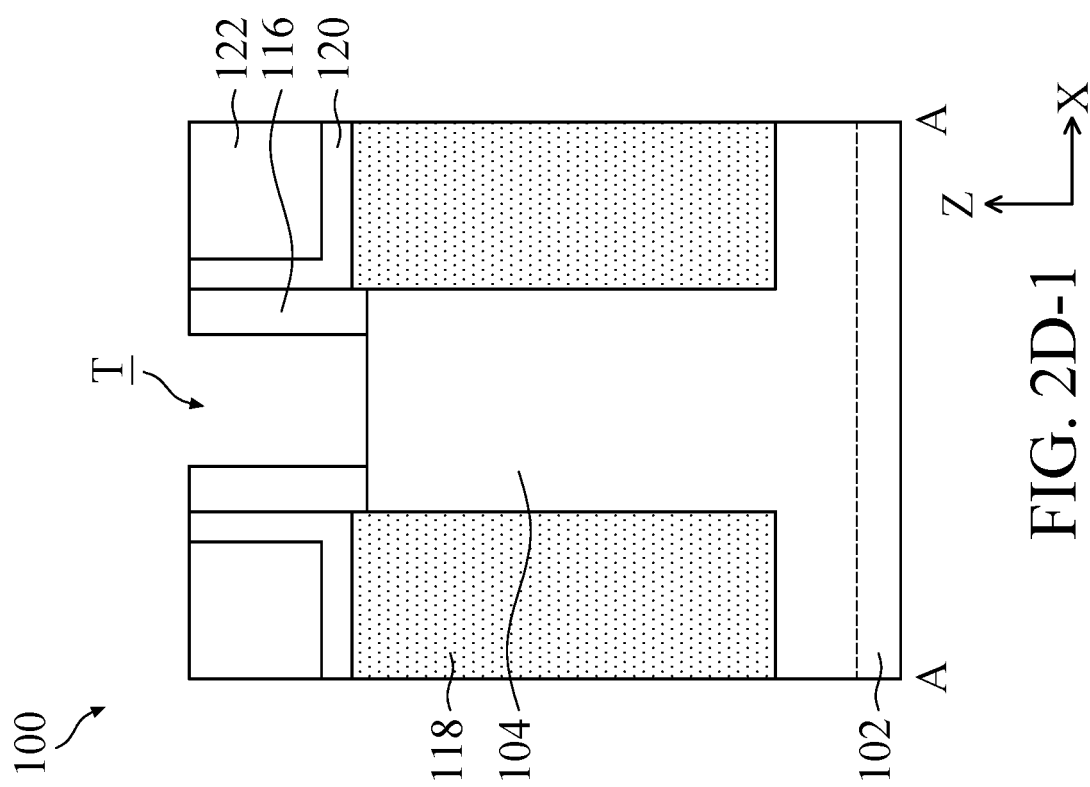

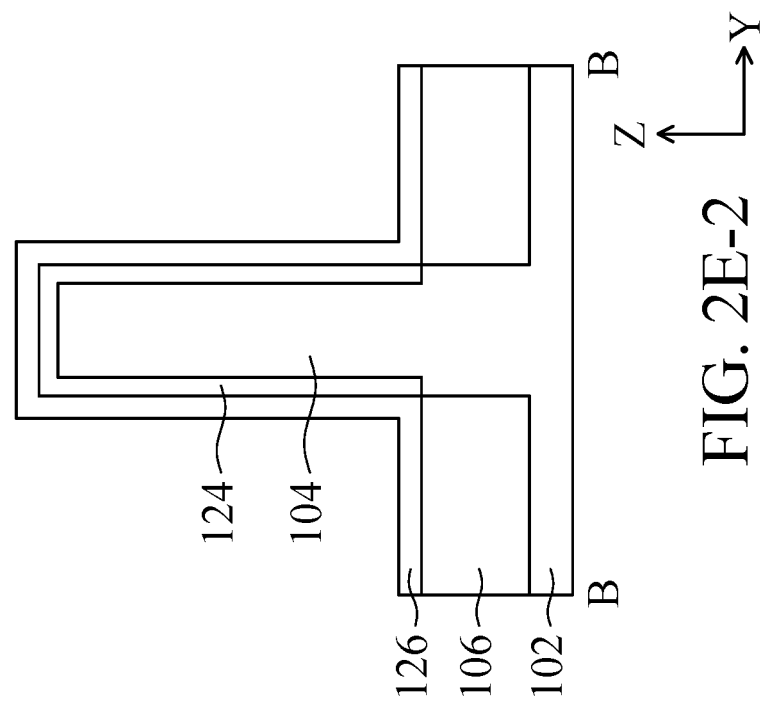
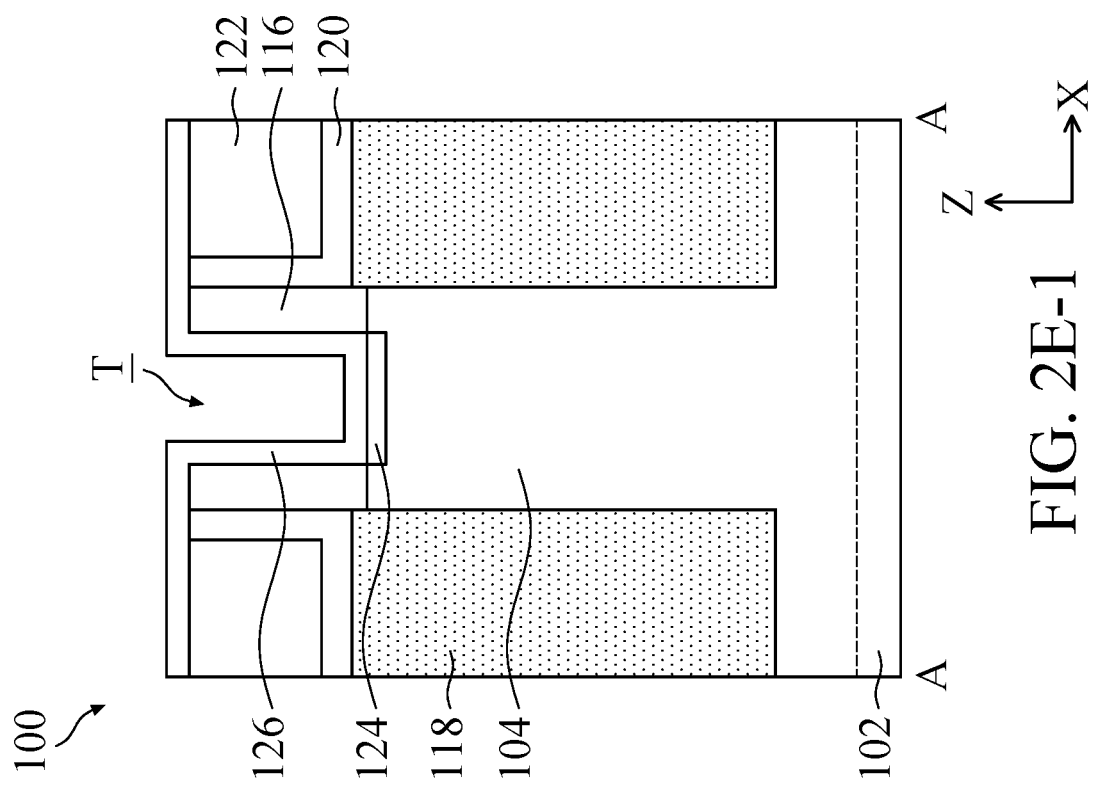
FIG. 2E-1
FIG. 2E-2

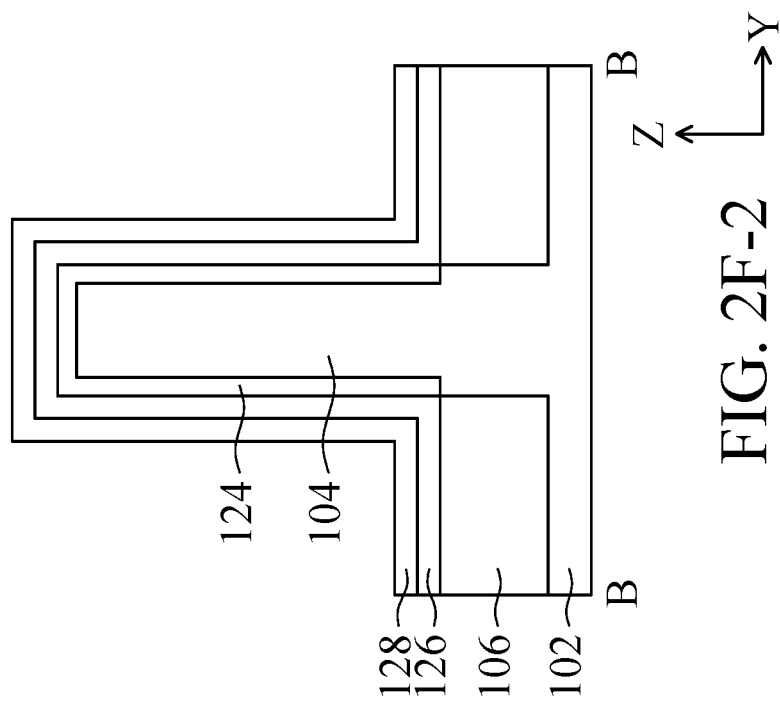
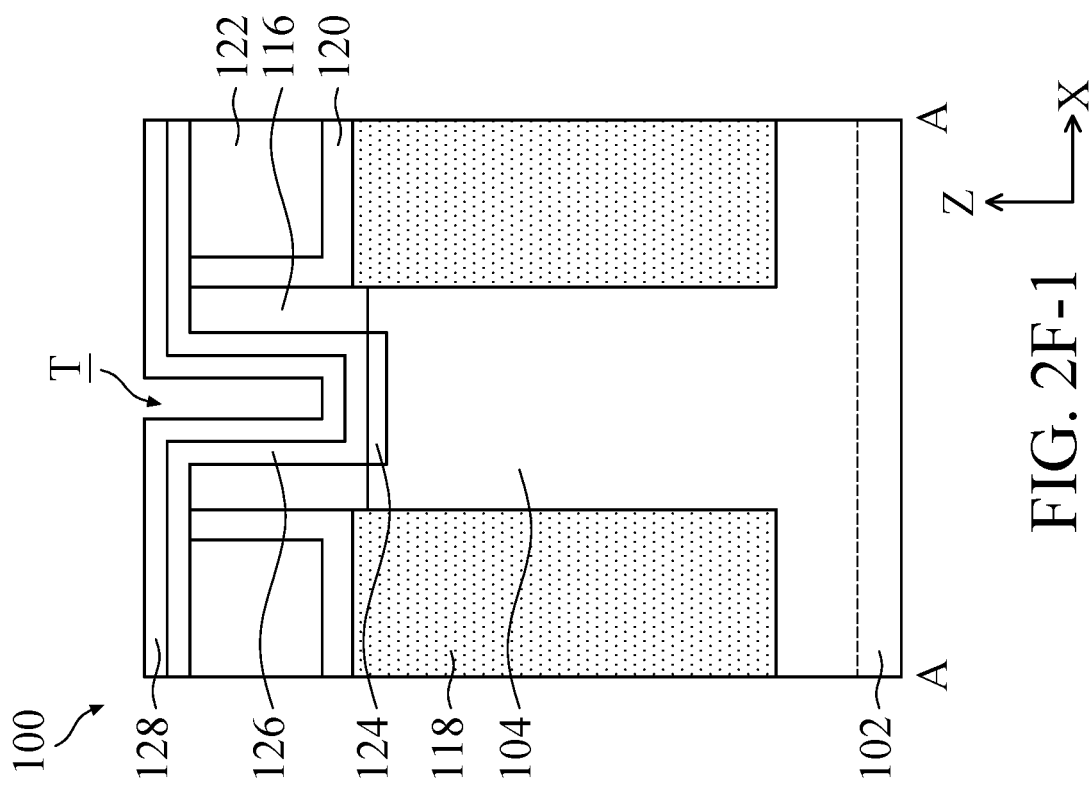
FIG. 2F-1    FIG. 2F-2

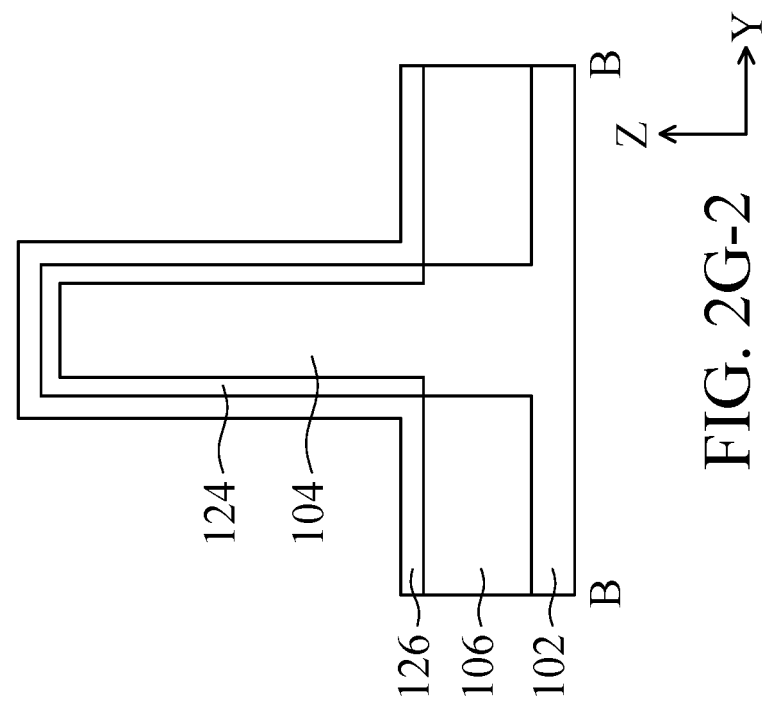
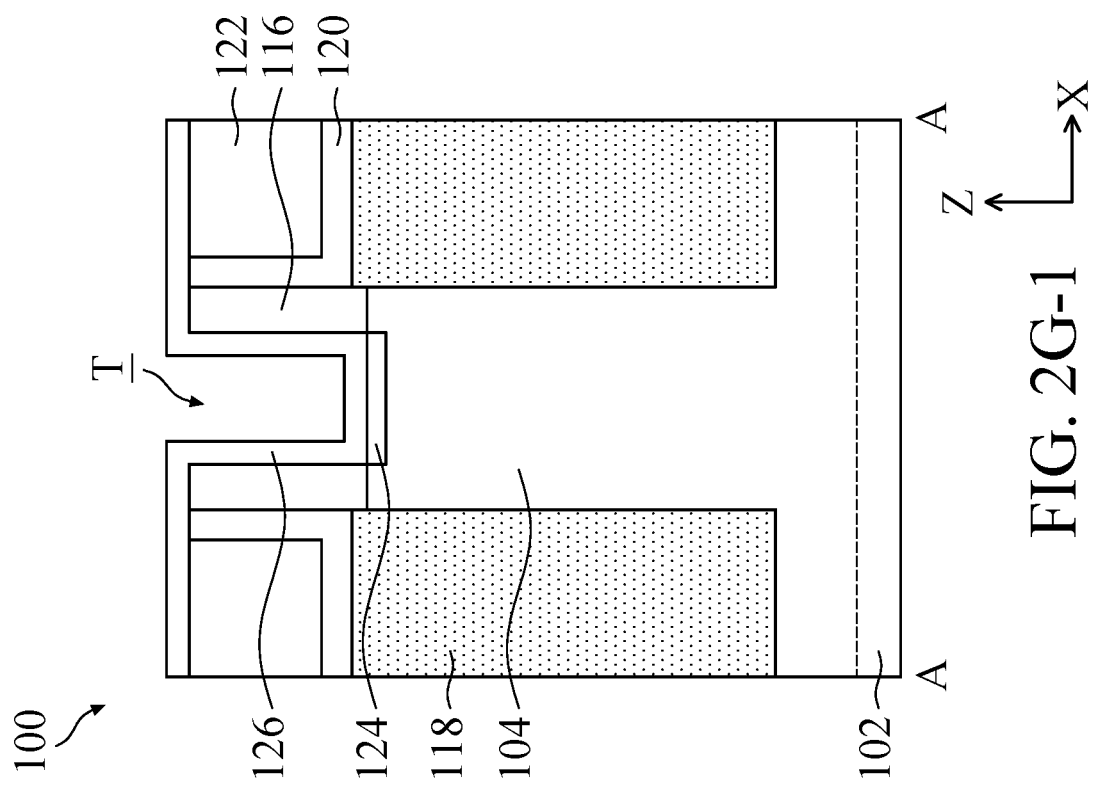

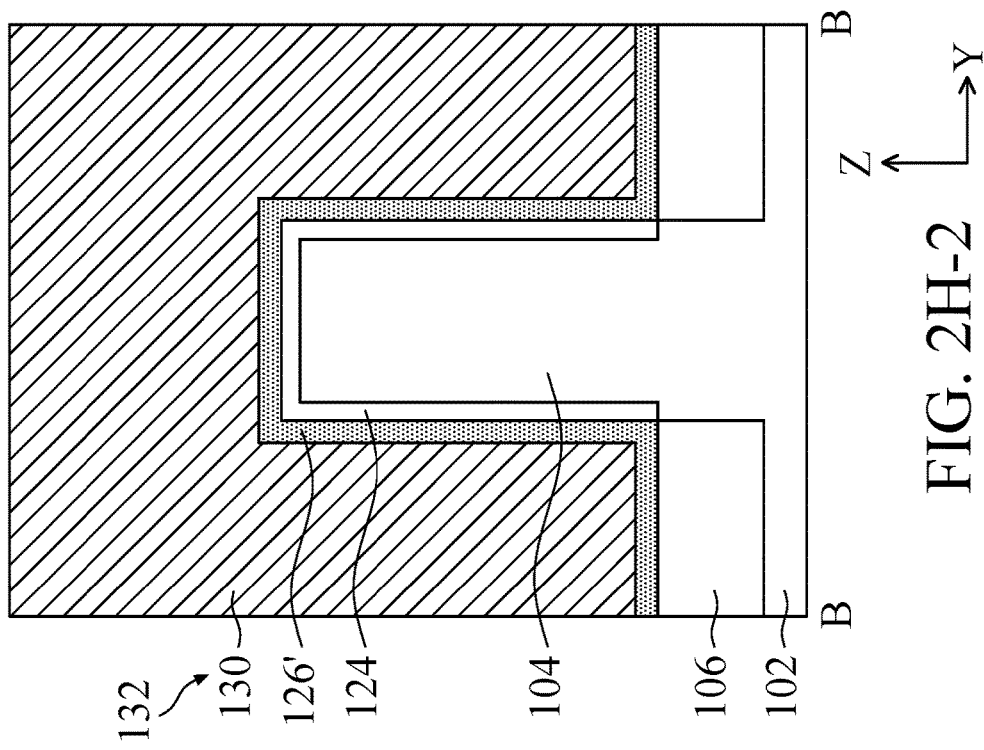
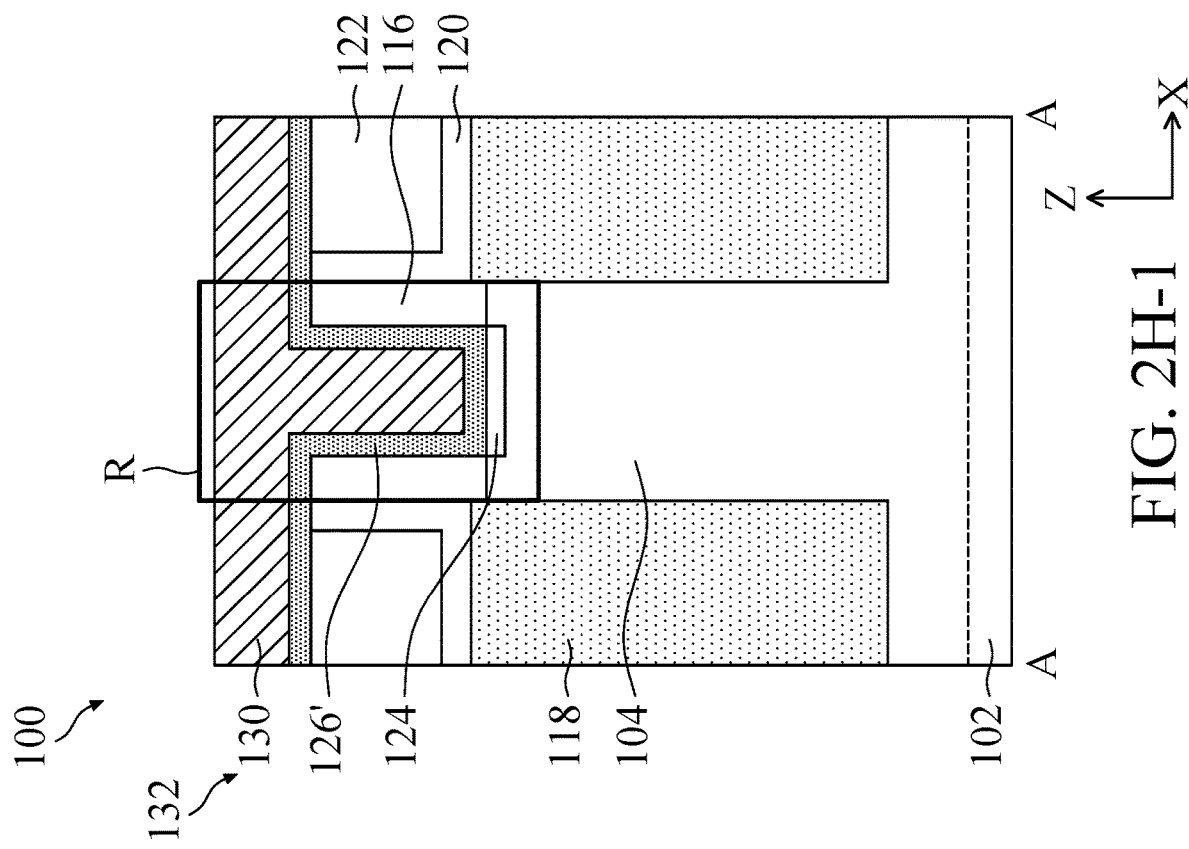
FIG. 2H-2
FIG. 2H-1

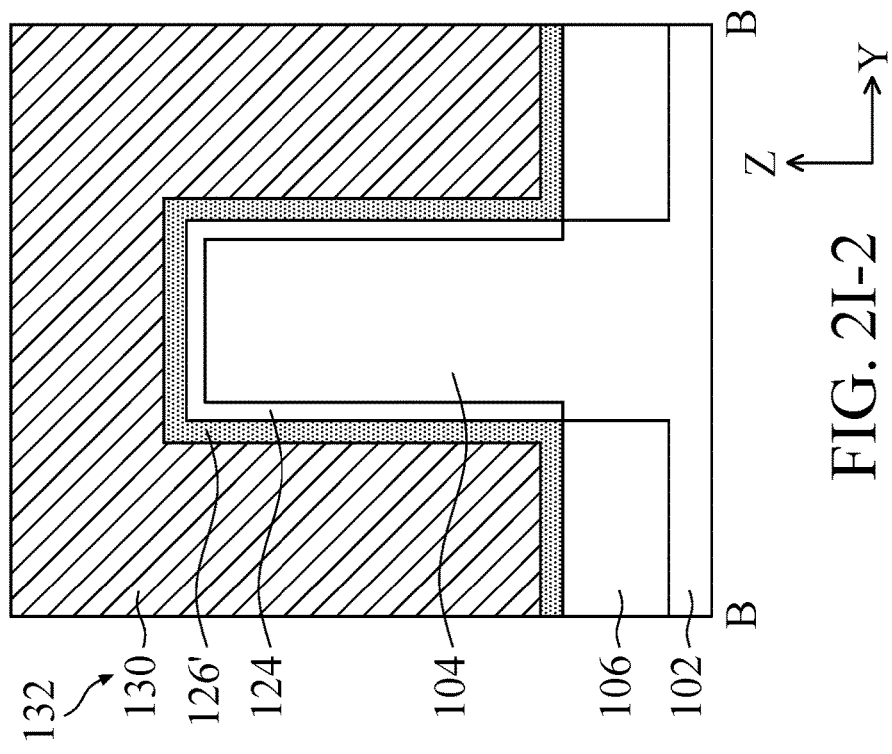
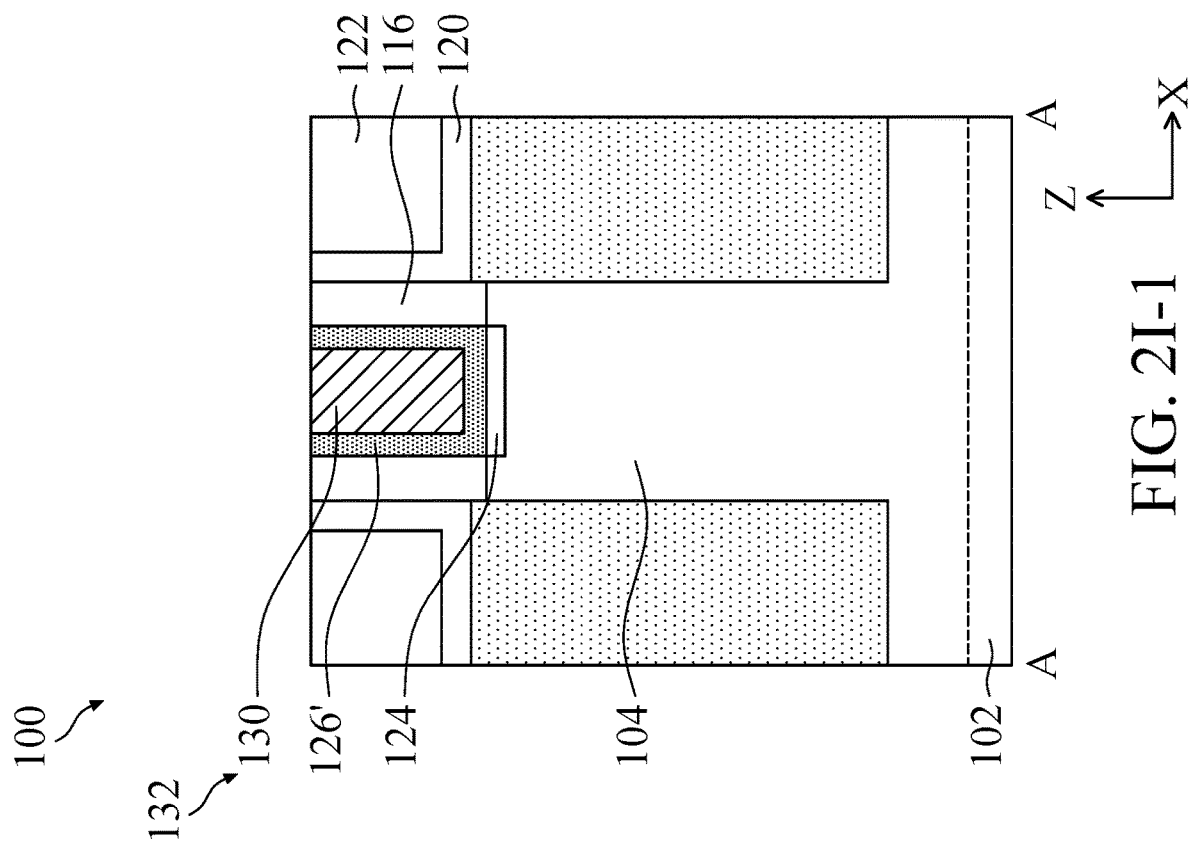
FIG. 2I-1
FIG. 2I-2

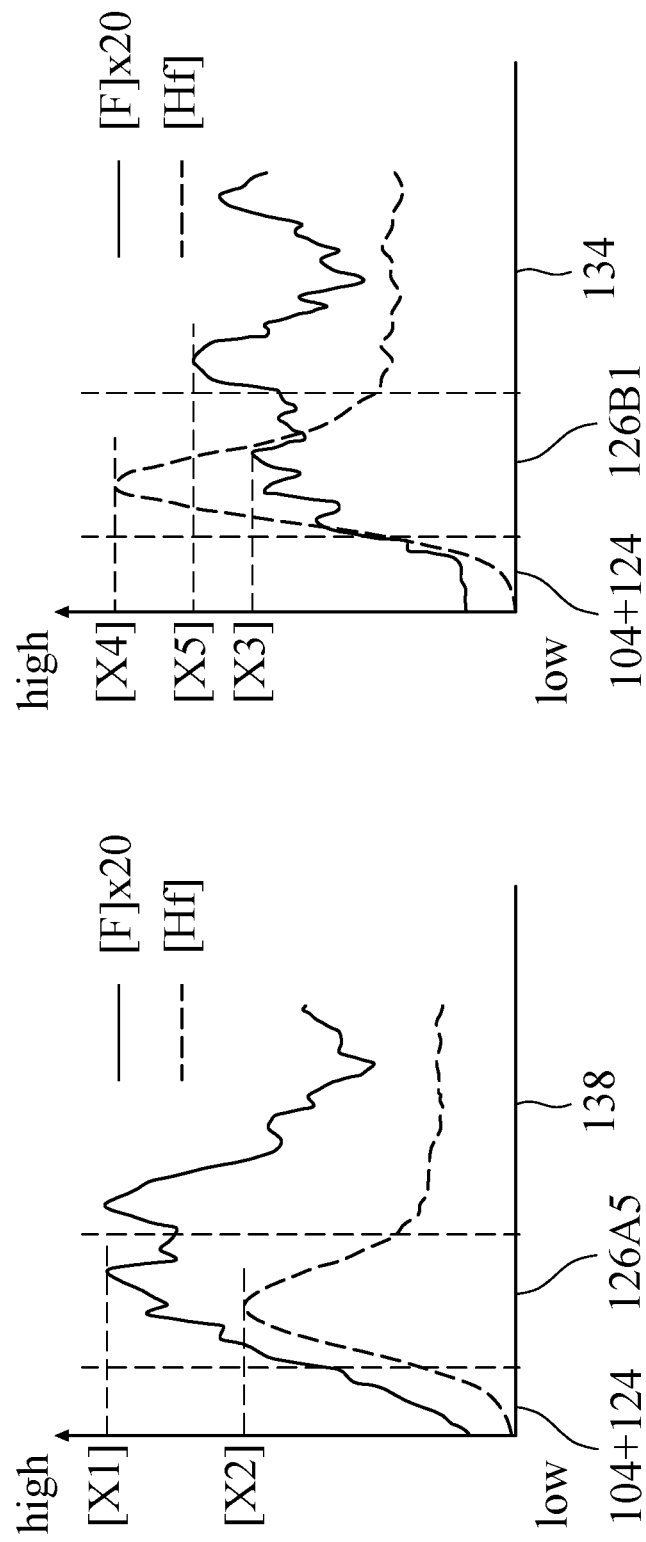

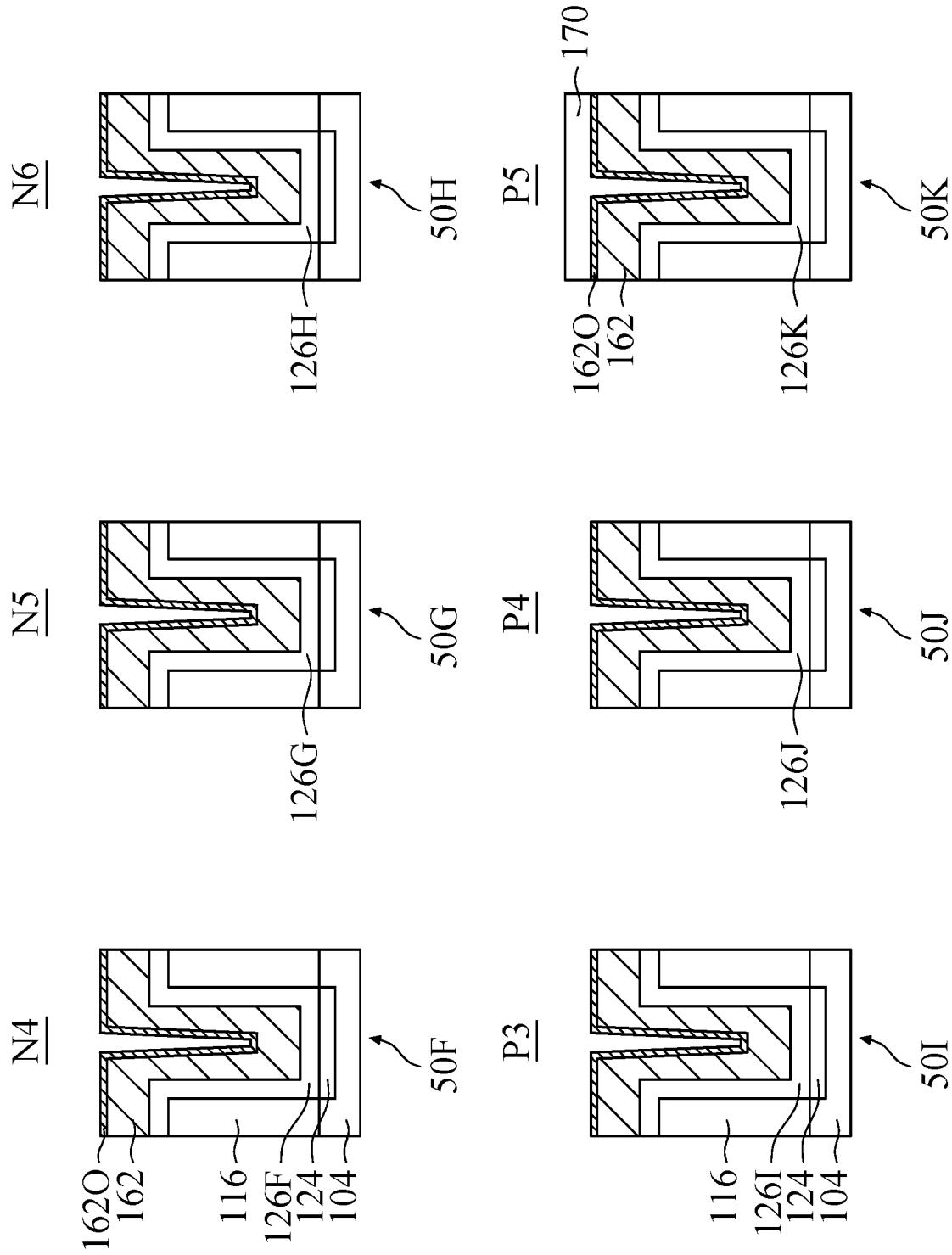

METHOD FOR FORMING SEMICONDUCTOR STRUCTURE USING FLUORINE TO TREAT GATE STACK

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from the substrate. The channel of the FinFET is formed in this vertical fin. A gate is provided over the fin. The advantages of a FinFET may include reducing the short channel effect and providing a higher current flow.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 2A-1 through 2I-2 are cross-sectional views illustrating the formation of a semiconductor device at various intermediate stages, in accordance with some embodiments of the disclosure.

FIGS. 4A and 4B are schematic views exhibiting profiles of the fluorine concentration and the hafnium concentration of the gate dielectric layer and neighboring components, in accordance with some embodiments of the disclosure.

FIGS. 8A through 8J are cross-sectional views illustrating the formation of the metal gate electrode layer and fluorination treatments of gate dielectric layers at various intermediate stages, in accordance with some embodiments of the disclosure.

DETAILED DESCRIPTION

Figure 1:
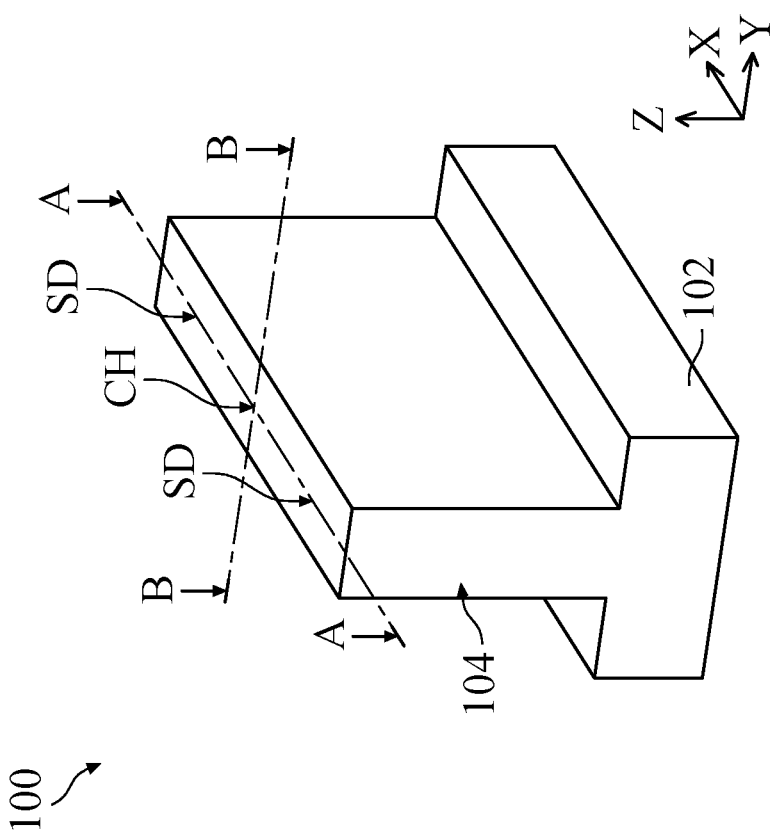
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Embodiments of the disclosure form a semiconductor structure with FinFETs. The fins may be patterned by any suitable method. For example, the fins may be patterned using one or more photolithography processes, including double-patterning or multi-patterning processes, Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate and patterned using a photolithography process. Spacers are formed alongside the patterned sacrificial layer using a self-aligned process. The sacrificial layer is then removed, and the remaining spacers may then be used to pattern the fins.

Embodiments of forming a semiconductor structure having various devices (e.g., FinFETs) with different threshold voltages are provided. The aspect of the present disclosure is directed to incorporating fluorine into gate dielectric layers of the gate stacks for various devices. The semiconductor structure includes a first transistor which includes a barrier layer between a first gate dielectric layer and a metal fill layer, and a second transistor includes a metal fill layer over and in contact with a second gate dielectric layer. A first fluorination treatment is performed after the formation of the barrier layer to incorporate fluorine into the gate dielectric layer of the first transistor. A second fluorination treatment is performed after the formation of the metal fill layer to incorporate fluorine into the gate dielectric layer of the second transistor. Therefore, the gate dielectric layers in all device regions may be incorporated with sufficient fluorine, thereby enhancing; the reliability of semiconductor devices.

FIG. 1 is a perspective view of a semiconductor structure 100, in accordance with some embodiments of the disclosure. The semiconductor structure 100 includes a substrate 102, and a fin structure 104 over the substrate 102, in accordance with some embodiments. Although one fin structure 104 is illustrated in FIG. 1, more than one fin structure 104 may be formed over the semiconductor structure 100.

For a better understanding of the semiconductor structure, an X-Y-Z coordinate reference is provided in FIG. 1. The X-axis and Y-axis are generally orientated along the lateral directions that are parallel to the main surface of the semiconductor structure 100. The Y-axis is transverse (e.g., substantially perpendicular) to the X-axis. The Z-axis is generally oriented along the vertical direction that is perpendicular to the main surface of a semiconductor structure 100 (or the X-Y plane).

The fin structure 104 extends in X direction, in accordance with some embodiments. That is, the fin structure 104 has a longitudinal axis parallel to the X direction, in accordance with some embodiments. The X direction may also be referred to as the channel-extending direction. The current of the resulting semiconductor device (i.e., FinFET) flows in X direction through the channel.

The fin structure 104 includes a channel region CH and source/drain regions SD, where the channel region CH is defined between the source/drain regions SD, in accordance with some embodiments. In this disclosure, a source/drain refers to a source and/or a drain. It should be noted that in the present disclosure, a source and a drain are used interchangeably and the structures thereof are substantially the same. FIG. 1 shows one channel region CH and two source/drain regions SD for illustrative purposes and is not intended to be limiting. The number of channel regions CH and source/drain regions may be dependent on the demands on the design of the semiconductor device and/or performance considerations. A gate structure or gate stack (not shown) will be formed with a longitudinal axis parallel to the Y direction and extending across and/or surrounding the channel region CH of the fin structure 104. The Y direction may also be referred to as a gate-extending direction.

FIG. 1 further illustrates a reference cross-section that is used in later figures. Cross-section A-A is in a plane parallel to the longitudinal axis (X direction) and through the fin structure 104, in accordance with some embodiments. Cross-section B-B is in a plane parallel to the longitudinal axis (Y direction) of the gate structure and through the gate structure or gate stack (i.e., across the channel region CH of the fin structure 104), in accordance with some embodiments.

FIGS. 2A-1 through 2I-2 are cross-sectional views illustrating the formation of a semiconductor device at various intermediate stages, in accordance with some embodiments of the disclosure. FIGS. 2A-1, 2B-1, 2C-1, 2D-1, 2E-1, 2F-1, 2G-I, 2H-1 and 2I-1 are cross-sectional views corresponding to cross-section A-A of FIG. 1. FIGS. 2A-2, 2B-2, 2C-2, 2D-2, 2E-2, 2F-2, 2G-2, 2H-2 and 2I-2 are cross-sectional views corresponding to cross-section B-B of FIG. 1.

Figures 2, 2A:
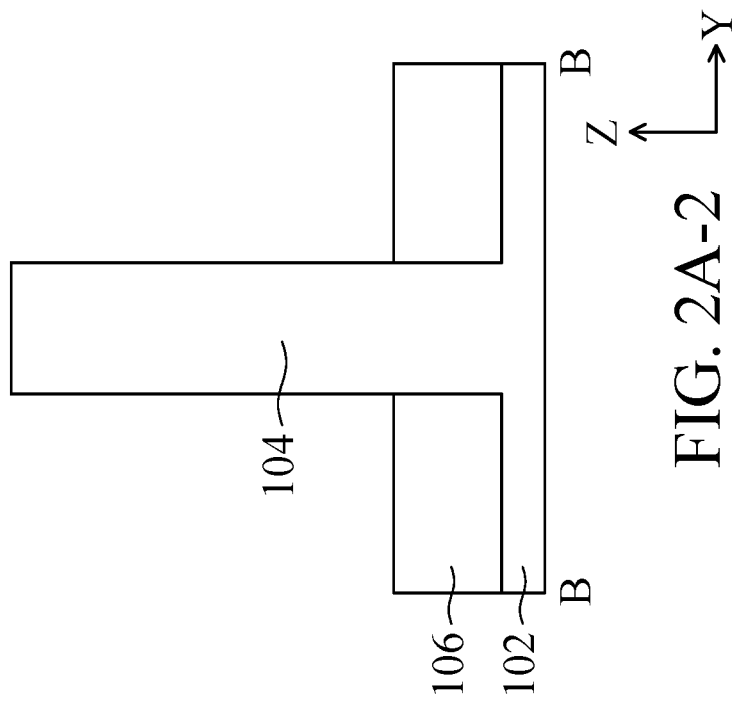
Figures 1, 2A:
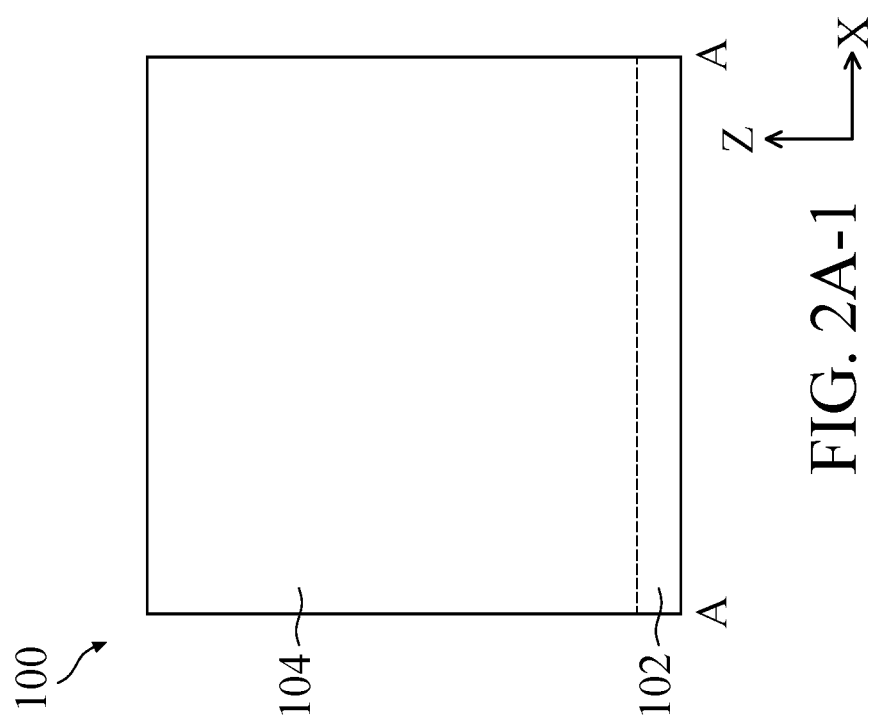

FIGS. 2A-1 and 2A-2 are cross-sectional views of a semiconductor structure 100 after the formation of a fin structure 104 and an isolation structure 106, in accordance with some embodiments.

A semiconductor structure 100 is provided, as shown in FIGS. 2A-1 and 2A-2, in accordance with some embodiments. The semiconductor structure 100 includes a substrate 102, and a fin structure 104 and an isolation structure 106 formed on the substrate 102 in accordance with some embodiments.

In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

The fin structure 104 extends in the X direction, in accordance with some embodiments. That is, the fin structure 104 has a longitudinal axis parallel to the X direction, in accordance with some embodiments.

In some embodiments, the formation of the fin structure 104 includes patterning the substrate 102 to form trenches so that the fin structure 104 protrudes from between the trenches. The patterning process may include photolithography and etching processes.

An insulating material for the isolation structure 106 is formed over the fin structure 104 and fills the trenches, in accordance with some embodiments. In some embodiments, the insulating material includes silicon oxide, silicon nitride, silicon oxynitride (SiON), another suitable insulating material, multilayers thereof, and/or a combination thereof. In some embodiments, the insulating material is formed using CVD (such as LPCVD, plasma enhanced CVD (PECVD), high density plasma CVD (HDP-CVD), high aspect ratio process (HARP), flowable CVD (FCVD)), atomic layer deposition (ALD), another suitable technique, and/or a combination thereof.

The insulating material is planarized using such as a chemical mechanical polishing (CMP) process to remove the portion of insulating material formed above the fin structure 104, and then recessed using an etch-back process to expose an upper portion of the fin structure 104, in accordance with some embodiments. The remaining portion of the insulating material serves as the isolation structure 106, in accordance with some embodiments.

FIGS. 2B-1 and 2B-2 are cross-sectional views of a semiconductor structure 100 after the formation of a dummy gate structure 108 and gate spacer layers 116, in accordance with some embodiments.

A dummy gate structure 108 is formed over the semiconductor structure 100, as shown in FIGS. 2B-1 and 2B-2, in accordance with some embodiments. The dummy gate structure 108 extends across and surrounds the channel region of the fin structure 104 to define the channel region and the source/drain regions, in accordance with some embodiments. The dummy gate structure 108 is configured as a sacrificial structure and will be replaced with a final gate stack, in accordance with some embodiments.

In some embodiments, the dummy gate structure 108 extends in the Y direction. That is, the dummy gate structure 108 has a longitudinal axis parallel to the Y direction, in accordance with some embodiments. FIGS. 2B-1 and 2B-2 show one dummy gate structure 108 for illustrative purposes and is not intended to be limiting. The number of dummy gate structures 108 may be dependent on the demands on the semiconductor device design and/or performance considerations.

The dummy gate structure 108 includes a dummy gate dielectric layer 110 and a dummy gate electrode layer 112 formed on the dummy gate dielectric layer 110, in accordance with some embodiments. In some embodiments, the dummy gate dielectric layer 110 is made of one or more dielectric materials, such as silicon oxide (SiO), silicon nitride (SiN), silicon oxynitride (SiON), $HfO_2$, HfZrO, HfSiO, HfTiO, HfAlO, and/or a combination thereof. In some embodiments, the dielectric material is formed using thermal oxidation, CVD, ALD, physical vapor deposition (PVD), another suitable technique, and/or a combination thereof.

In some embodiments, the dummy gate electrode layer 112 is made of a semiconductor material such as polysilicon, poly silicon germanium. In some embodiments, the dummy gate electrode layer 112 is made of a conductive material such as metallic nitrides, metallic silicides, metals, and/or a combination thereof. In some embodiments, the material for the dummy gate electrode layer 112 is formed using CVD, another suitable technique, and/or a combination thereof.

In some embodiments, the formation of the dummy gate structure 108 includes depositing a dielectric material for the dummy gate dielectric layer 110 over the semiconductor structure 100, depositing a material for the dummy gate electrode layer 112 over the dielectric material, planarizing the material for the dummy gate electrode layer 112, and patterning the dielectric material and the material for the dummy gate electrode layer 112 into the dummy gate structure 108.

The patterning process includes forming an etching mask 114 (such as patterned hard mask layer or patterned photoresist layer) over the material for the dummy gate electrode layer 112 to cover the channel region of the fin structure 104, in accordance with some embodiments. The material for the dummy gate electrode layer 112 and dielectric material, uncovered by the etching mask 114, are etched away until the source/drain regions of the fin structure 104 are exposed, in accordance with some embodiments.

Gate spacer layers 116 are formed over the semiconductor structure 100, as shown in FIGS. 2B-1 and 2B-2, in accordance with some embodiments. The gate spacer layers 116 are formed along opposite sidewalls of the dummy gate structure 108, in accordance with some embodiments. The gate spacer layers 116 are used to offset the subsequently formed source/drain features and separate the source/drain features from the gate structure, in accordance with some embodiments.

In some embodiments, the gate spacer layers 116 is made of a dielectric material, such as silicon-containing dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN).

In some embodiments, the formation of the gate spacer layers 116 includes conformally depositing a dielectric material for the gate spacer layers 116 over the semiconductor structure 100 followed by an anisotropic etching process such as dry etching. Remaining portion of the dielectric material on the sidewalls of the dummy gate structure 108 and the etching mask 114 serve as the gate spacer layers 116, in accordance with some embodiments, FIGS. 2C-1 and 2C-2 are cross-sectional views of a semiconductor structure 100 after the formation of source/drain features 118, a contact etching stop layer (CESL) 120 and an interlayer dielectric (ILD) layer 122, in accordance with some embodiments.

Source/drain features 118 are formed over the source/drain regions of the fin structures 104 and on the opposite sides of the dummy gate structure 108, as shown in FIGS. 2C-1 and 2C-2, in accordance with some embodiments. The source/drain features 118 are formed on opposite sides of the dummy gate structure 108, in accordance with some embodiments.

The formation of the source/drain features 118 includes recessing the source/drain regions of the fin structures 104 using the dummy gate structure 108 and the gate spacer layers 116 as a mask to form source/drain recesses on opposite sides of the dummy gate structure 108, in accordance with some embodiments. The recessing process may be an anisotropic etching process such as dry plasma etching, an isotropic etching process such as dry chemical etching, remote plasma etching or wet chemical etching, and/or a combination thereof.

Afterward, the source/drain features 118 are grown in the source/drain recesses using an epitaxial growth process, in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the source/drain features 118 are made of any suitable semiconductor material for an n-type semiconductor device and a p-type semiconductor device, such as Ge, Si, GaAs, AlGaAs, SiGe, GaAsP, SiP, SiC, SiCP, or a combination thereof. In some embodiments, the source/drain features 118 are in-situ doped during the epitaxial growth process.

In some embodiments wherein the fin structure 104 are to be formed as n-channel devices (such as n-channel FinFETs), the source/drain features 118 are made of semiconductor material such as SiP, SiAs, SiCP, SiC, Si, GaAs, another suitable semiconductor material, or a combination thereof. In some embodiments, the source/drain features 118 are doped with the n-type dopant during the epitaxial growth process. For example, the n-type dopant may be phosphorous (P) or arsenic (As). For example, the source/drain features 118 may be the epitaxially grown Si doped with phosphorous to form silicon:phosphor (Si:P) source/drain features and/or arsenic to form silicon:arsenic (Si:As) source/drain feature.

In some embodiments wherein the fin structure 104 are to be formed as p-channel device (such as p-channel FinFET), source/drain features 118 are made of semiconductor material such as SiGe, Si, GaAs, another suitable semiconductor material, or a combination thereof. In some embodiments, the source/drain features 118 are doped with the p-type dopant during the epitaxial growth process. For example, the p-type dopant may be boron (B) or $BF_2$, For example, the source/drain features 118 may be the epitaxially grown SiGe doped with boron (B) to form silicon germanium:boron (SiGe:B) source/drain feature.

A contact etching stop layer 120 is formed over the semiconductor structure 100, as shown in FIG. 2C-1, in accordance with some embodiments. The contact etching stop layer 120 extends along and covers the surfaces of the source/drain features 118 and the sidewalls of the gate spacer layers 116, in accordance with some embodiments. An interlayer dielectric layer 122 is formed over the contact etching stop layer 120, as shown in FIG. 2C-1, in accordance with some embodiments.

In some embodiments, the contact etching stop layer 120 is made of a dielectric material, such as silicon oxide ($SiO_2$), silicon nitride (SiN), silicon oxynitride (SiON), silicon oxynitride (SiOC), silicon carbide (SiC), oxygen-doped silicon carbide (SiC:O), oxygen-doped silicon carbonitride (Si(O)CN), or a combination thereof. In some embodiments, a dielectric material for the contact etching stop layer 120 is globally and conformally deposited over the semiconductor structure 100 using CVD (such as LPCVD, PECVD, HDP-CVD, HARP, and FCVD), ALD, another suitable method, or a combination thereof.

In some embodiments, the interlayer dielectric layer 122 is made of a dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material, some embodiments, a dielectric material for the interlayer dielectric layer 122 is deposited using such as CVD (such as HDP-CVD, PECVD, HARP or FCVD), another suitable technique, and/or a combination thereof.

In some embodiments, the interlayer dielectric layer 122 is made of a different material than the contact etching stop layer 120. In some embodiments, the interlayer dielectric layer 122 and the contact etching stop layer 120 have a great difference in etching selectivity. In some embodiments, the interlayer dielectric layer 122 is made of an oxide (such as silicon oxide) and the contact etching stop layer 120 is made of a nitrogen-containing dielectric (such as silicon nitride or silicon oxynitride).

Afterward, the dielectric materials for the contact etching stop layer 120 and the interlayer dielectric layer 122 above the upper surfaces of the dummy gate electrode layer 112 are removed using such as CMP until the upper surface of the dummy gate structure 108 is exposed, in accordance with some embodiments. CMP may also remove the etching mask 114. In some embodiments, the upper surface of the interlayer dielectric layer 122 is substantially coplanar with the upper surface of the dummy gate electrode layer 112.

FIGS. 2D-1 and 2D-2 are cross-sectional views of a semiconductor structure 100 after the removal of the dummy gate structure 108, in accordance with some embodiments.

The dummy gate structure 108 is removed using an etching process to form a gate trench T, as shown in FIGS. 2D-1 and 2D-2, in accordance with some embodiments. The gate trench T exposes the upper portion of the fin structure 104 and the gate spacer layers 116, in accordance with some embodiments.

In some embodiments, the etching process includes one or more etching processes. For example, when the dummy gate electrode layer 112 is made of polysilicon, a wet etchant such as a tetramethylammonium hydroxide (TMAH) solution may be used to selectively remove the dummy gate electrode layer 112. For example, the dummy gate dielectric layer 110 may be thereafter removed using a plasma dry etching, a dry chemical etching, and/or a wet etching.

FIGS. 2E-1 and 2E-2 are cross-sectional views of a semiconductor structure 100 after the formation of an interfacial layer 124 and a gate dielectric layer 126, in accordance with some embodiments.

An interfacial layer 124 is formed on the exposed surfaces of the fin structure 104, as shown in FIGS. 2E-1 and 2E-2, in accordance with some embodiments. In some embodiments, the interfacial layer 124 is made of a chemically formed silicon oxide. In some embodiments, the interfacial layer 124 is formed using one or more cleaning processes such as including ozone ($O_3$), ammonia hydroxide-hydrogen peroxide-water mixture, and/or hydrochloric acid-hydrogen peroxide-water mixture. Semiconductor material from the fin structure 104 is oxidized to form the interfacial layer 124, in accordance with some embodiments. In some embodiments, the interfacial layer 124 has a thickness in a range from about 5 angstrom (Å) to about 15 Å.

A gate dielectric layer 126 is formed conformally along the interfacial layer 124 to surround the fin structure 104 and partially fills the gate trench T, as shown in FIGS. 2E-1 and 2E-2, in accordance with some embodiments. The gate dielectric layer 126 is also conformally formed along the sidewalls of the gate spacer layers 116 facing the channel region, in accordance with some embodiments. The gate dielectric layer 126 is also conformally formed along the upper surface of the isolation structure 106, in accordance with some embodiments. In some embodiments, the gate dielectric layer 126 has a thickness in a range from about 10 Å to about 20 Å.

The gate dielectric layer 126 may be high-k dielectric layer. In some embodiments, the high-k dielectric layer is a dielectric material with high dielectric constant (k value), for example, greater than 3.9. In some embodiments, the gate dielectric layer 126 is made of hafnium-containing dielectric material, such as hafnium oxide ($HfO_2$), HfZrO, $HfSiO_4$, HfZrO, HfLaO, HfSiO, HfTaO, HfTiO. In alternative embodiments, the gate dielectric layer 126 is made of $TiO_2$, $Ta_2O_3$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, LaSiO, AlSiO, (Ba, Sr)$TiO_3$ (BST), $Al_2O_3$, $Si_3N_4$, oxynitrides (SiON), a combination thereof, or another suitable material. The high-k dielectric layer may be deposited using ALD, PVD, CVD, and/or another suitable technique.

FIGS. 2F-1 and 2F-2 are cross-sectional views of a semiconductor structure 100 after the formation of a capping layer 128, in accordance with some embodiments.

A capping layer 128 is formed over the semiconductor structure 100, as shown in FIGS. 2F-1 and 2F-2, in accordance with some embodiments. The capping layer 128 covers the gate dielectric layer 126 and partially fills the gate trench T, in accordance with some embodiments.

The capping layer 128 may be a single layer or multiple layers. For example, a first capping layer is conformingly formed along the gate dielectric layers 126, in accordance with some embodiments. The first capping layer is made of titanium nitride doped with silicon (TSN), which is deposited by ALD using $TiCl_4$, $SiH_4$ and $NH_3$ as precursors, in accordance with some embodiments. An in-situ post metallization anneal (i-PMA) process is performed on the first capping layer, in accordance with some embodiments. In some embodiments, the i-PMA process is a spike anneal, which is performed at a temperature of about 850° C. to about 950° C., and in an ambient containing $N_2$.

A second capping layer is conformally formed over the first capping layer, in accordance with some embodiments. The second capping layer is made of silicon deposited using CVD, in accordance with some embodiments. In some embodiments, the CVD is performed at a temperature of about 350° C. to about 450° C. and uses $Si_2H_6$ and $H_2$ as precursors. Afterward, a post cap anneal (PCA) process is performed on the second capping layer, in accordance with some embodiments. In some embodiments, the PCA process is a spike anneal, which is performed in an ambient containing and at a higher temperature than the i-PMA process described above. For example, the temperature may be in a range from about 900° C. to about 950° C.

FIGS. 2G-1 and 2G-2 are cross-sectional views of a semiconductor structure 100 after the removal of the capping layer 128, in accordance with some embodiments.

The capping layer 128 is removed using one or more etching processes until the gate dielectric layer 126 is exposed, as shown in FIGS. 2G-1 and 2G-2, in accordance with some embodiments. The etching processes may be an anisotropic etching process such as dry plasma etching, an isotropic etching process such as dry chemical etching, remote plasma etching or wet chemical etching, and/or a combination thereof.

Afterward, a post deposition anneal (PDA) process is performed on the gate dielectric layer 126, as shown in FIGS. 2G-1 and 2G-2, in accordance with some embodiments. In some embodiments, the PDA process is a spike anneal, which is performed at a temperature of about 850° C. to about 950° C., and in an ambient containing $NH_3$.

The capping layer 128 and the anneal processes may be helpful in improving the crystallization of the gate dielectric layer 126 and reducing the defects in the gate dielectric layer 126, which may improve the quality of the gate dielectric layer 126, e.g., thereby enhancing the performance of semiconductor devices.

FIGS. 2H-1 and 2H-2 are cross-sectional views of a semiconductor structure 100 after the formation of a metal gate electrode layer 130 in accordance with some embodiments.

The metal gate electrode layer 130 is formed over the gate dielectric layers 126, as shown in FIGS. 2H-1 and 2H-2, in accordance with some embodiments. In some embodiments, the metal gate electrode layer 130 is made of more than one conductive material, such as a metal, metal alloy, conductive metal oxide and/or metal nitride, another suitable conductive material, and/or a combination thereof.

As discussed in detail below, the metal gate electrode layer 130 may be a multi-layer structure with various combinations of a barrier layer, a work function layer with a selected work function to enhance the device performance for n-channel transistors and p-channel transistors, a capping layer, a glue layer, a metal fill layer, and/or another suitable layer.

During the formation of the gate electrode materials, more than one fluorination treatments may be performed on the semiconductor structure 100 to sufficiently incorporate (or dope) fluorine into the gate dielectric layers 126 of different devices, in accordance with some embodiments. The fluorination treatments of the gate dielectric layer 126 will be discussed in detail later. The treated gate dielectric layer (or fluorine-doped gate dielectric layer) is denoted as 126'.

The metal gate electrode layer 130 surround around the fin structure 104 and fills the remainders of the gate trench T, in accordance with some embodiments. The interfacial layer 124, the gate dielectric layer 126' and the metal gate electrode layer 130 combine to form a final gate stack 132, as shown in FIGS. 2H-1 and 2H-2, in accordance with some embodiments.

In some embodiments, the final gate stack 132 extends in the Y direction. That is, the final gate stack 132 has a longitudinal axis parallel to the Y direction, in accordance with some embodiments.

The final gate stack 132 surrounds the channel region of the fin structure 104 and are interposed between the source/drain features 118, in accordance with some embodiments. The final gate stack 132 combines with the source/drain features 118 and the channel region of the fin structure 104 to form a FinFET device, such as an n-channel FinFET device or a p-channel FinFET device, in accordance with some embodiments. The final gate stack 132 may engage the channel region of the fin structures 104, so that current can flow between the source/drain features 118 during operation.

FIGS. 2I-1 and 2I-2 are cross-sectional views of a semiconductor structure after a planarization process, in accordance with some embodiments.

A planarization process such as CMP is performed on the semiconductor structure 100 to remove the final gate stack 132 formed over the upper surface of the interlayer dielectric layer 122, as shown in FIGS. 2I-1 and 2I-2, in accordance with some embodiments. After the planarization process, the upper surface of the metal gate electrode layer 130 is substantially coplanar with the upper surface of the interlayer dielectric layer 122, in accordance with some embodiments.

It is understood that the semiconductor structure 100 may undergo further CMOS processes to form various features over the semiconductor structure 100, such as a multilayer interconnect structure (e.g., contact plugs to source/drain features and/or to final gate stacks, conductive vias, metal lines, inter metal dielectric layers, passivation layers, etc.)

Although FIGS. 2I-1 and 2I-2 only show one transistor of the semiconductor structure 100, the semiconductor structure 100 may include various types of transistors having different threshold voltages. For example, three different threshold voltages (e.g., standard, low and ultra-low voltages) are set for n-channel transistors and three different threshold voltages (e.g., standard, low and ultra-low voltages) are set for p-channel transistors. These transistors may be are formed in different device regions such as a logic region, a memory region, an analog region, a peripheral region, or a combination thereof and formed with different gate electrode materials, in accordance with some embodiments.

The as-deposited gate dielectric layer made of high-k dielectric material may have some defects (such as vacancies, broken bonds, etc.) therein. A fluorination treatment of the gate dielectric layer may repair the defects in the gate dielectric layer, which may improve the quality of the gate dielectric layer, thereby enhancing the reliability of semiconductor devices, e.g., time-dependent-dielectric-breakdown (TDDB). However, in some instances in which the fluorination treatment is only performed immediately after the deposition process of the gate dielectric layer, fluorine atoms may easily escape from the gate dielectric layer in subsequent deposition processes of gate electrode materials and/or etching processes. As a result, the defect in the gate dielectric layer may be repaired insufficiently.

In addition, in some instances in which the fluorination treatment is only performed after the completion of the metal gate electrode layer, it may be difficult for fluorine atoms to diffuse through more than one gate electrode materials and into the gate dielectric layer. As a result, the defect in the gate dielectric layer may also not be adequately repaired.

FIGS. 3A through 3H are cross-sectional views illustrating the formation of the metal gate electrode layers 130 (shown in FIG. 2H-1) for various types of transistors having different threshold voltages at various intermediate stages, in accordance with some embodiments of the disclosure. Fids. 3A through 3H also illustrate fluorination treatments to sufficiently incorporate fluorine atoms into the gate dielectric layers 126 in different device regions. FIGS. 3A through 3H illustrate a portion of a semiconductor structure 100 corresponding to area R of FIG. 2H-1.

Figure 3A:
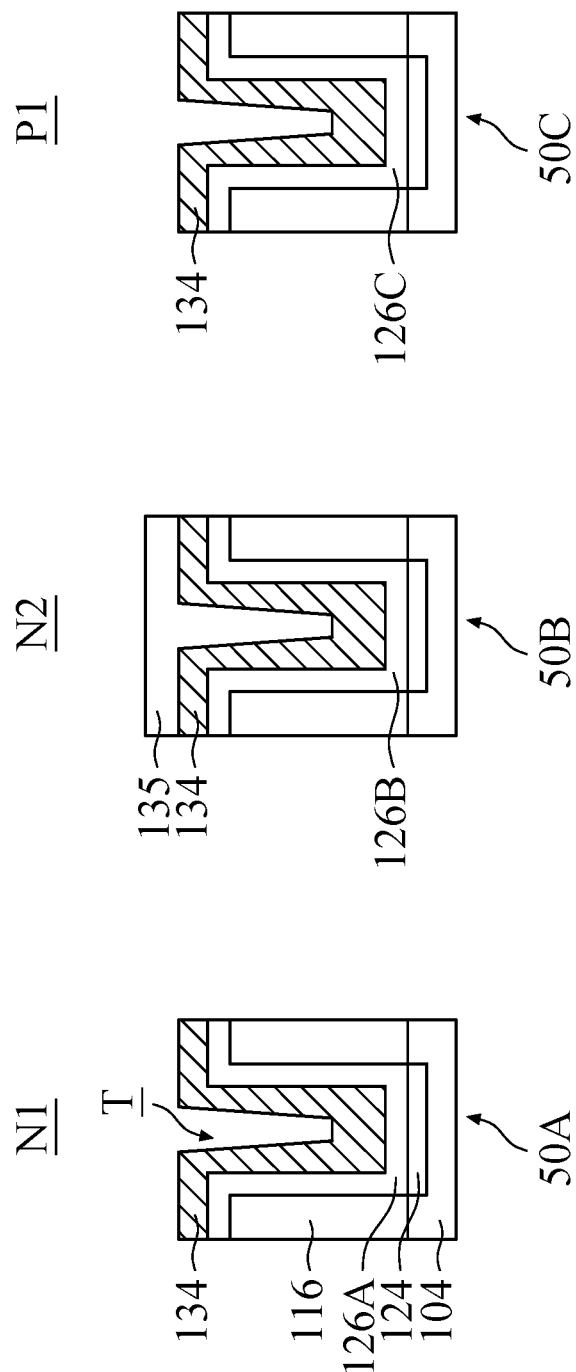
FIGS. 3A through 3H are cross-sectional views illustrating the formation of the metal gate electrode layer and fluorination treatments of gate dielectric layers at various intermediate stages, in accordance with some embodiments of the disclosure.

FIG. 3A is a cross-sectional view illustrating some portions of the semiconductor structure 100 after the formation of a barrier material 134 and a mask layer 135, in accordance with some embodiments.

The substrate 102 includes regions 50A, 50B and 50C, as shown in FIG. 3A, in accordance with some embodiments. In some embodiments, an n-type transistor N1 is predetermined to be formed in the region 50A of the substrate 102 and has a threshold voltage Vn1 (e.g., ultra-low voltage). In some embodiments, an n-type transistor N2 is predetermined to be formed in the region 50B of the substrate 102 and has a threshold voltage Vn2 (e.g., standard voltage). Here, 0<Vn1<Vn2. In some embodiments, a p-type transistor P1 is predetermined to be formed in the region 50C of the substrate 102 and has a threshold voltage Vp1 (e.g., ultra-low voltage). Here, Vp1<0. In some embodiments, the n-type transistors N1 and N2 are n-channel FinFETs and the p-type transistor P1 is a p-channel FinFET.

In some embodiments, the gate dielectric layer 126 of the n-type transistor N1, formed in the region 50A, is denoted as 126A. In some embodiments, the gate dielectric layer 126 of the n-type transistor N2, formed in the region 50B, is denoted as 126B, In some embodiments, the gate dielectric layer 126 of the p-type transistor P1, formed in the region 50C, is denoted as 126C.

After the PDA process described above in FIGS. 2G-1 and 2G-2, a barrier material 134 is formed over the semiconductor structure 100 at the regions 50A, 50B and 50C, as shown in FIG. 3A, in accordance with some embodiments. The barrier material 134 is formed on the gate dielectric layers 126A-126C and partially fills the gate trenches T, in accordance with some embodiments.

In some embodiments, the barrier material 134 is metal nitride, e.g., TiN, TaN, WCN, another suitable barrier material, and/or a combination thereof. The barrier material 134 is deposited using ALD, CVD, PVD, another suitable technique, and/or a combination thereof. In some embodiments, the barrier material 134 has a thickness in a range from about 10 Å to about 30 Å.

A mask layer 135 is formed over the barrier material 134 at the region 50B, as shown in FIG. 3A, in accordance with some embodiments. The mask layer 135 exposes the harrier material 134 at the regions 50A and 50C, in accordance with some embodiments.

In some embodiments, the mask layer 135 is a patterned photoresist layer. For example, a photoresist may be formed over the barrier material 134 such as by using spin-on coating, and patterned by exposing the photoresist to light using an appropriate photomask. Exposed or unexposed portions of the photoresist may be removed depending on whether a positive or negative resist is used.

In alternative embodiments, the mask layer 135 is a patterned hard mask layer which is made of a material having a different etching selectivity from the barrier material 134, The mask layer 135 may be made of silicon nitride (SiN), silicon oxynitride (SiON), silicon oxide (SiO), a nitrogen-free anti-reflection layer (NFARL), titanium nitride (TiN), tantalum oxide (TA)), boron nitride (BN), another suitable material, and/or a combination thereof. For example, a material for the mask layer 135 is deposited over the semiconductor structure 100. A patterned photoresist layer may be formed over the material for the mask layer 135 using the photolithography process described above. The material for the mask layer 135 may be etched using the patterned photoresist layer to form the mask layer 135.

Figure 3B:
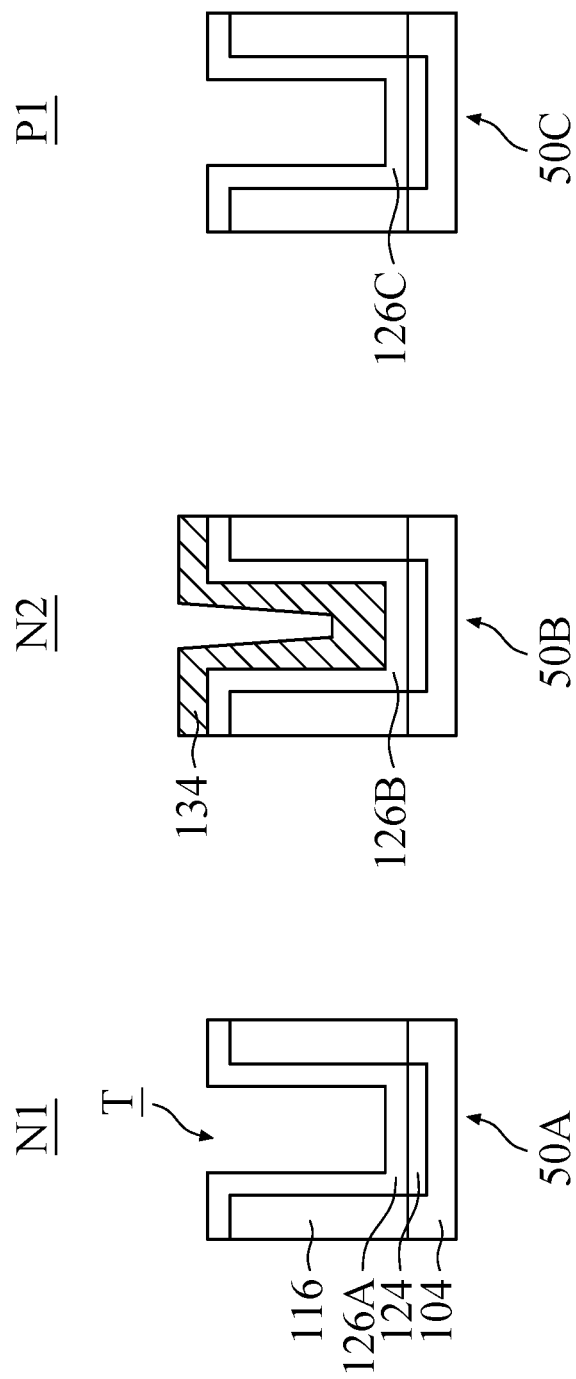

FIG. 3B is a cross-sectional view illustrating some portions of the semiconductor structure 100 after an etching process, in accordance with some embodiments.

An etching process is performed using the mask layer 135 to remove the portions of the barrier material 134 at the regions 50A and 50C until the gate dielectric layers 126A and 126C are exposed, as shown in FIG. 3B, in accordance with some embodiments. The remaining portion of the barrier material 134 at the region SOB serves as a barrier layer 134, in accordance with some embodiments. The etching process may be an anisotropic etching process such as dry plasma etching, an isotropic etching process such as dry chemical etching, remote plasma etching or wet chemical etching, and/or a combination thereof. In some embodiments, the mask layer 135 is removed in the etching process or by an additional etching process or ashing process, FIG. 3C is a cross-sectional view illustrating some portions of the semiconductor structure 100 after a fluorination treatment 1000, in accordance with some embodiments.

Figure 3C:
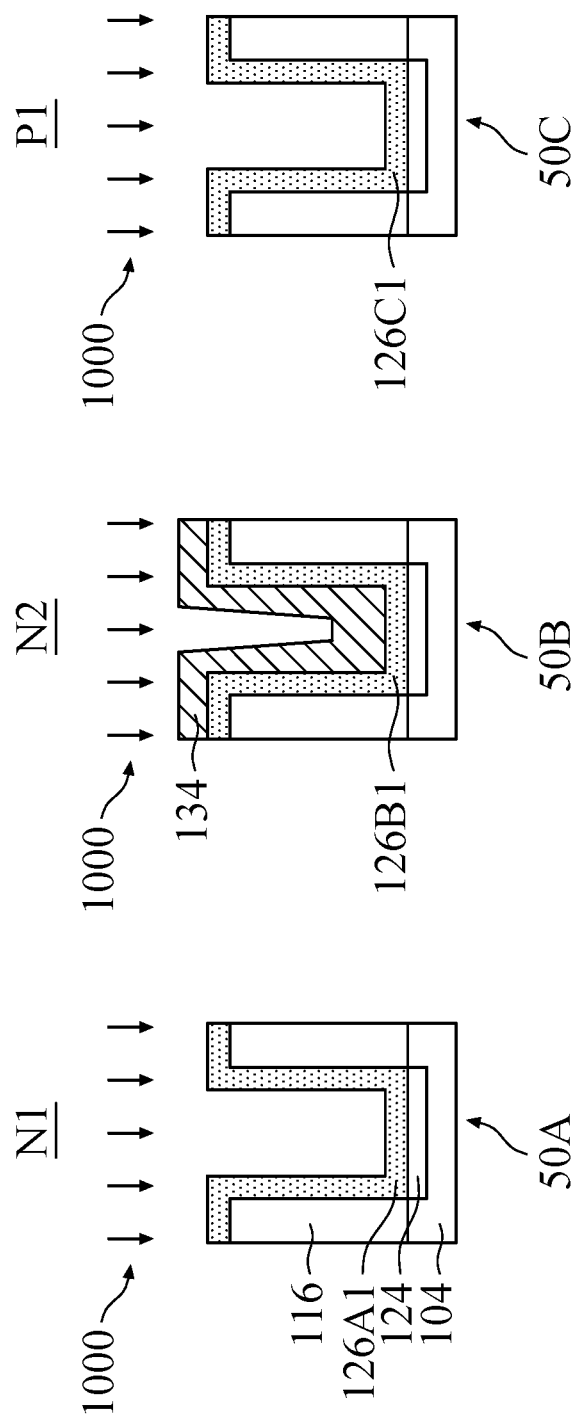

A fluorination treatment 1000 is performed on the semiconductor structure 100 to incorporate and/or dope fluorine into the gate dielectric layer 126A, 126B and 126C, as shown in FIG. 3C, in accordance with some embodiments.

The fluorination treatment 1000 is a soak annealing process, in accordance with some embodiments. The semiconductor structure 100 is placed in a process chamber and soaked in a fluorine-containing gas, in accordance with some embodiments. In some embodiments, the fluorine-containing gas includes $NF_3$, $F_2$, another suitable fluorine-containing gas, and/or a combination thereof. In some embodiments, the fluorine-containing gas is flowed into the processing chamber along with a diluent gas such as an inert gas (e.g., Ar or $N_2$). In some embodiments, the total flow rate of the fluorine-containing gas and the diluent gas is in a range from about 2500 standard cubic centimeters per minute (sccm) to about 25 standard liters per minute (slm), and the ratio of the flow rate of the fluorine-containing gas to the flow rate of the diluent gas is in a range from about 0.1 to about 10. In some embodiments, the soak annealing process is performed at a temperature in a range from about 300° C. to about 450° C. for a duration in a range from about 10 seconds to about 10 minutes.

In the region 50A, the gate dielectric layer 126A is directly exposed to the fluorine-containing gas, in accordance with some embodiments. Fluorine atoms from the fluorine-containing gas diffuse into the gate dielectric layer 126A, and the fluorine-doped gate dielectric layer 126A is denoted as 126A1, in accordance with some embodiments. In some embodiments in which the gate dielectric layer 126A is made of hafnium-containing dielectric material, the ratio of the average fluorine concentration to the average hafnium concentration of the fluorine-doped gate dielectric layer 126A1 is greater than 0.01, for example, in a range from about 0.01 to about 0.5, for example in a range from about 0.05 to about 0.1.

In the region 50B, the harrier layer 134 is directly exposed to the fluorine-containing gas, in accordance with some embodiments. Fluorine atoms from the fluorine-containing gas diffuse into the barrier layer 134 and further into the gate dielectric layer 126B, and the fluorine-doped gate dielectric layer 126B is denoted as 126B1, in accordance with some embodiments. In some embodiments in which the gate dielectric layer 126B is made of hafnium-containing dielectric material, the ratio of the average fluorine concentration to the average hafnium concentration of the fluorine-doped gate dielectric layer 126B1 is greater than 0.01, for example in a range from about 0.01 to about 0.5, for example in a range from about 0.02 to about 0.04.

In the region 50C, the gate dielectric layer 126C is directly exposed to the fluorine-containing gas, in accordance with some embodiments. Fluorine atoms from the fluorine-containing gas diffuse into the gate dielectric layer 126C, and the fluorine-doped gate dielectric layer 126C is denoted as 126C1, in accordance with some embodiments. In some embodiments in which the gate dielectric layer 126C is made of hafnium-containing dielectric material, the ratio of the average fluorine concentration to the average hafnium concentration of the fluorine-doped gate dielectric layer 126C1 is greater than 0.01, for example, in a range from about 0.01 to about 0.5, for example in a range from about 0.05 to about 0.1.

Because the existence of the barrier layer 134 may slow down the diffusion of fluorine atoms into the gate dielectric layer 126B the gate dielectric layer 126B1 may have a lower average fluorine concentration and/or a lower ratio of the average fluorine concentration to the average hafnium concentration than the gate dielectric layers 126A1 and 126C1.

Figure 3D:
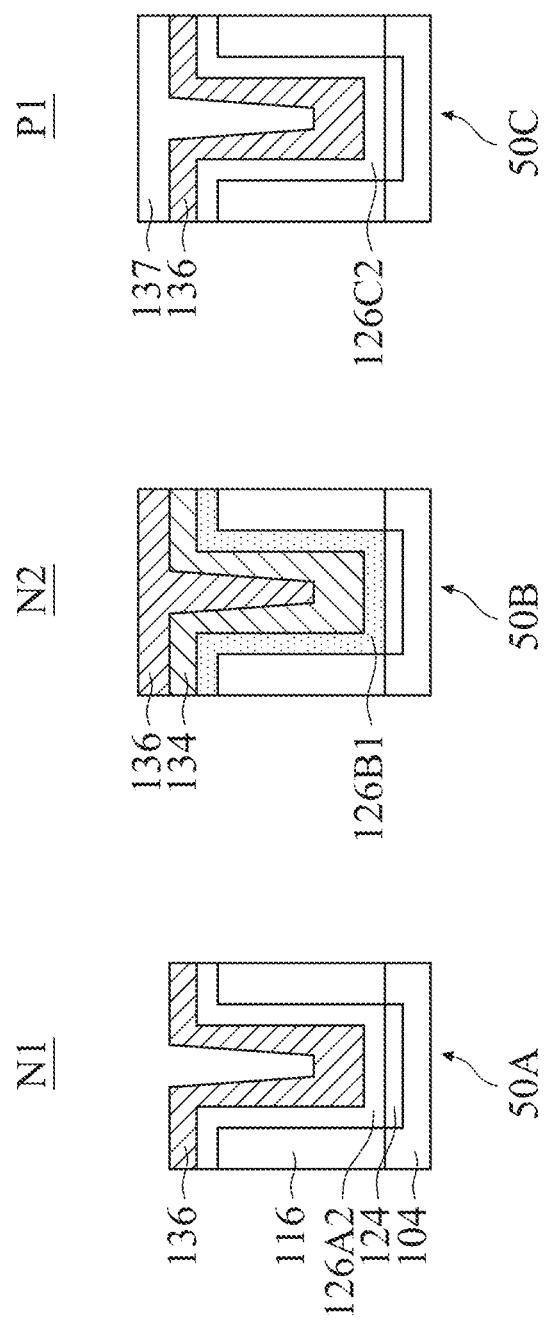

FIG. 3D is a cross-sectional view illustrating some portions of the semiconductor structure 100 after the formation of a work function material 136 and a mask layer 137, in accordance with some embodiments.

A work function material 136 is formed over the semiconductor structure 100 at the regions 50A, 50B and 50C, in accordance with some embodiments. At the regions 50A and 50C, the work function material 136 is formed on the gate dielectric layers 126A1 and 126C1 and partially fills the gate trenches T, in accordance with some embodiments. At the region 50B, the work function material 136 is formed on the barrier layer 134 and overfill the gate trench T, in accordance with some embodiments.

During the deposition process for forming the work function material 136, the heat and/or ion bombard from the deposition process is applied to the exposed gate dielectric layers 126A1 and 126C1, allowing fluorine atoms in the gate dielectric layers 126A1 and 126C1 to easily escape from the gate dielectric layer, thereby reducing the fluorine concentrations of the gate dielectric layers 126A1 and 126C1, in accordance with some embodiments. The fluorine-escaping gate dielectric layers 126A1 and 126C1 are denoted as 126A2 and 126O2, in accordance with some embodiments.

In some embodiments, the average fluorine concentration of the gate dielectric layer 126A2 is lower than the average fluorine concentration of the gate dielectric layer 126A1. In some embodiments, the average fluorine concentration of the gate dielectric layer 126C2 is lower than the average fluorine concentration of the gate dielectric layer 126C1.

In some embodiments in which the gate dielectric layers 126A and 126C are made of hafnium-containing dielectric material, the ratio of the average fluorine concentration to the average hafnium concentration of the fluorine-escaping gate dielectric layer 126A2 and 126C2 is lower than about 0.01, for example lower than about 0.002.

During the deposition process for forming the work function material 136, fluorine atoms in the gate dielectric layer 126B1 may not escape from the gate dielectric layer because the barrier layer 134 covers and may protect the gate dielectric layer 126B1, in accordance with some embodiments. In some embodiments, the average fluorine concentration of the gate dielectric layer 126B1 after the deposition process is substantially the same as the average fluorine concentration of the gate dielectric layer 126B1 before the deposition process.

In some embodiments, the work function material 136 is p-type work function material, e.g., W, WN, WCN, TaN, Ru, Mo, Co, ZrSi2, MoSi2, $TaSi_2$, $NiSi_2$, another suitable p-type work function material, and/or a combination thereof. In some embodiments, the work function material 136 and the barrier material 134 are made of different materials. In an embodiment, the barrier material 134 is a TiN layer and the work function material 136 is a W layer. The work function material 136 is deposited using; ALD, CVD, PVD, another suitable technique, and/or a combination thereof. In some embodiments, the work function material 136 has a thickness in a range from about 10.0 Å to about 30.0 Å.

A mask layer 137 is formed over the work function material 136 at the region 50C, as shown in FIG. 3D, in accordance with some embodiments. The mask layer 137 exposes the work function material 136 at the regions 50A and 50B, in accordance with some embodiments. In some embodiments, the mask layer 137 is a patterned photoresist layer and/or a patterned hard mask layer. The material and the formation method of the mask layer 137 may be the same as or similar to the material and the formation method of the mask layer 135.

Figure 3E:
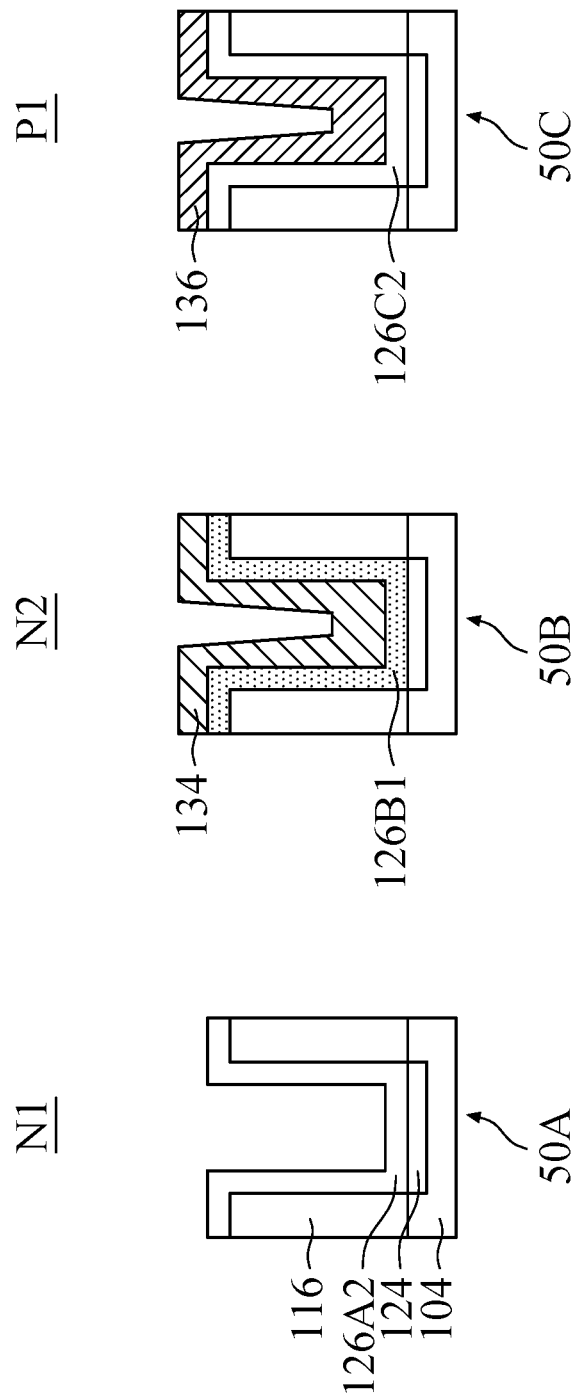

FIG. 3E is a cross-sectional view illustrating some portions of the semiconductor structure 100 after an etching process, in accordance with some embodiments.

An etching process is performed using the mask layer 137 to remove the portions of the work function material 136 at the regions 50A and 50B until the gate dielectric layer 126A2 and the barrier layer 134 are exposed, as shown in FIG. 3E, in accordance with some embodiments. The remaining portion of the work function material 136 at the region 50C serves as a work function layer 136, in accordance with some embodiments. The etching process may be an anisotropic etching process such as dry plasma etching, an isotropic etching process such as dry chemical etching, remote plasma etching or wet chemical etching, and/or a combination thereof.

In some embodiments, the mask layer 137 is removed in the etching process or by an additional etching process or ashing process.

During the etching process, the heat and/or ion bombard from the etching process is applied to the exposed gate dielectric layer 126A2, which may allow fluorine atoms in the gate dielectric layer 126A2 to further escape from the gate dielectric layer, thereby further reducing the average fluorine concentration of the gate dielectric layer 126A2, in accordance with some embodiments.

Figure 3F:
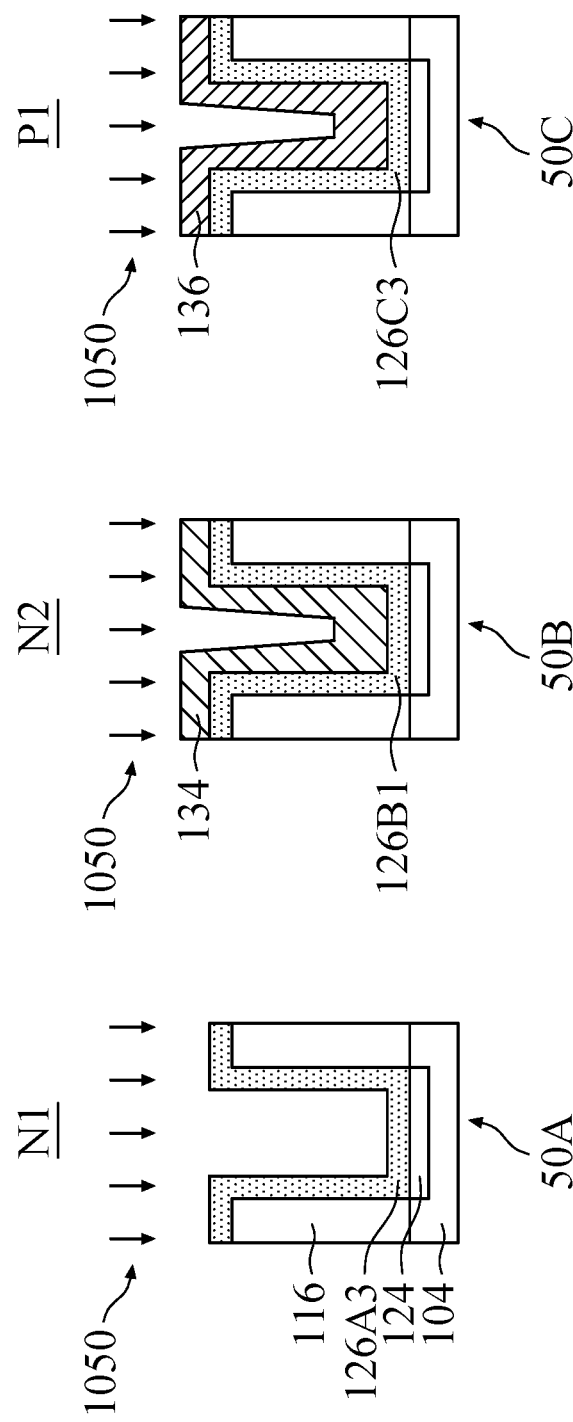

FIG. 3F is a cross-sectional view illustrating some portions of the semiconductor structure 100 after a fluorination treatment 1050, in accordance with some embodiments.

A fluorination treatment 1050 is performed on the semiconductor structure 100 to incorporate and/or dope fluorine into the gate dielectric layers 126A2, 126B1 and 126C2, as shown in FIG. 3F, in accordance with some embodiments. The fluorination treatment 1050 is a soak annealing process, in accordance with some embodiments. The semiconductor structure 100 is placed in a process chamber and soaked in a fluorine-containing gas, in accordance with some embodiments. In some embodiments, the fluorine-containing gas includes $NF_3$, $F_2$, another suitable fluorine-containing gas, and/or a combination thereof.

In some embodiments, the parameters of the soak annealing process of the fluorination treatment 1050 are substantially the same as the parameters of the soak annealing process of the fluorination treatment 1000. In alternative embodiments, the parameters of the soak annealing process of the fluorination treatment 1050 are different than the parameters of the soak annealing process of the fluorination treatment 1000. For example, the duration of the fluorination treatment 1050 may be longer or shorter than the duration of the fluorination treatment 1000.

In the region 50A, the gate dielectric layer 126A2 is directly exposed to the fluorine-containing gas, in accordance with some embodiments. Fluorine atoms from the fluorine-containing gas diffuse into the gate dielectric layer 126A2, and the fluorine-doped gate dielectric layer 126A2 is denoted as 126A3, in accordance with some embodiments, in some embodiments in which the gate dielectric layer 126A is made of hafnium-containing dielectric material, the ratio of the average fluorine concentration to the average hafnium concentration of the fluorine-doped gate dielectric layer 126A3 is greater than 0.01, for example, in a range from about 0.01 to about 0.5, for example in a range from about 0.05 to about 0.1.

In the region 50B, the barrier layer 134 is directly exposed to the fluorine-containing gas, in accordance with some embodiments. Fluorine atoms from the fluorine-containing gas diffuse into the barrier layer 134 and further into the gate dielectric layer 126B in accordance with some embodiments. In some embodiments, the average fluorine concentration of the gate dielectric layer 126B1 after the fluorination treatment 1050 is substantially the same as or slightly greater than the average fluorine concentration of the gate dielectric layer 126B1 before the fluorination treatment 1050. In some embodiments in which the gate dielectric layer 126B is made of hafnium-containing dielectric material, the ratio of the average fluorine concentration to the average hafnium concentration of the fluorine-doped gate dielectric layer 126B1 is greater than 0.01, for example in a range from about 0.01 to about 0.5, for example in a range from about 0.02 to about 0.04.

In the region 50C the work function layer 136 is directly exposed to the fluorine-containing gas, in accordance with some embodiments. Fluorine atoms from the fluorine-containing gas diffuse into the work function layer 136 and further into the gate dielectric layer 12602, and the fluorine-doped gate dielectric layer 126C2 is denoted as 126C3, in accordance with some embodiments. In some embodiments in which the gate dielectric layer 126C is made of hafnium-containing dielectric material, the ratio of the average fluorine concentration to the average hafnium concentration of the fluorine-doped gate dielectric layer 126C3 is greater than 0.01, for example in a range from about 0.01 to about 5, for example in a range from about 0.02 to about 0.04.

Because the existence of the work function layer 136 may slow down the diffusion of fluorine atoms into the gate dielectric layer 126C2, the doped gate dielectric layer 126C3 may have a lower average fluorine concentration and/or a lower ratio of the average fluorine concentration to the average hafnium concentration than the gate dielectric layer 126A3.

Figure 3G:
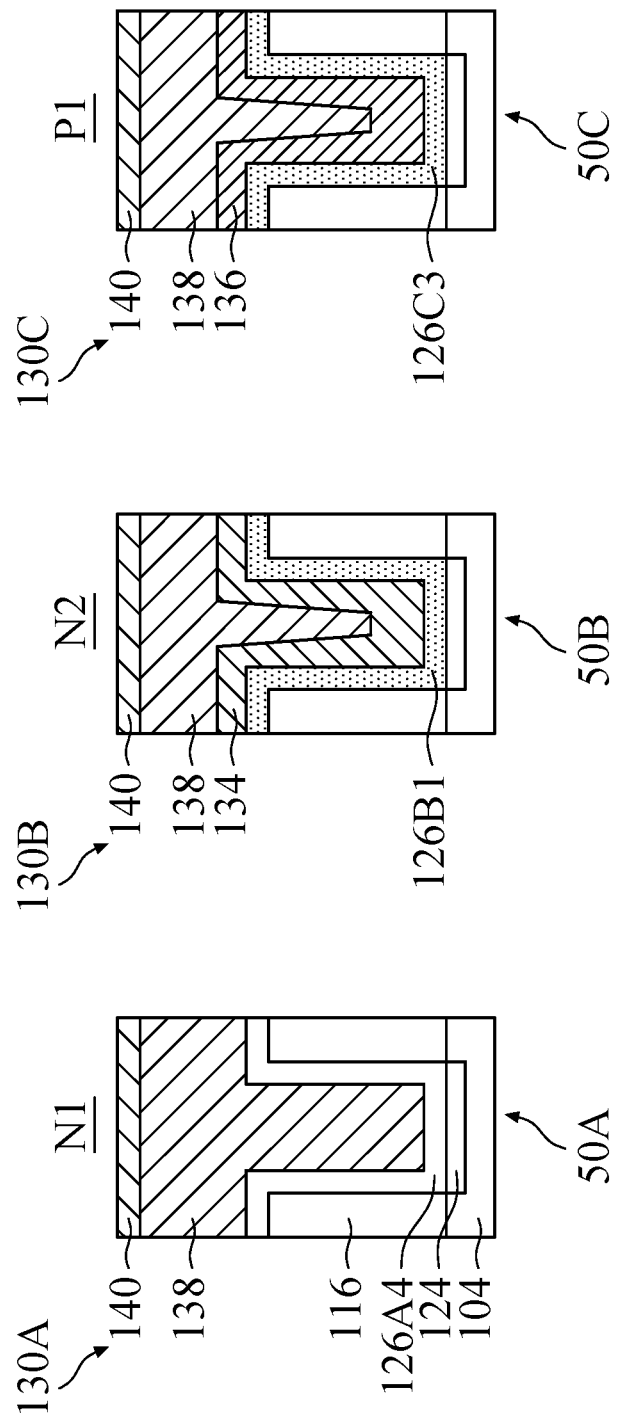

FIG. 3G is a cross-sectional view illustrating some portions of the semiconductor structure 100 after the formation of a metal fill laser 138 and a metal capping layer 140, in accordance with some embodiments.

A metal fill layer 138 is formed over the semiconductor structure 100 at the regions 50A, 50B and 50C to overfill the remainders of the gate trenches T, as shown in FIG. 3G, in accordance with some embodiments. At the region 50A, the metal fill layer 138 is formed on the gate dielectric layer 126A3, in accordance with some embodiments. At the region 50B, the metal fill layer 138 is formed on the harrier layer 134, in accordance with some embodiments. At the region 50C, the metal fill layer 138 is formed on the work function material 136, in accordance with some embodiments. A metal capping layer 140 is formed over the metal fill layer 138, as shown FIG. 3G, in accordance some embodiments.

During the deposition process for forming the metal fill layer 138 and the metal capping layer 140, the heat and/or ion bombard from the deposition process is applied to the exposed gate dielectric layer 126A3, allowing fluorine atoms in the gate dielectric layer 126A3 to easily escape from the gate dielectric layer, thereby reducing the fluorine concentrations of the gate dielectric layer 126A3, in accordance with some embodiments. The fluorine-escaping gate dielectric layer 126A3 is denoted as 126A4, in accordance with some embodiments. In some embodiments, the average fluorine concentration of the gate dielectric layer 126A4 is lower than the average fluorine concentration of the gate dielectric layer 126A3.

In some embodiments in which the gate dielectric layer 126A is made of hafnium-containing dielectric material, the ratio of the average fluorine concentration to the average hafnium concentration of the fluorine-escaping gate dielectric layer 126A4 is lower than about 0.01 for example lower than about 0.002.

During the deposition process for forming the metal fill layer 138, fluorine atoms in the gate dielectric layer 126B1 and the gate dielectric layer 126C3 may not escape from the gate dielectric layer because the barrier layer 134 and the work function layer 136 covers and may protect the gate dielectric layer 126B1 and the gate dielectric layer 126C3, respectively, in accordance with some embodiments. In some embodiments, the average fluorine concentration of the gate dielectric layer 126B1 after the deposition process is substantially the same as the average fluorine concentration of the gate dielectric layer 126B1 before the deposition process. In some embodiments, the average fluorine concentration of the gate dielectric layer 126C3 after the deposition process is substantially the same as the average fluorine concentration of the gate dielectric layer 126C3 before the deposition process.

In some embodiments, the metal fill layer 138 is n-type metal, e.g., Al, TiAl, TiAlC, TaAlC, or TiAlN, In some embodiments, the metal fill layer 138 is formed using ALD, CVD, PVD, electroplating process, another suitable technique, and/or a combination thereof. In some embodiments, the metal fill layer 138 has a thickness in a range from about 100 Å to about 1000 Å.

In some embodiments, the metal capping layer 140 is made TiN. In some embodiments, the metal capping layer 140 is formed using ALD, CVD, PVD, electroplating process, another suitable technique, and/or a combination thereof. In some embodiments, the metal fill layer 138 and the metal capping layer 140 are made of different material. In an embodiment, the metal fill layer 138 is an Al layer, and the metal capping layer 140 is a TiN layer. In some embodiments, the metal capping layer 140 has a thickness in a range from about 10.0 Å to about 30.0 Å.

In some embodiments, the deposition processes of the metal fill layer 138 and the metal capping layer 140 are performed in-situ. That is, in some embodiments, the deposition processes of the metal fill layer 138 and the metal capping layer 140 are continuously performed in a single process tool. As a result, the metal fill layer 138 may not be exposed to the atmosphere or an ambient containing $O_2$ or $H_2O$ during transportation between two deposition tools, thereby preventing the oxidation of the metal fill layer 138.

In some embodiments, the metal capping layer 140 and the metal fill layer 138 combine to form a metal gate electrode layer 130A for the n-type transistor N1. In some embodiments, the metal capping layer 140, the metal fill layer 138 and barrier layer 134 combine to form a metal gate electrode layer 130B for the n-type transistor N2. In some embodiments, the metal capping layer 140, the metal fill layer 138 and the work function layer 136 combine to form a metal gate electrode layer 130C for the p-type transistor P1.

Figure 3H:
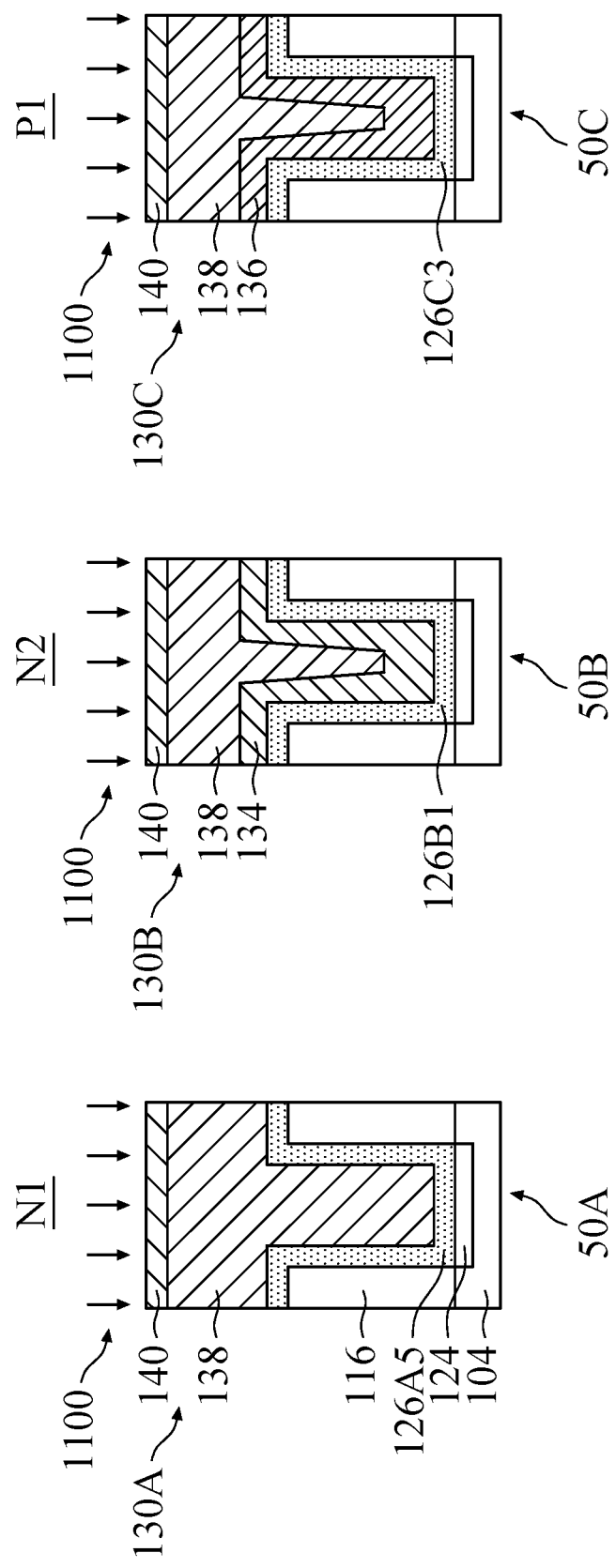

FIG. 3H is a cross-sectional view illustrating some portions of the semiconductor structure 100 after a fluorination treatment 1100, in accordance with some embodiments.

A fluorination treatment 1100 is performed on the semiconductor structure 100 to incorporate and/or dope fluorine into the gate dielectric layer 126A4, as shown in FIG. 3H, in accordance with some embodiments. The fluorination treatment 1100 is a soak annealing process, in accordance with some embodiments. The semiconductor structure 100 is placed in a process chamber and soaked in a fluorine-containing gas, in accordance with some embodiments. In some embodiments, the fluorine-containing gas includes $NF_3$, $F_2$, another suitable fluorine-containing gas, and/or a combination thereof.

In some embodiments, the parameters of the soak annealing process of the fluorination treatment 1100 are substantially the same as the parameters of the soak annealing process of the fluorination treatment 1000. In alternative embodiments, the parameters of the soak annealing process of the fluorination treatment 1100 are different than the parameters of the soak annealing process of the fluorination treatment 1000. For example, the duration of the fluorination treatment 1100 may be longer or shorter than the duration of the fluorination treatment 1000.

In the region 50A, the metal capping layer 140 is directly exposed to the fluorine-containing gas, in accordance with some embodiments, fluorine atoms from the fluorine-containing gas diffuse into the metal capping layer 140 and further into the metal fill layer 138, in accordance with some embodiments. In some embodiments, fluorine is easily attracted and/or trapped by the n-type metal fill layer 138 (e.g., containing Al). Because the gate dielectric layer 126A4 is in direct contact with the metal fill layer 138, fluorine atoms may also easily diffuse into the gate dielectric layer 126A4, in accordance with some embodiments. The fluorine-doped gate dielectric layer 126A4 is denoted as 126A5, in accordance with some embodiments.

In some embodiments in which the gate dielectric layer 126A is made of hafnium-containing dielectric material, the ratio of the average fluorine concentration to the average hafnium concentration of the fluorine-doped gate dielectric layer 126A5 is greater than 0.01, for example, in a range from about 0.01 to about 0.5, for example in a range from about 0.05 to about 0.1.

In the region 50B, because fluorine atoms are easily attracted and/or trapped by n-type metal fill layer 138 and the gate dielectric layer 126B1 is separate from the metal fill layer 138 by the barrier layer 134, fluorine may not easily diffuse into the gate dielectric layer 126B1 in the fluorination treatment 1100. The average fluorine concentration of the gate dielectric layer 126B1 after the fluorination treatment 1100 is substantially the same as and the average fluorine concentration of the gate dielectric layer 126B1 before the fluorination treatment 1100. In some embodiments in which the gate dielectric layer 126B is made of hafnium-containing dielectric material, the ratio of the average fluorine concentration to the average hafnium concentration of the fluorine-doped gate dielectric layer 126B1 is greater than 0.01, for example in a range from about 0.01 to about 0.5, for example in a range from about 0.02 to about 0.04.

Similarly, in the region 50C, because fluorine atoms are easily attracted and/or trapped by n-type metal fill layer 138 and the gate dielectric layer 126C3 is separate from the metal fill layer 138 by the work function layer 136, fluorine may not easily diffuse into the gate dielectric layer 126C3 in the fluorination treatment 1100. The average fluorine concentration of the gate dielectric layer 126C3 after the fluorination treatment 1100 is substantially the same as and the average fluorine concentration of the gate dielectric layer 126C3 before the fluorination treatment 1100. In some embodiments in which the gate dielectric layer 126C is made of hafnium-containing dielectric material, the ratio of the average fluorine concentration to the average hafnium concentration of the fluorine-doped gate dielectric layer 126C3 is greater than 0.01, for example in a range from about 0.01 to about 0.5, for example in a range from about 0.02 to about 0.04.

In some embodiments, the average fluorine concentration and/or the ratio of the average fluorine concentration to the average hafnium concentration of the gate dielectric layers 126B1 and 126C3 is lower than the average fluorine concentration and/or the lower ratio of the average fluorine concentration to the average hafnium concentration than the gate dielectric layer 126A5.

In accordance with the embodiments of the present disclosure, more than one fluorination treatments are performed for different device regions. The first fluorination treatment 1000 is used for the gate dielectric layer 126B in the region 50B in which the n-type transistor N2 with standard threshold voltage is formed, and is performed immediately after the formation of the barrier layer 134, in accordance with some embodiments. The second fluorination treatment 1050 is used for the gate dielectric layer 126C in the region 50C in which the p-type transistor P1 with ultra-low threshold voltage is formed, and is performed immediately after the formation of the work function layer 136, in accordance with some embodiments. The third fluorination treatment 1100 is used for the gate dielectric layer 126A in the region 50A in which the n-type transistor N1 with ultra-low threshold voltage is formed, and is performed immediately after the formation of the metal capping layer 140, in accordance with some embodiments.

As a result, the gate dielectric layers in all device regions may be doped with sufficient fluorine. The defects (e.g., void, broken bonds, etc.) in the gate dielectric layers 126A. 126B and 126C may be sufficiently repaired by fluorine atoms, which may improve the quality of the gate dielectric layers, thereby enhancing the reliability of semiconductor devices, e.g., TDDB.

FIG. 4A is a schematic view exhibiting profile of the fluorine concentration and the hafnium concentration of the gate dielectric layer 126A5 and neighboring components, in accordance with some embodiments of the disclosure. For clarity of illustration, FIG. 4A shows the amplified fluorine concentration [F]x20, which is defined as the fluorine concentration multiplied by 20.

Fluorine in the gate dielectric layer 126A5 has an amplified maximum fluorine concentration [X1], and hafnium in the gate dielectric layer 126A5 has a maximum hafnium concentration [X2], in accordance with some embodiments. The amplified maximum fluorine concentration [X1] is higher than the maximum hafnium concentration [X2], in accordance with some embodiments. In some embodiments, in the entire gate dielectric layer 126A5, the amplified fluorine concentration is higher than the hafnium concentration, in accordance with some embodiments.

In some embodiments, the ratio of the average amplified fluorine concentration to the average hafnium concentration of the gate dielectric layer 126A5 is greater than about 0.2, for example, in a range from about 0.2 to about 10, for example in a range from about 1 to about 2. If the ratio is lower than 0.2, the reliability of the resulting semiconductor devices may degrade. If the ratio is greater than 10, the resistance of the metal gate electrode may increase significantly, which may degrade the performance of the resulting semiconductor devices.

FIG. 4B is a schematic view exhibiting profile of the fluorine concentration and the hafnium concentration of the gate dielectric layer 126B1 and neighboring components, in accordance with some embodiments of the disclosure. For clarity of illustration, FIG. 4B shows the amplified fluorine concentration [F]x20, which is defined as the fluorine concentration multiplied by 20.

Fluorine in the gate dielectric layer 126B1 has an amplified maximum fluorine concentration [X3], and hafnium in the gate dielectric layer 126B1 has a maximum hafnium concentration [X4], in accordance with some embodiments. The amplified maximum fluorine concentration [X3] is lower than the maximum hafnium concentration [X4], in accordance with some embodiments. In some embodiments, in a portion of the gate dielectric layer 126B1 close to the fin structure 104 (or the interfacial layer 124), the hafnium concentration is greater than the amplified fluorine concentration. In some embodiments, in a portion of the gate dielectric layer 126B1 close to the barrier layer 134, the amplified fluorine concentration is greater than the hafnium concentration, in accordance with some embodiments. In some embodiments, fluorine in the barrier layer 134 has an amplified maximum fluorine concentration [X5] that is greater than the amplified maximum fluorine concentration [X3] in the gate dielectric layer 126B1.

In some embodiments, the ratio of the average amplified fluorine concentration to the average hafnium concentration of the gate dielectric layer 126B1 is greater than about 0.2, for example in a range from about 0.2 to about 10, for example in a range from about 0.4 to about 0.8. In some embodiments, the gate dielectric layer 126B1 has a lower average amplified fluorine concentration and/or a lower ratio of the average amplified fluorine concentration to the average hafnium concentration than the gate dielectric layer 126A5.

Although not shown, the gate dielectric layer 12605 may have a similar profile of the fluorine concentration to the gate dielectric layer 126B3 because the final gate stack of the p-type transistor P1 has a similar configuration to the final gate stack of the n-type transistor N2.

Figure 5A:
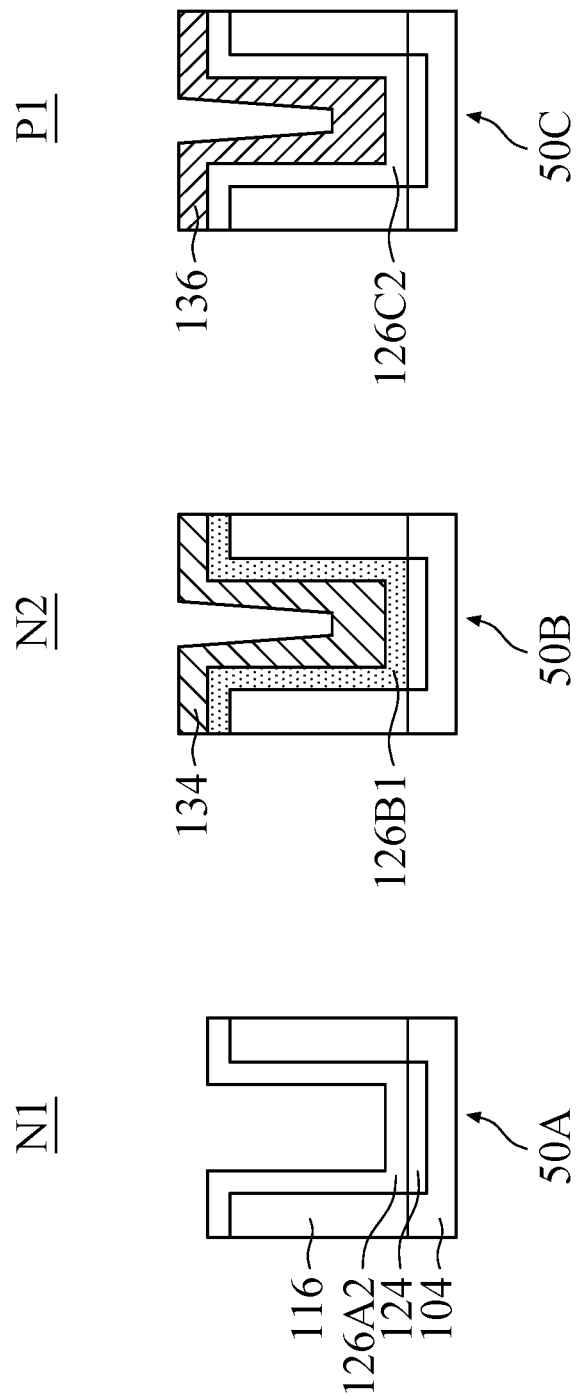
FIGS. 5A and 5B are cross-sectional views illustrating the formation of the metal gate electrode layer and a fluorination treatment of gate dielectric layers at various intermediate stages, in accordance with some embodiments of the disclosure.
Figure 5B:
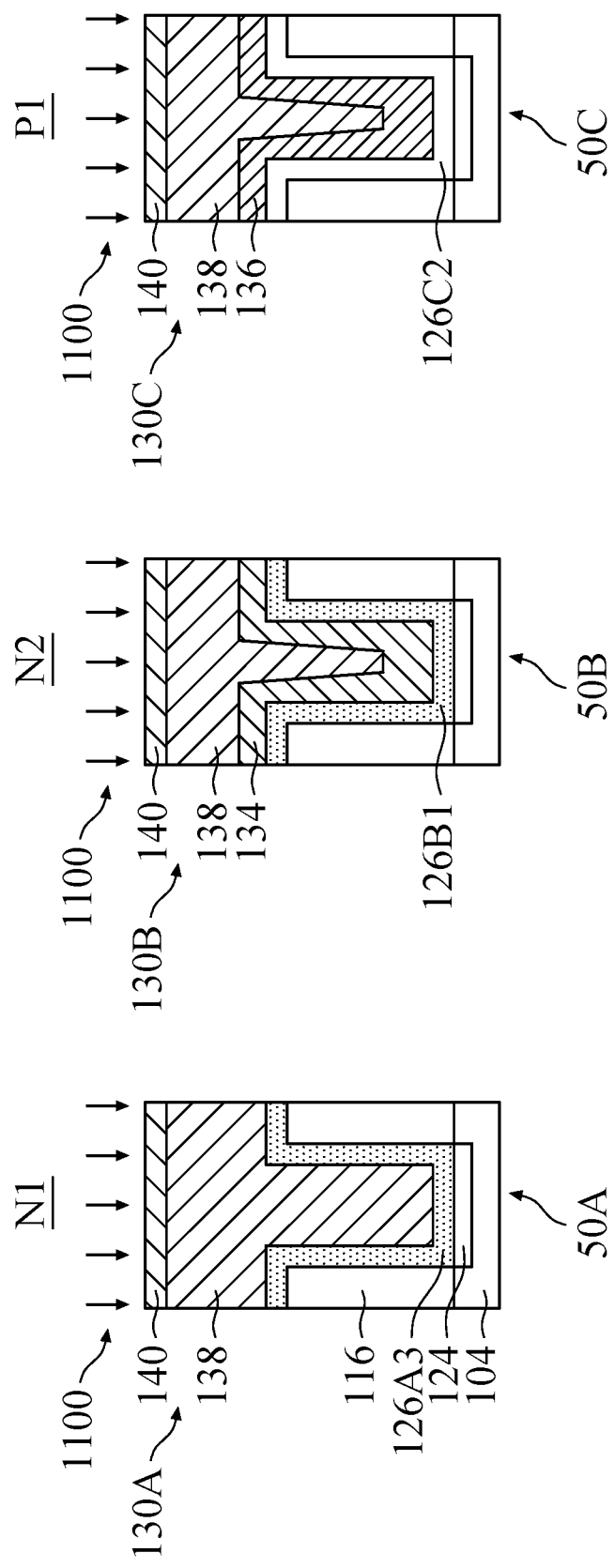

FIGS. 5A and 5B are cross-sectional views illustrating the formation of the metal gate electrode layer 130 (shown in FIG. 2H-1) and a fluorination treatment of the gate dielectric layers 126A-126C at various intermediate stages, in accordance with some embodiments of the disclosure. The embodiments of FIGS. 5A and 5B are similar to the embodiments of FIGS. 3A through 3H except that the fluorination treatment 1050 is omitted.

Continuing from FIG. 3E, the work function layer 136 is formed over the fluorine-escaping gate dielectric layer 126C2 at the region 50C, as shown in FIG. 5A, in accordance with some embodiments. During the deposition process for forming the work function material 136, fluorine atoms in the gate dielectric layers 126A1 and 126C1 easily escape from the gate dielectric layer, in accordance with some embodiments. The fluorine-escaping gate dielectric layers 126A1 and 126C1 are denoted as 126A2 and 126C2, in accordance with some embodiments. In some embodiments wherein TDDB is less concerned for the p-type transistor P1, the fluorination treatment 1050 described with respect to FIG. 3F is omitted.

The steps described above with respect to FIG. 3G are performed to form the metal fill layer 138 and the metal capping layer 140, as shown in FIG. 5B, in accordance with some embodiments. The fluorination treatment 1100 described above with respect to FIG. 3H is performed to incorporate and/or dope fluorine into the gate dielectric layer 126A2, as shown in FIG. 5B, in accordance with some embodiments.

Fluorine atoms diffuse into the gate dielectric layer 126A2, and the fluorine-doped gate dielectric layer 126A2 is denoted as 126A3, in accordance with some embodiments. In some embodiments in which the gate dielectric layer 126A is made of hafnium-containing dielectric material, the ratio of the average fluorine concentration to the average hafnium concentration of the fluorine-doped gate dielectric layer 126A3 is greater than 0.01, for example, in a range from about 0.01 to about 0.5, for example in a range from about 0.05 to about 0.1.

In the region 50C, because fluorine atoms are easily attracted and/or trapped by n-type metal fill layer 138 and the gate dielectric layer 126C2 is separate from the metal fill layer 138 by the work function layer 136, fluorine may not easily diffuse into the gate dielectric layer 126C2 in the fluorination treatment 1100.

Figure 6:
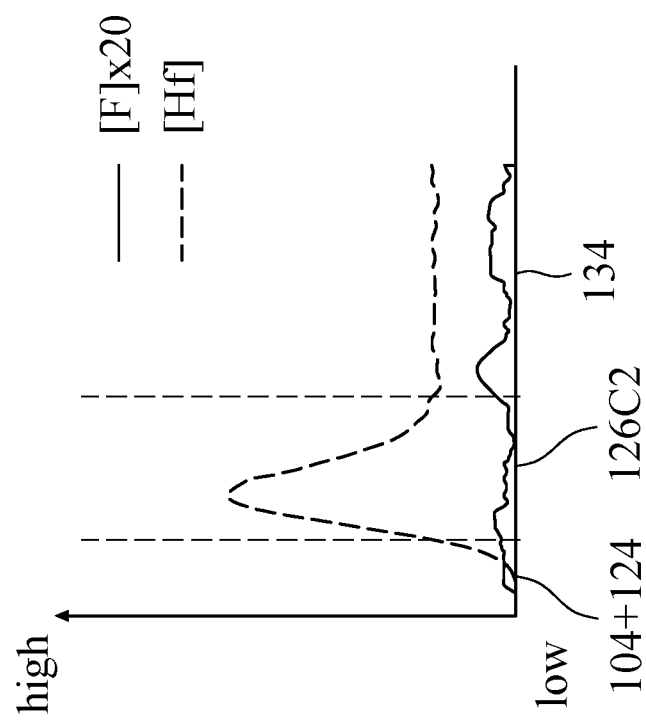
FIG. 6 is a schematic view exhibiting profiles of the fluorine concentration and the hafnium concentration of the gate dielectric layer and neighboring components, in accordance with some embodiments of the disclosure.

FIG. 6 is a schematic view exhibiting profile of the fluorine concentration and the hafnium concentration of the gate dielectric layer 126C2 and neighboring components, in accordance with some embodiments of the disclosure. For clarity of illustration, FIG. 6 shows the amplified fluorine concentration [F]x20, which is defined as the fluorine concentration multiplied by 20.

In some embodiments, in the entire gate dielectric layer 126C2, the amplified fluorine concentration is much lower than the hafnium concentration, in accordance with some embodiments. In some embodiments, the ratio of the average amplified fluorine concentration to the average hafnium concentration of the gate dielectric layer 126C2 is lower than 0.2, for example than about 0.04.

FIGS. 7A through 7H are cross-sectional views illustrating the formation of the metal gate electrode layers 130 (shown in FIG. 2H-1) and fluorination treatments of gate dielectric layers 126 at various intermediate stages, in accordance with some embodiments of the disclosure. FIGS. 7A through 7H illustrate a portion of a semiconductor structure 100 corresponding to area R of FIG. 2H-1.

Figure 7A:
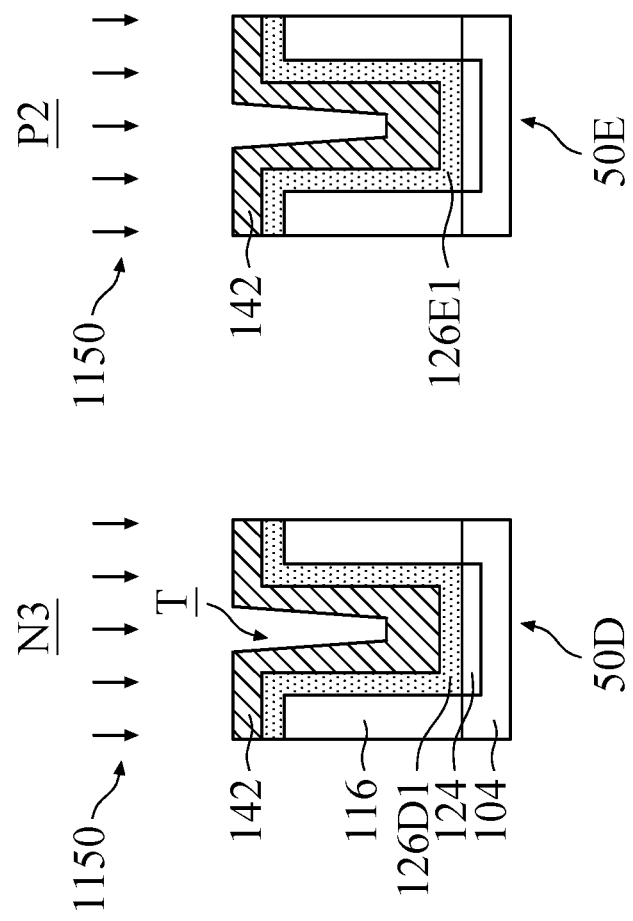
FIGS. 7A through 7H are cross-sectional views illustrating the formation of the metal gate electrode layer and fluorination treatments of gate dielectric layers at various intermediate stages, in accordance with some embodiments of the disclosure.

FIG. 7A is a cross-sectional view illustrating some portions of the semiconductor structure 100 after the formation of a work function material 142 and a fluorination treatment 1150, in accordance with some embodiments.

The substrate 102 includes regions 50D and 50E, as shown in FIG. 7A, in accordance with some embodiments. In some embodiments, an n-type transistor N3 is predetermined to be formed in the region 50D of the substrate 102 and has an ultra-low threshold voltage. In some embodiments, a p-type transistor P2 is predetermined to be formed in the region 50E of the substrate 102 and has an ultra-low threshold voltage. In some embodiments, the n-type transistor N3 is an n-channel FinFET and the p-type transistor P2 is a p-channel FinFET.

After the PDA process described above in FIGS. 2G-1 and 2G-2, a work function material 142 is formed over the semiconductor structure 100 at the regions 50D and 50E, in accordance with some embodiments. The work function material 142 is formed on the gate dielectric layer 126 and partially fills the gate trenches T, in accordance with some embodiments. A fluorination treatment 1150 is performed on the semiconductor structure 100 to incorporate and/or dope fluorine into the gate dielectric layers 126D and 126E, as shown in FIG. 7A, in accordance with some embodiments. In some embodiments, the fluorine-doped gate dielectric layer 126 in the regions 50D and 50E are denoted as 126D1 and 126E1, respectively, in accordance with some embodiments.

In some embodiments, the work function material 142 is p-type work function metal such as TiN. The work function material 142 is deposited using ALD, CVD, PVD, another suitable technique, and/or a combination thereof. In some embodiments, the work function material 142 has a thickness in a range from about 10 Å to about 20 Å.

The fluorination treatment 1150 is a soak annealing process, in accordance with some embodiments. The semiconductor structure 100 is placed in a process chamber and soaked in a fluorine-containing gas, in accordance with some embodiments. In some embodiments, the fluorine-containing gas includes $NF_3$, $F_2$, another suitable fluorine-containing gas, and/or a combination thereof. In some embodiments, the fluorine-containing gas is flowed into the processing chamber along with a diluent gas such as an inert gas (e.g., Ar or $N_2$). In some embodiments, the total flow rate of the fluorine-containing gas and the diluent gas is in a range from about 2500 sccm to about 25 slm, and the ratio of the flow rate of the fluorine-containing gas to the flow rate of the diluent gas is in a range from about 0.1 to about 10. In some embodiments, the soak annealing process is performed at a temperature in a range from about 300° C. to about 450° C. for a duration in a range from about 10 seconds to about 10 minutes.

In some embodiments in which the gate dielectric layer 126D1 is made of hafnium-containing dielectric material, the ratio of the average fluorine concentration to the average hafnium concentration of the fluorine-doped gate dielectric layer 126D1 is greater than 0.01, for example in a range from about 0.01 to about 0.5, for example in a range from about 0.02 to about 0.04.

In some embodiments in which the gate dielectric layer 126E1 is made of hafnium-containing dielectric material, the ratio of the average fluorine concentration to the average hafnium concentration of the fluorine-doped gate dielectric layer 126E1 is greater than 0.01, for example in a range from about 0.01 to about 0.5, for example in a range from about 0.02 to about 0.04.

Figure 7B:
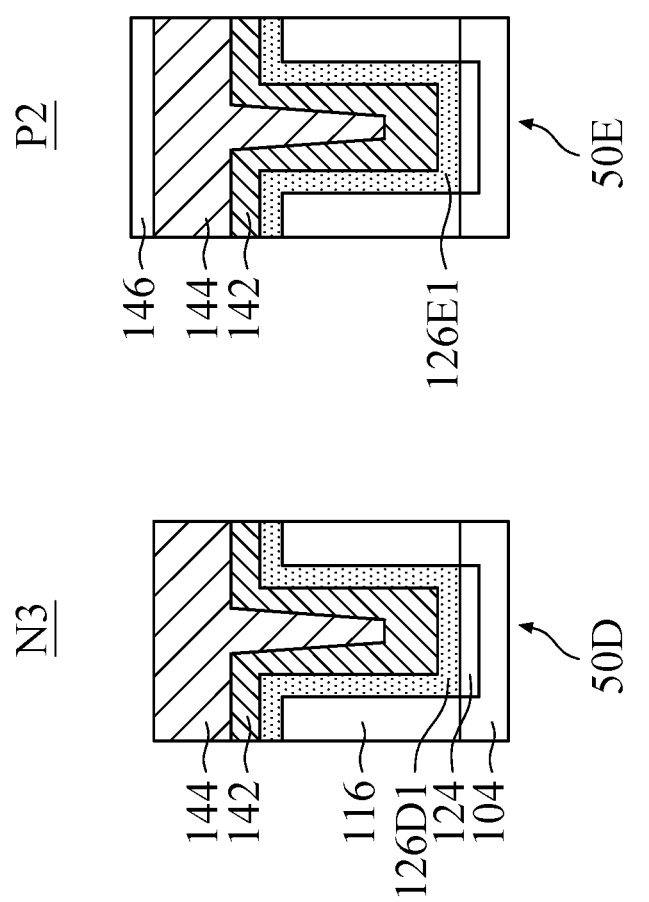

FIG. 7B is a cross-sectional view illustrating some portions of the semiconductor structure 100 after the formation of a metal fill layer 144 and a mask layer 146, in accordance with some embodiments.

A metal fill layer 144 is formed over the work function material 142 at the regions 50D and 50E to overfill the remainders of the gate trenches T, as shown in FIG. 7B, in accordance with some embodiments.

During the deposition process for forming the metal fill layer 144, fluorine atoms in the gate dielectric layer 126D1 and the gate dielectric layer 126E1 may not escape from the gate dielectric layer because the work function material 142 covers and may protect the gate dielectric layer 126D1 and the gate dielectric layer 126E1, in accordance with some embodiments.

In some embodiments, the metal fill layer 144 is p-type metal, e.g., cobalt (Co). In some embodiments, the metal fill layer 144 is formed using ALD, CVD, PVD, electroplating process, another suitable technique, and/or a combination thereof.

A mask layer 146 is formed over the metal fill layer 144 at the region 50E, as shown in FIG. 7B, in accordance with some embodiments. The mask layer 146 exposes the metal fill layer 144 at the region 50D. In some embodiments, the mask layer 146 is a patterned photoresist layer and/or a patterned hard mask layer. The material and the formation method of the mask layer 146 may be the same as or similar to the material and the formation method of the mask layer 135 described above in FIG. 3A.

Figure 7C:
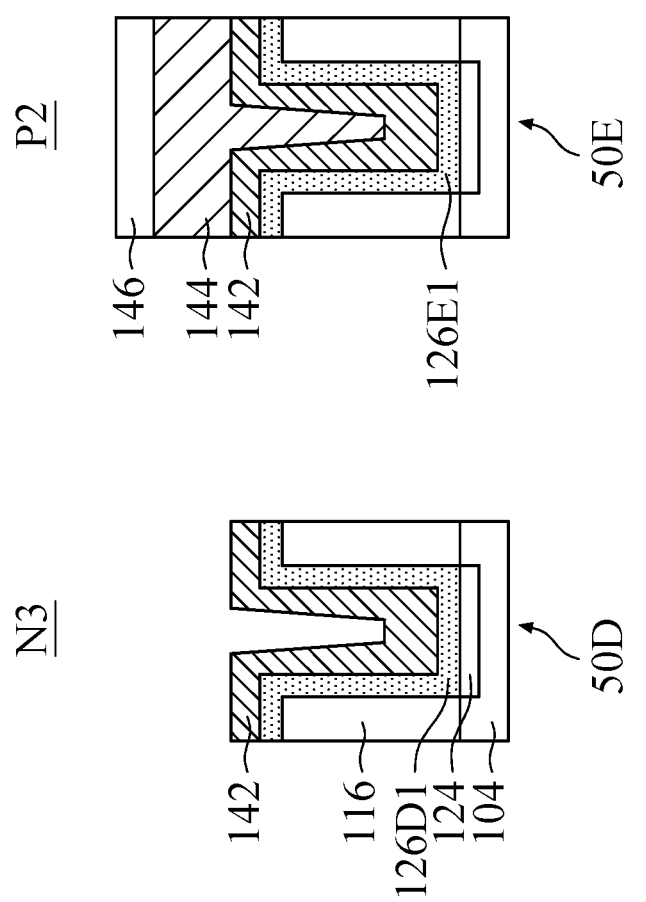

FIG. 7C is a cross-sectional view illustrating some portions of the semiconductor structure 100 after the removal of the metal fill layer 144 from the region 50D, in accordance with some embodiments.

An etching process is performed using the mask layer 146 to remove the portion of the metal fill layer 144 from the region 50D until the work function layer 142 is exposed, as shown in FIG. 7C, in accordance with some embodiments. The etching process may be an anisotropic etching process such as dry plasma etching, an isotropic etching process such as dry chemical etching, remote plasma etching or wet chemical etching, and/or a combination thereof.

Figure 7D:
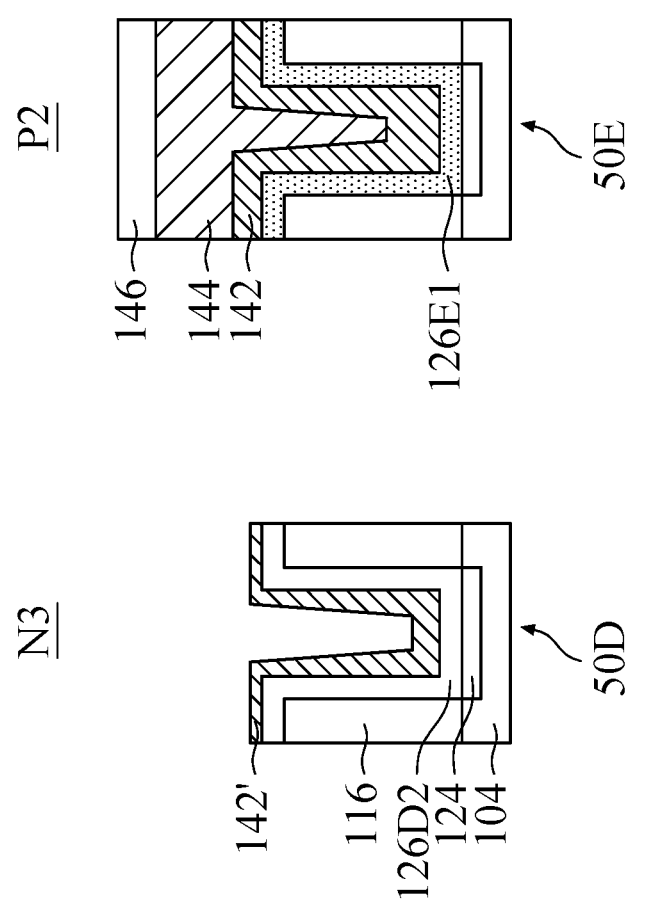

FIG. 7D is a cross-sectional view illustrating some portions of the semiconductor structure 100 after thinning down the work function layer 142 at region SOD, in accordance with some embodiments.

Because of the etching process for removing the metal fill layer 144 and/or being exposed to an ambient containing $O_2$ or $H_2O$ after the etching process, the portion of the work function material 142 at the region 50D is oxidized to form a native oxide layer on its exposed surfaces, in accordance with some embodiments. An etching process is performed to remove the native oxide layer of the work function material 142, in accordance with some embodiments. In some embodiments, a remaining portion of the work function material 142 is denoted as 142', as shown in FIG. 7D. In some embodiments, the work function material 142' has a thickness that is from about 10% to about 90% of the thickness of the as-deposited work function material 142. The etching process may be an anisotropic etching process such as dry plasma etching, an isotropic etching process such as dry chemical etching, remote plasma etching or wet chemical etching, and/or a combination thereof.

During the etching process, the heat and/or ion bombard from the etching process may allow fluorine atoms in the gate dielectric layer 126D1 to easily escape from the gate dielectric layer, thereby reducing the fluorine concentrations of the gate dielectric layer 126D1, in accordance with some embodiments. The fluorine-escaping gate dielectric layer 126D1 is denoted as 126D2, in accordance with some embodiments.

In some embodiments, the average fluorine concentration of the gate dielectric layer 126D2 is lower than the average fluorine concentration of the gate dielectric layer 126D1. The amount of reduction in fluorine concentration may depend on the removed thickness of the work function layer 142.

Figure 7E:
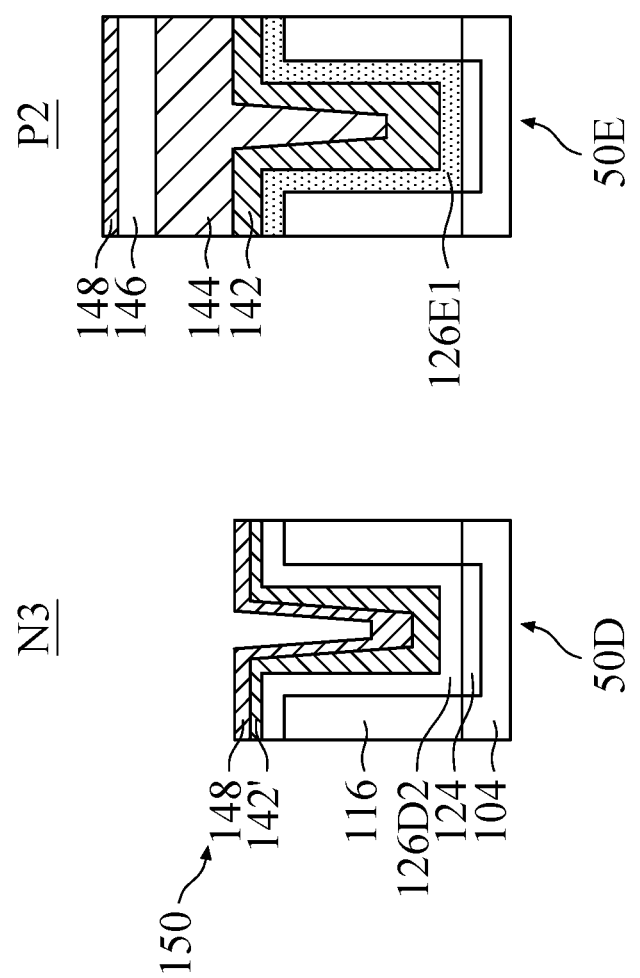
Figure 7F:
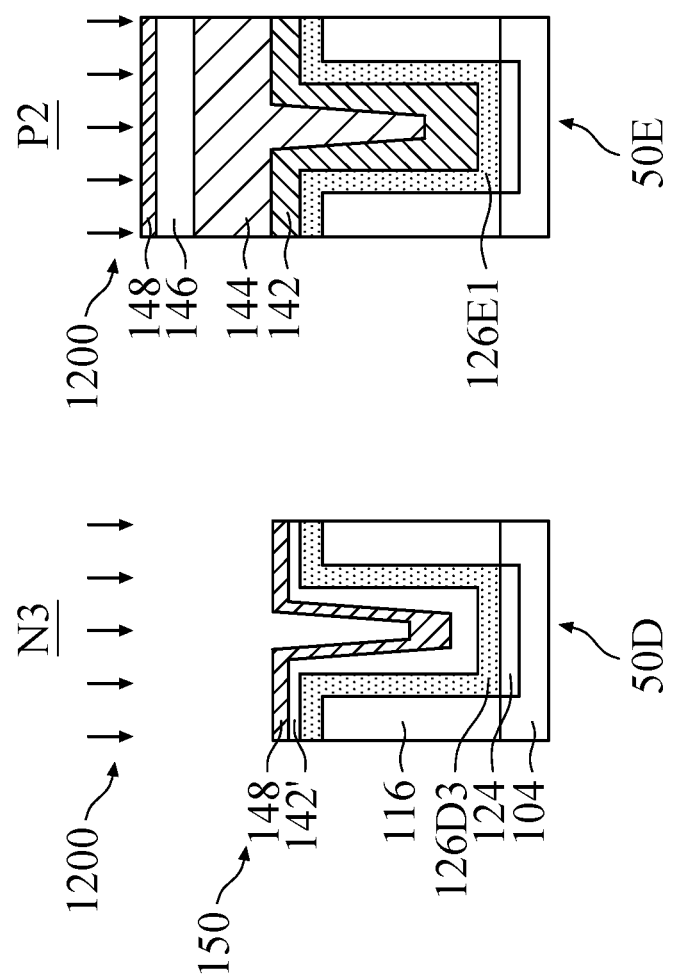

FIGS. 7E and 7F are cross-sectional views illustrating some portions of the semiconductor structure 100 after the formation of a work function material 148 and a fluorination treatment 1200, in accordance with some embodiments.

A work function material 148 is formed over the semiconductor structure 100 at the regions 50D and 50E, as shown in FIG. 7D, in accordance with some embodiments. At the region 50D, the work function material 148 is formed on the work function material 142', in accordance with some embodiments. At the region 50E, the work function material 148 is formed on the mask layer 146, in accordance with some embodiments.

The work function material 148 is the same material as the work function material 142, for example, titanium nitride (TiN), in accordance with some embodiments. The work function material 148 is deposited using ALD, CVD, PVD, another suitable technique, and/or a combination thereof. In some embodiments, the etching process for thinning down the work function material 142 and the deposition process of the work function material 148 are performed in-situ. In some embodiments, the work function material 148 has a thickness in a range from about 10 Å to about 20 Å.

A fluorination treatment 1200 is performed on the semiconductor structure 100 to incorporate and/or dope fluorine into the gate dielectric layer 126D2, as shown in FIG. 7F, in accordance with some embodiments. In some embodiments, the fluorine-doped gate dielectric layer 126D2 is denoted as 126D3.

The fluorination treatment 1200 is a soak annealing process, in accordance with some embodiments. The semiconductor structure 100 is placed in a process chamber and soaked in a fluorine-containing gas, in accordance with some embodiments. In some embodiments, the fluorine-containing gas includes $NF_3$, $F_2$, another suitable fluorine-containing gas, and/or a combination thereof. In some embodiments, the parameters of the soak annealing process of the fluorination treatment 1200 are substantially the same as the parameters of the soak annealing process of the fluorination treatment 1150

In alternative embodiments, the parameters of the soak annealing process of the fluorination treatment 1200 are different than the parameters of the soak annealing process of the fluorination treatment 1150. For example, the duration of the fluorination treatment 1200 may be longer or shorter than the duration of the fluorination treatment 1150.

In some embodiments in which the gate dielectric layer 126D1 is made of hafnium-containing dielectric material, the ratio of the average fluorine concentration to the average hafnium concentration of the fluorine-doped gate dielectric layer 126D3 is greater than 0.01, for example in a range from about 0.01 to about 0.5, for example in a range from about 0.02 to about 0.04.

The work function material 142' and the work function material 148 are together used as a glue layer for the subsequently formed metal fill material and referred to as 150, in accordance with some embodiments.

Figure 7G:
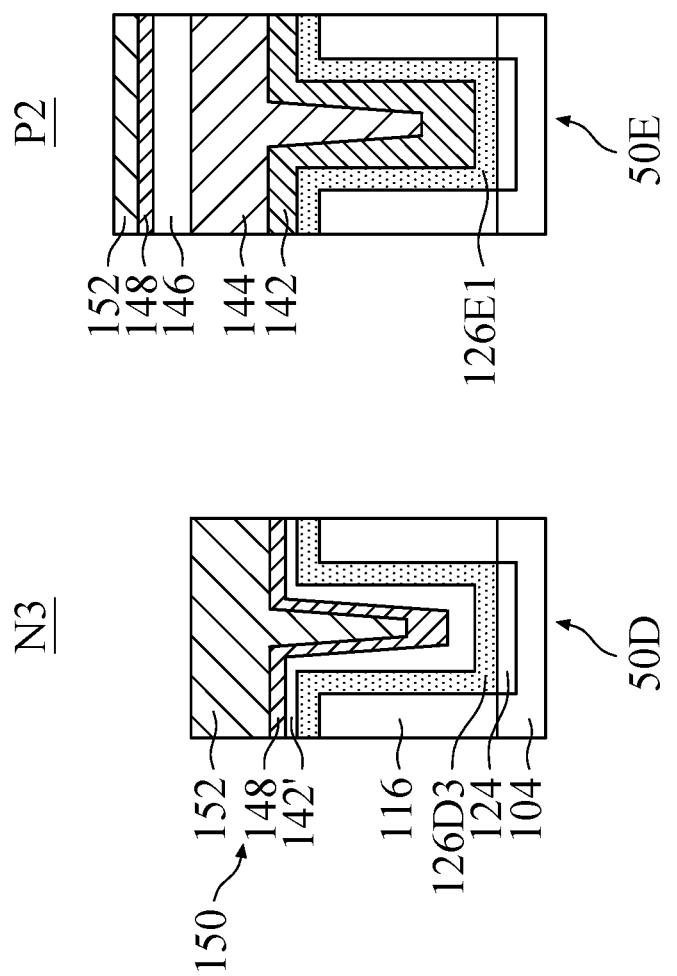

FIG. 7G is a cross-sectional view illustrating some portions of the semiconductor structure 100 after the formation of a metal fill layer 152, in accordance with some embodiments.

A metal fill layer 152 is formed over the semiconductor structure 100 at the regions 50D and 50E, as shown in FIG. 7G, in accordance with some embodiments. At the region 50D, the metal fill layer 152 is formed on the work function material 150 to overfill the remainder of the gate trench T, in accordance with some embodiments.

During the deposition process for forming the metal fill layer 152, fluorine atoms in the gate dielectric layer 126D3 may not escape from the gate dielectric layer because the work function material 150 covers and may protect the gate dielectric layer 126D3, in accordance with some embodiments.

In some embodiments, the metal fill layer 152 is n-type metal, e.g., Al, TiAl, TiAlC, TaAlC, or TiAlN. In some embodiments, the metal fill layer 152 is formed using ALD, CVD, PVD, electroplating process, another suitable technique, and/or a combination thereof.

Figure 7H:
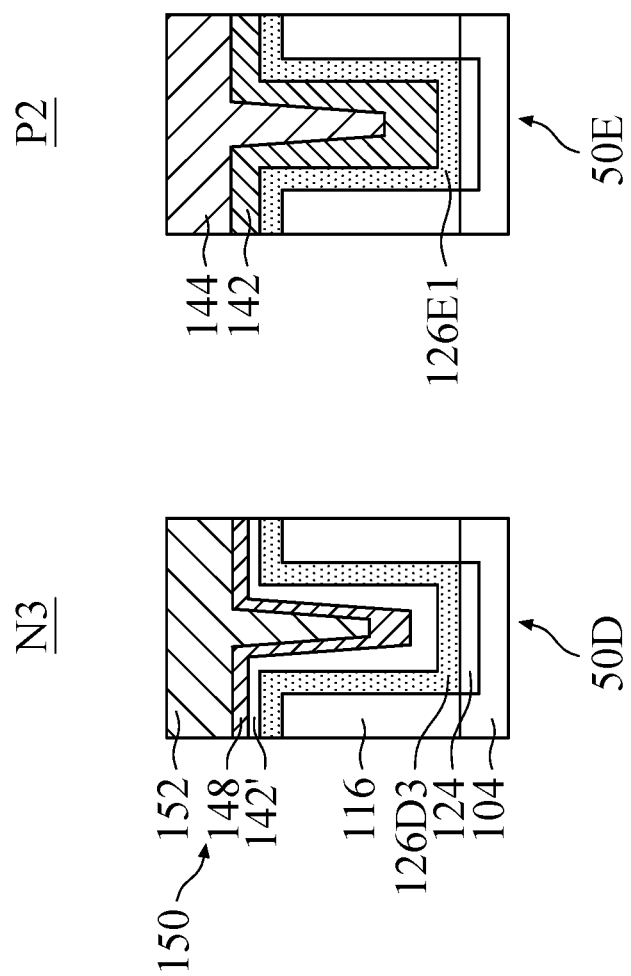

FIG. 7H is a cross-sectional view illustrating some portions of the semiconductor structure 100 after a planarization process, in accordance with some embodiments.

A planarization process is performed on the semiconductor structure 100 to remove the metal fill layer 152, the work function layer 148 and the mask layer 146 from the region 50E until the metal fill layer 144 is exposed, as shown in FIG. 7H, in accordance with some embodiments. In some embodiments, a portion of the metal fill layer 152 is also partially removed in the planarization process. In some embodiments, the planarization process is an etching process or a CMP process.

In accordance with the embodiments of the present disclosure, more than one fluorination treatments are performed for different device regions. The first fluorination treatment 1150 is used for the gate dielectric layer 126E1 in the region 50E in which the p-type transistor P2 is formed, and is performed immediately after the formation of the work function layer 142, in accordance with some embodiments. The second fluorination treatment 1200 is used for the gate dielectric layer 126D1 in the region 50D in which the n-type transistor N3 is formed, and is performed immediately after the formation of the work function layer 150, in accordance with some embodiments. As a result, the gate dielectric layer in all device regions may be doped with sufficient fluorine. The defects (e.g., void, broken bonds, etc.) in the gate dielectric layers 126D1 and 126E1 may be sufficiently repaired by fluorine atoms, which may improve the quality of the gate dielectric layers, thereby enhancing the reliability of semiconductor devices, e.g., TDDB.

Figure 8A:
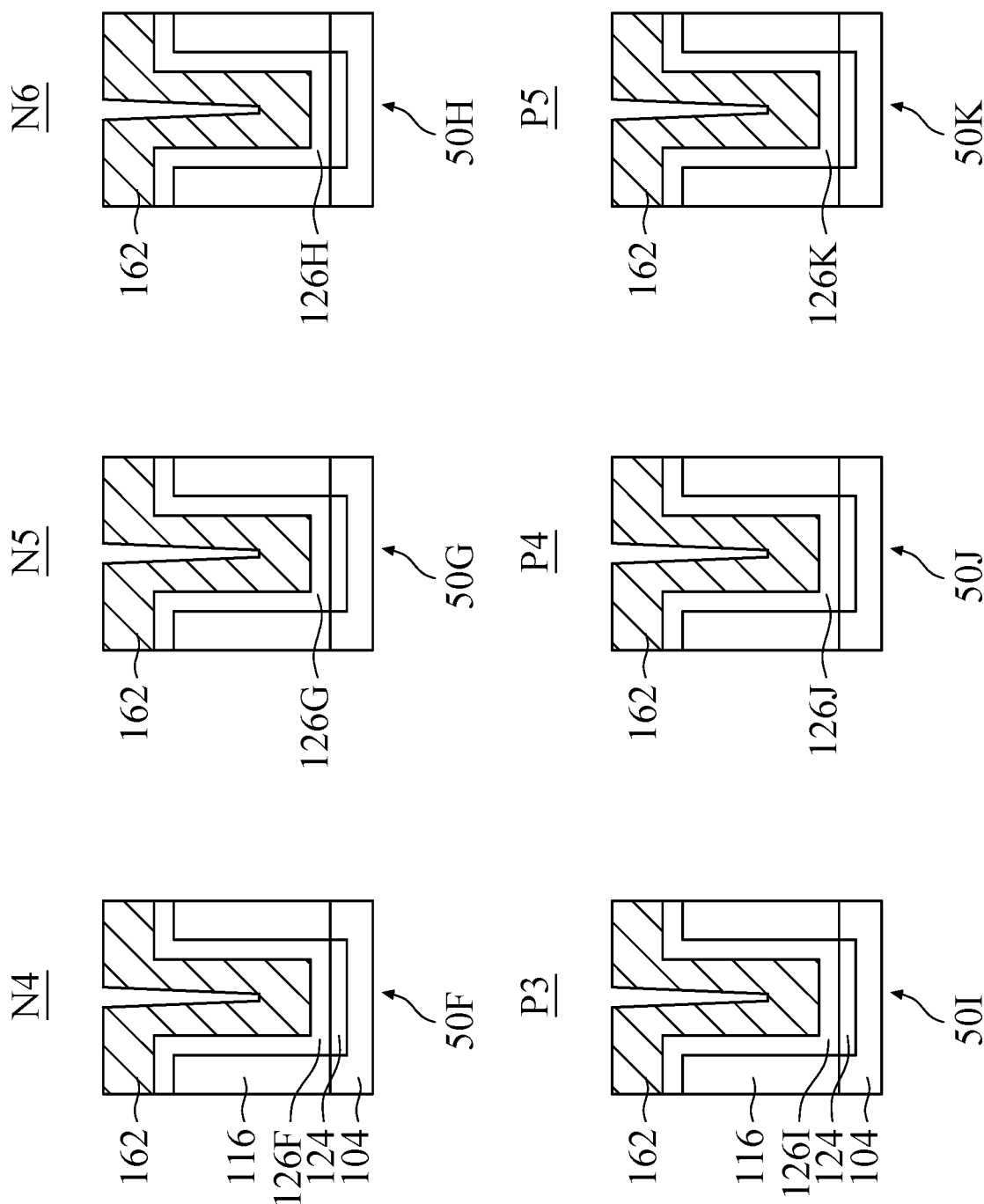

FIGS. 8A through 8J are cross-sectional views illustrating the formation of the metal gate electrode layers 130 (shown in FIG. 2H-1) and fluorination treatments of gate dielectric layers 126 at various intermediate stages, in accordance with some embodiments of the disclosure. FIGS. 8A through 8H illustrate a portion of a semiconductor structure 100 corresponding to area R of FIG. 2H-1, FIG. 8A is a cross-sectional view illustrating some portions of the semiconductor structure 100 after the formation of a barrier material 162, in accordance with some embodiments.

The substrate 102 includes regions 50F, 50G, 50H, 50I, 50J and 50K, as shown in FIG. 8A, in accordance with some embodiments. In some embodiments, an n-type transistor N4 is predetermined to be formed in the region 50F of the substrate 102 and has a threshold voltage Vn4 (e.g., ultra-low voltage). In some embodiments, an n-type transistor N5 is predetermined to be formed in the region 50G of the substrate 102 and has a threshold voltage Vn5 (e.g., low voltage). In some embodiments, an n-type transistor N6 is predetermined to be formed in the region 50H of the substrate 102 and has a threshold voltage Vn6 (e.g., standard voltage). Here, 0<Vn4<Vn5<Vn6.

In some embodiments, a p-type transistor P3 is predetermined to be formed in the region 50I of the substrate 102 and has a threshold voltage Vp3 (e.g., standard voltage). In some embodiments, a p-type transistor P4 is predetermined to be formed in the region 50J of the substrate 102 and has a threshold voltage Vp4 (e.g., low voltage). In some embodiments, a p-type transistor P5 is predetermined to be formed in the region 50K of the substrate 102 and has a threshold voltage Vp5 (e.g., ultra-low voltage). Here, Vp3<Vp4<Vp5<0. In some embodiments, the n-type transistors N4, N5 and N6 are n-channel FinFETs and the p-type transistors P3, P4 and P5 are p-channel FinFETs.

In some embodiments, the gate dielectric layer 126 of the n-type transistor N4, formed in the region 50F, is denoted as 126F. In some embodiments, the gate dielectric layer 126 of the n-type transistor N5, formed in the region 50G, is denoted as 126G. In some embodiments, the gate dielectric layer 126 of the n-type transistor N6, formed in the region 50H, is denoted as 126H. In some embodiments, the gate dielectric layer 126 of the p-type transistor P3, formed in the region 50I, is denoted as 126I. In some embodiments, the gate dielectric layer 126 of the p-type transistor P4, formed in the region 50J, is denoted as 126J. In some embodiments, the gate dielectric layer 126 of the p-type transistor P5, formed in the region 50K, is denoted as 126K.

After the PDA process described above in FIGS. 2G-1 and 2G-2, a barrier material 162 is formed over the semiconductor structure 100 at the regions 50F-50K, in accordance with some embodiments. The barrier material 162 is formed on the gate dielectric layers 126F-126K and partially fills the gate trenches T, in accordance with some embodiments.

In some embodiments, the barrier material 162 is metal nitride, e.g., TaN, TiN, WCN, another suitable barrier material, and/or a combination thereof. The barrier material 162 is deposited using ALD, CVD, PVD, another suitable technique, and/or a combination thereof. In some embodiments, the barrier material 162 has a thickness in a range from about 18 Å to about 22 Å.

FIG. 8B is a cross-sectional view illustrating some portions of the semiconductor structure 100 after the formation of a mask layer 170, in accordance with some embodiments.

After the deposition process of the barrier material 162, an outer portion of the barrier material 162 (i.e., a surface portion exposed to the ambient) is oxidized to form a native oxide layer 162O (also referred to as barrier oxide) at the regions 50F-50K due to being exposed to an ambient containing $O_2$ or $H_2O$, as shown in FIG. 8B, in accordance with some embodiments. The remaining portion (i.e., the inner portion) of the barrier material 162 remains unoxidized.

In some embodiments, the barrier oxide 162O is a metal oxide or a metal oxynitride based on the chosen barrier material 162, e.g., $Ta_2O_5$, TaON, $TiO_2$, TiON, $W_2O_5$, WOCN, another suitable oxide, and/or a combination thereof, in accordance with some embodiments. In some embodiments, the thickness of the barrier oxide 162O is in a range from about 3.6 Å to about 4.4 Å.

A mask layer 170 is formed over the barrier oxide 162O at the region 50K, as shown in FIG. 8B, in accordance with some embodiments. The mask layer 170 exposes the barrier oxide 162O at the regions 50F-50J, in accordance with some embodiments. In some embodiments, the mask layer 170 is a patterned photoresist layer and/or a patterned hard mask layer. In some embodiments where the barrier oxide 162O is $Ta_2O_5$ or TaON, the mask layer 170 is made of TiN.

Figure 8C:
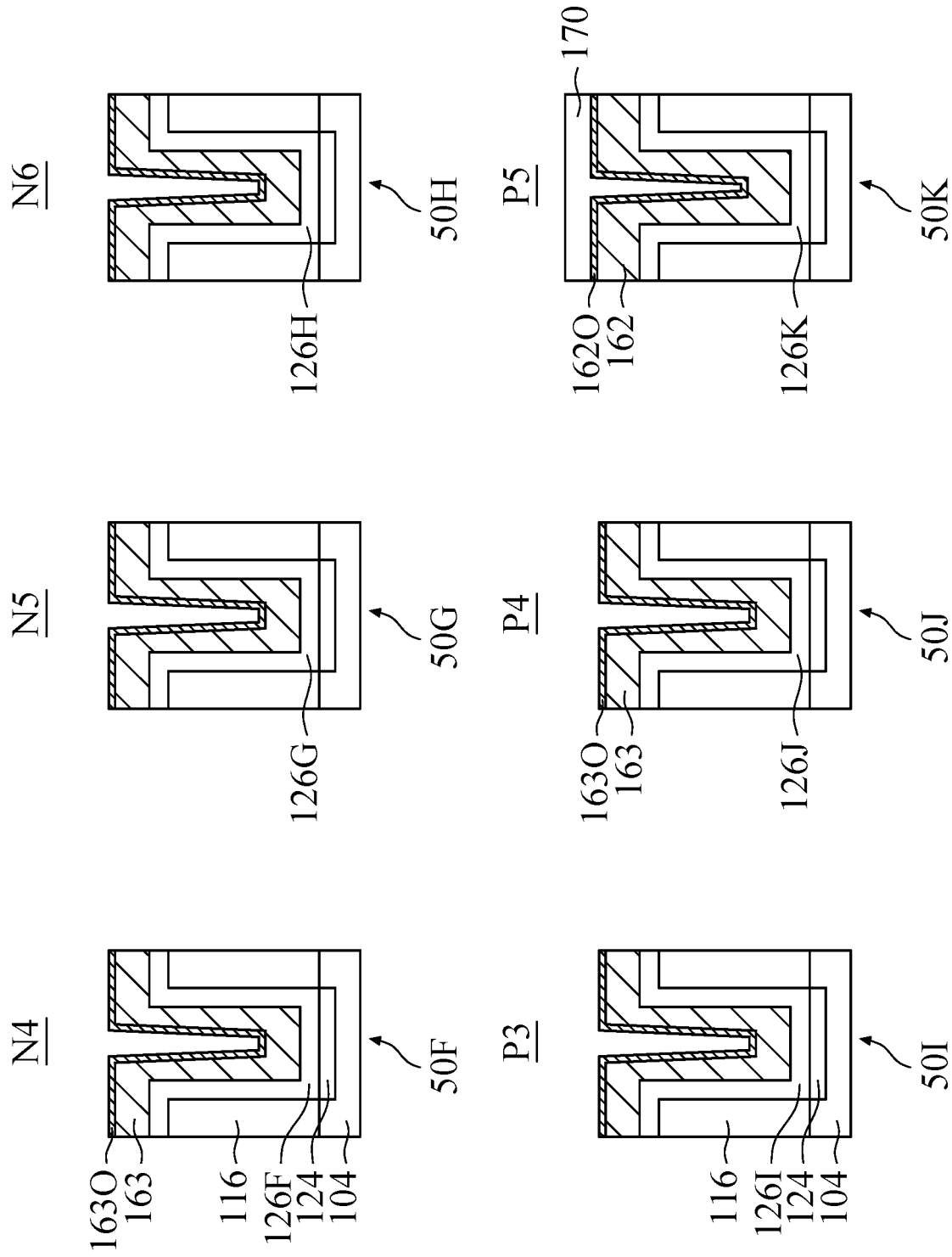

FIG. 8C is a cross-sectional view illustrating some portions of the semiconductor structure 100 after an etching process, in accordance with some embodiments.

An etching process is performed using the mask layer 170 to remove the portions of the barrier oxide 162O at the regions 50F-50J, in accordance with some embodiments. The etching process is performed until the barrier material 162 is exposed, in accordance with some embodiments. In some embodiments, the etching process uses $TaCl_5$, $WCl_5$, another suitable etchant, and/or a combination thereof as an etchant. Because the barrier material has a different etching selectively from the harrier oxide, the barrier material may be used as an etching stop layer in the etching process.

After the etching process, an outer portion of the exposed barrier material 162 (i.e., a surface portion exposed to the ambient) is oxidized to form a native oxide layer 163O (also referred to as barrier oxide) at the regions 50F-50J due to being exposed to an ambient containing $O_2$ or $H_2O$, as drown in FIG. 8C, in accordance with some embodiments. The remaining portion (i.e., the inner portion) of the barrier material 162 remains unoxidized and is denoted as a barrier material 163. In some embodiments, the thickness of the barrier material 163 is in a range from about 14.4 Å to about 17.6 Å.

Afterward, the mask layer 170 is removed by a clean process using for example standard clean 1 (SC1). For example, SC1 may include ammonia hydroxide-hydrogen peroxide-water mixture.

Figure 8D:
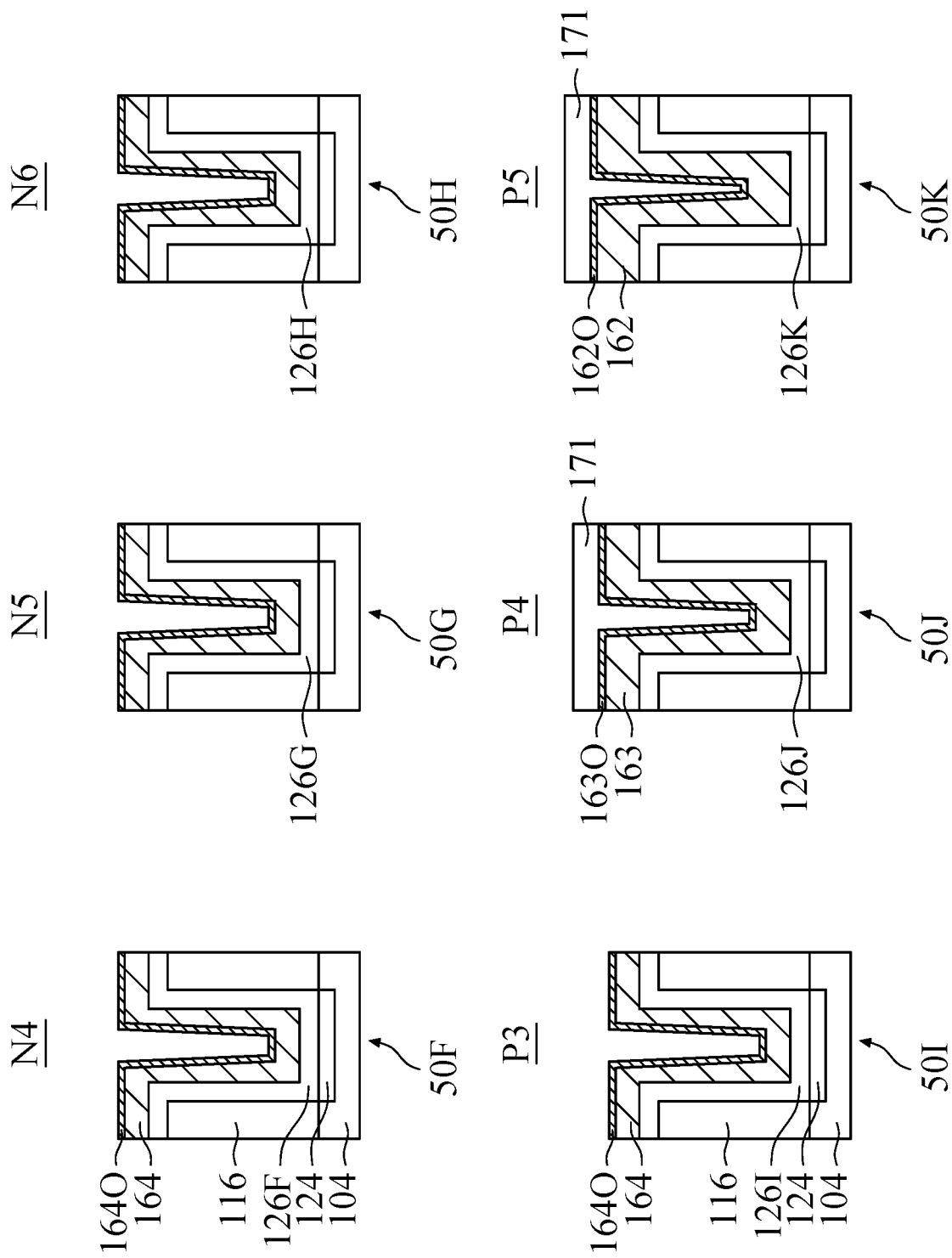

FIG. 8D is a cross-sectional view illustrating some portions of the semiconductor structure 100 after the formation of a mask layer 171 and an etching process, in accordance with some embodiments.

A mask layer 171 is formed over the barrier oxide 162O at the region 50K and barrier oxide 163O at the region 50J, as shown in FIG. 8D, in accordance with some embodiments. The mask layer 171 exposes the barrier oxide 163O at the regions 50F-50I in accordance with some embodiments. In some embodiments, the material of the mask layer 171 is the same as the material of the mask layer 170.

An etching process is performed using the mask layer 171 to remove the portions of the barrier oxide 163O at the regions 50E-50I, in accordance with some embodiments. The etching process is performed until the barrier material 163 is exposed, in accordance with some embodiments. In some embodiments, the etching process may be performed in the same or a similar manner as described above in FIG. 8C.

After the etching process, an outer portion of the exposed barrier material 163 (i.e., a surface portion exposed to the ambient) is oxidized to form a native oxide layer 164O (also referred to as barrier oxide) at the regions 50E-50I due to being exposed to an ambient containing $O_2$ or $H_2O$, as shown in FIG. 8D, in accordance with some embodiments. The remaining portion (i.e., the inner portion) of the barrier material 163 remains unoxidized and is denoted as a barrier material 164. In some embodiments, the thickness of the harrier material 164 is in a range from about 10.8 Å to about 13.2 Å.

Afterward, the mask layer 171 may be removed by a clean process using for example SC1.

Figure 8E:
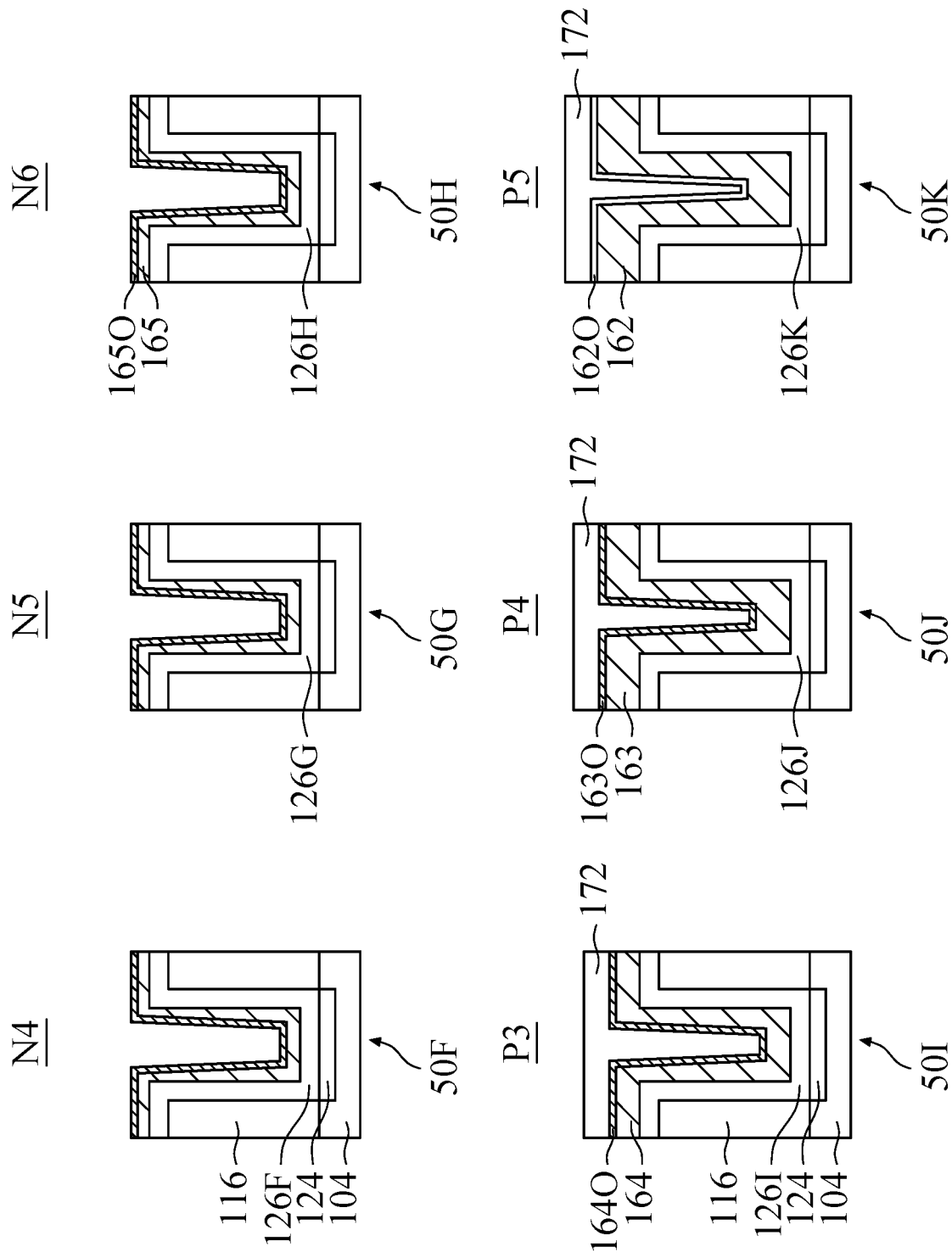

FIG. 8E is a cross-sectional view illustrating some portions of the semiconductor structure 100 after the formation of a mask layer 172 and an etching process, in accordance with some embodiments.

A mask layer 172 is formed over the harrier oxide 162O at the region 50K, the barrier oxide 163O at the region 50J, and the barrier oxide 164O at the region 50I, as shown in FIG. 8E, in accordance with some embodiments. The mask layer 172 exposes the barrier oxide 164O at the regions 50F-50H, in accordance with some embodiments. In some embodiments, the material of the mask layer 172 is the same as the material of the mask layer 170.

An etching process is performed using the mask layer 172 to remove the portions of the barrier oxide 164O at the regions 50F-50H, in accordance with some embodiments. The etching process is performed until the barrier material 164 is exposed, in accordance with some embodiments. In some embodiments, the etching process may be performed in the same or a similar manner as described above in FIG. 8C.

After the etching process, an outer portion of the exposed barrier material 164 (i.e., a surface portion exposed to the ambient) is oxidized to form a native oxide layer 165O (also referred to as barrier oxide) at the regions 50F-50H due to being exposed to an ambient containing $O_2$, or $H_2O$, as shown in FIG. 8E, in accordance with some embodiments. The remaining portion (i.e., the inner portion) of the barrier material 164 remains unoxidized and is denoted as a barrier material 165. In some embodiments, the thickness of the barrier material 165 is in a range from about 7.2 Å to about 8.8 Å.

Afterward, the mask layer 172 may be removed by a clean process using for example SC1.

Figure 8F:
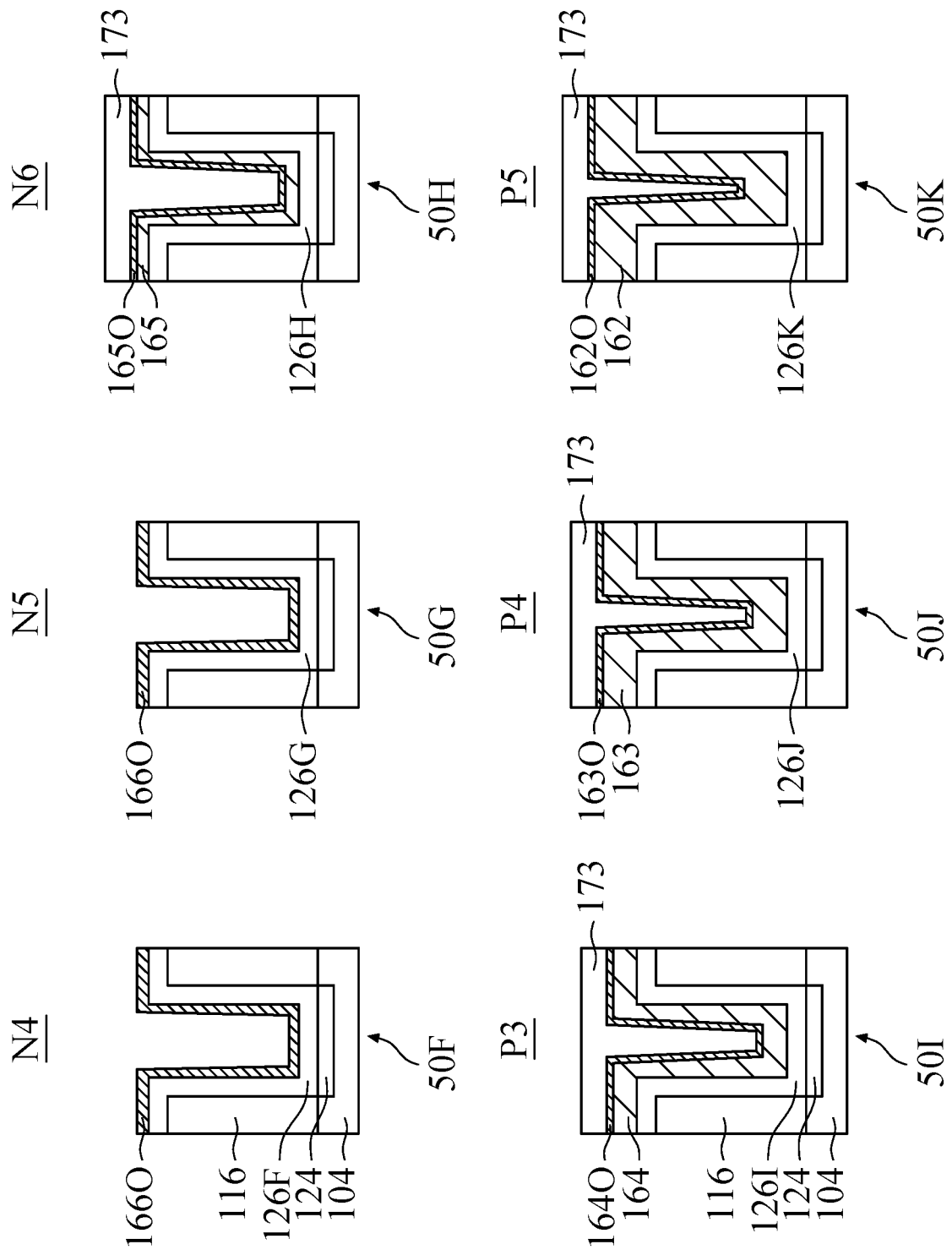

FIG. 8F is a cross-sectional view illustrating some portions of the semiconductor structure 100 after the formation of a mask layer 173 and an etching process, in accordance with some embodiments.

A mask layer 173 is formed over the barrier oxide 162O at the region 50K, the barrier oxide 163O at the region 50J, the barrier oxide 164O at the region 50I, and the barrier oxide 165O at the region 50H, as shown in FIG. 8F, in accordance with some embodiments. The mask layer 173 exposes the barrier oxide 165O at the regions 50F and 50G, in accordance with some embodiments. In some embodiments, the material of the mask layer 173 is the same as the material of the mask layer 170.

An etching process is performed using the mask layer 173 to remove the portions of the barrier oxide 165O at the regions 50F and 50G, in accordance with some embodiments. The etching process is performed until the barrier material 165 is exposed, in accordance with some embodiments. In some embodiments, the etching process may be performed in the same or a similar manner as described above in FIG. 8C.

After the etching process, the barrier material 165 is substantially entirely oxidized to form a native oxide layer 166O (also referred to as barrier oxide) at the regions 50F and 50G due to being exposed to an ambient containing $O_2$ or $H_2O$, as shown in FIG. 8F, in accordance with some embodiments. In some embodiments, the thickness of the barrier oxide 166O is in a range from about 3.6 Å to about 4.4 Å.

Afterward, the mask layer 173 may be removed by a clean process using for example SC1.

Figure 8G:
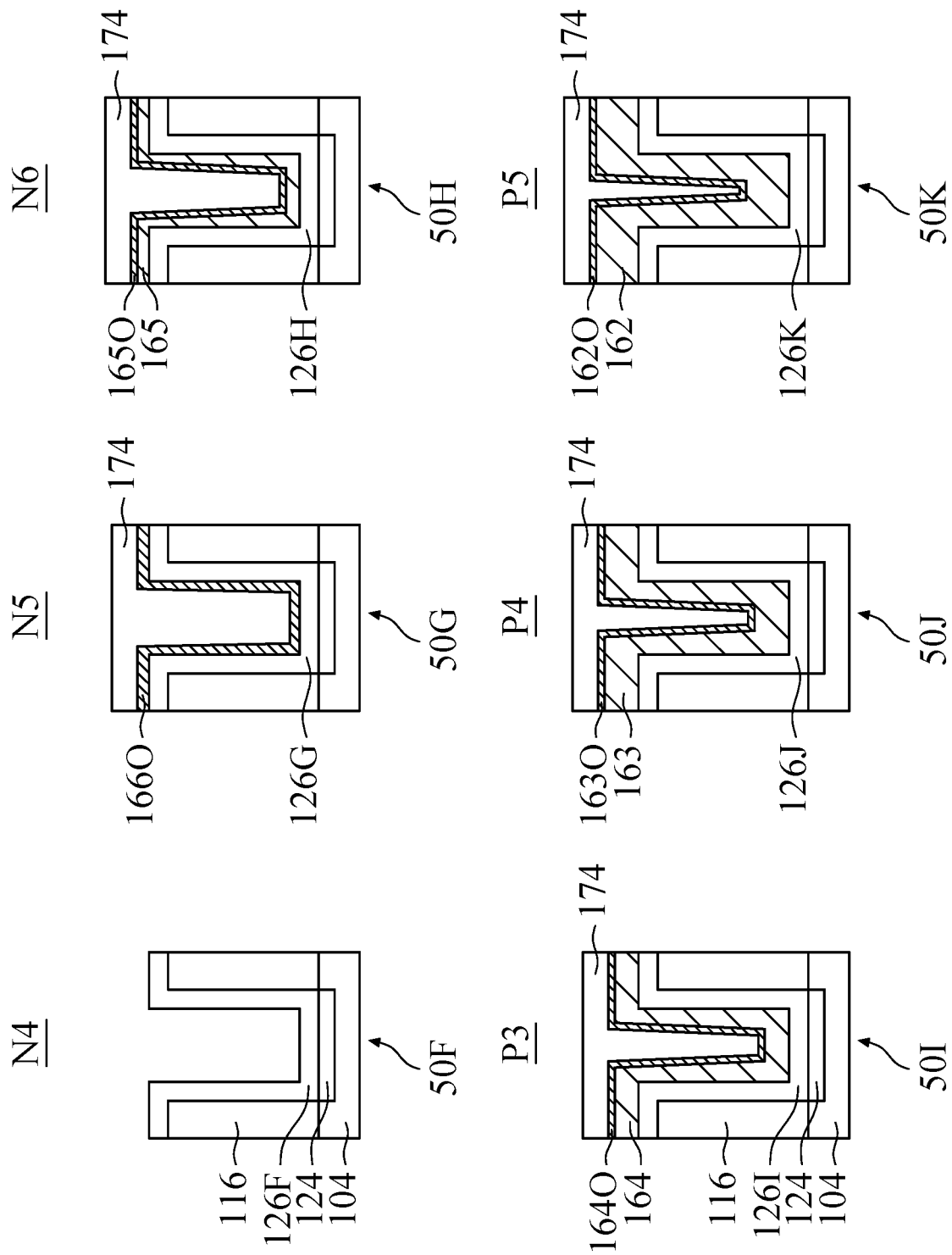

FIG. 8G is a cross-sectional view illustrating some portions of the semiconductor structure 100 after the formation of a mask layer 174 and an etching process, in accordance with some embodiments.

A mask layer 174 is formed over the barrier oxide 162O at the region 50K, the barrier oxide 163O at the region 50J, the barrier oxide 164O at the region 50I, the barrier oxide 165O at the region 50H, and the barrier oxide 166O at the region 50G, as shown in FIG. 8G, in accordance with some embodiments. The mask layer 174 exposes the barrier oxide 166O at the region 50F, in accordance with some embodiments. In some embodiments, the material of the mask layer 174 is the same as the material of the mask layer 170.

An etching process is performed using the mask layer 174 to remove the portions of the barrier oxide 166O at the region 50F, in accordance with some embodiments. The etching process is performed until the gate dielectric layer 126F is exposed, in accordance with some embodiments. In some embodiments, the etching process may be performed in the same or a similar manner as described above in FIG. 8C.

Afterward, the mask layer 174 may be removed by a clean process using for example SC1.

The barrier materials 162-165 and the barrier oxides 162O-166O may collectively referred to as barrier layers. The barrier layers may reduce the influence from the subsequently formed metal fill layer (e.g., containing Al) on the energy band of the conductive carrier flowing through the channel region. As such, the threshold voltage of a transistor may be adjusted by adjusting the thickness of the barrier layer.

Figure 8H:

FIG. 8H is a cross-sectional view illustrating some portions of the semiconductor structure 100 after the formation of a fluorination treatment 1250, in accordance with some embodiments.

A fluorination treatment 1250 is performed on the semiconductor structure 100 to incorporate and/or dope fluorine into the gate dielectric layers 126F-126K, as shown in FIG. 8H, in accordance with some embodiments. In some embodiments, the fluorine-doped gate dielectric layer 126F-126K are denoted as 126F1-126K1, respectively.

The fluorination treatment 1250 is a soak annealing process, in accordance with some embodiments. The semiconductor structure 100 is placed in a process chamber and soaked in a fluorine-containing gas, in accordance with some embodiments. In some embodiments, the fluorine-containing gas includes $NF_3$, $F_2$, another suitable fluorine-containing gas, and/or a combination thereof. In some embodiments, the fluorine-containing gas is flowed into the processing chamber along with a diluent gas such as an inert gas (e.g., Ar or $N_2$). In some embodiments, the total flow rate of the fluorine-containing gas and the diluent gas is in a range from about 2500 sccm to about 25 slm, and the ratio of the flow rate of the fluorine-containing gas to the flow rate of the diluent gas is in a range from about 0.1 to about 10. In some embodiments, the soak annealing process is performed at a temperature in a range from about 300° C. to about 450° C. for a duration in a range from about 10 seconds to about 10 minutes.

In some embodiments in which the gate dielectric layer 126F is made of hafnium-containing dielectric material, the ratio of the average fluorine concentration to the average hafnium concentration of the fluorine-doped gate dielectric layer 126F1 is greater than 0.01, for example in a range from about 0.01 to about 0.5, for example in a range from about 0.05 to about 0.1.

In some embodiments in which the gate dielectric layers 126G-126K is made of hafnium-containing dielectric material, the ratio of the average fluorine concentration to the average hafnium concentration of the fluorine-doped gate dielectric layers 126G1-126K1 is greater than 0.01, for example in a range from about 0.01 to about 0.5, for example in a range from about 0.02 to about 0.04.

Figure 8I:
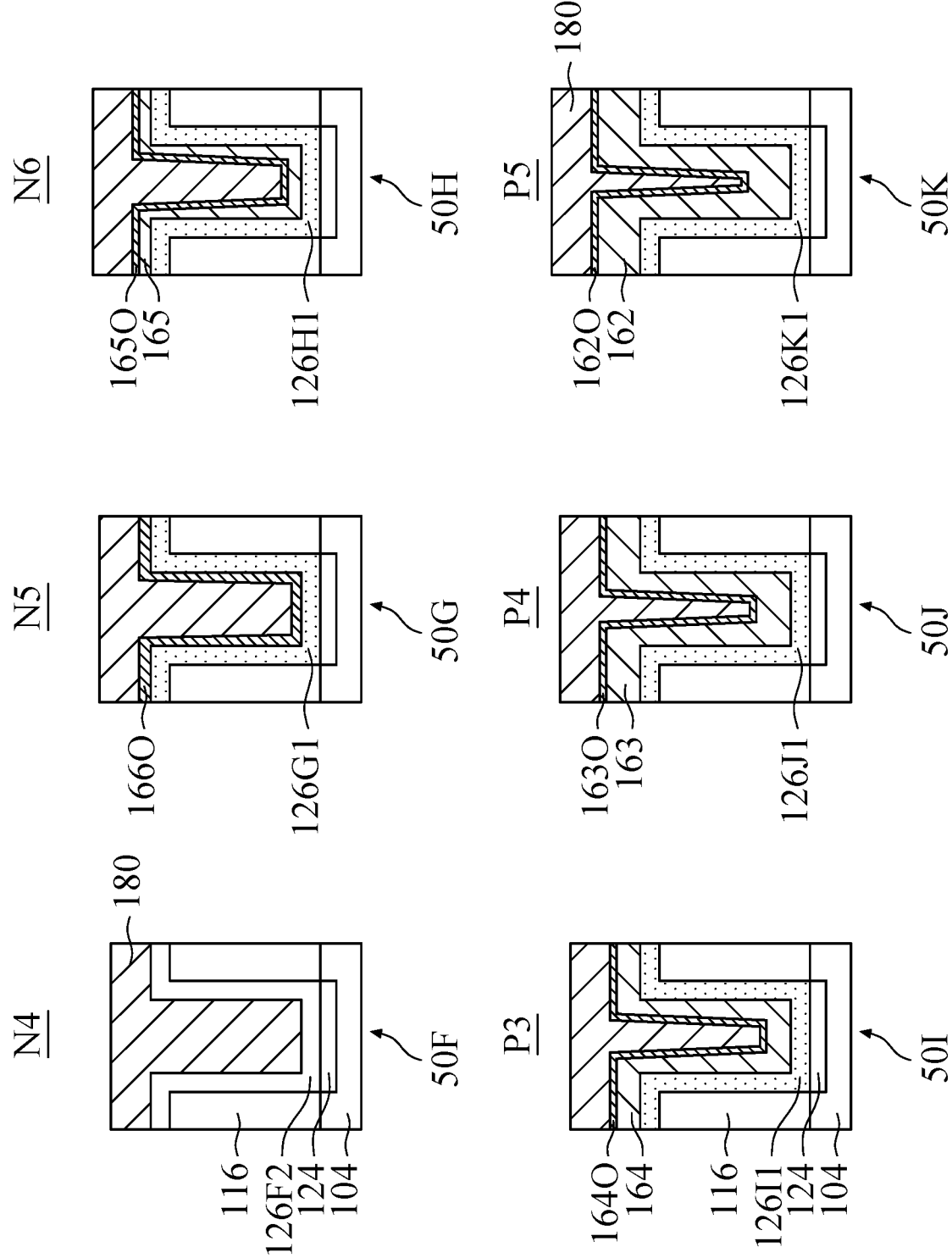

FIG. 8I is a cross-sectional view illustrating some portions of the semiconductor structure 100 after the formation of a metal fill layer 180, in accordance with some embodiments.

A metal fill layer 180 is formed over the semiconductor structure 100 at the regions 50F-50K to overfill the remainders of the gate trenches T, as shown in FIG. 8I, in accordance with some embodiments, At the region 50F, the metal fill layer 180 is formed on the gate dielectric layer 126F1, in accordance with some embodiments. At the region 50G, the metal fill layer 180 is formed on the barrier oxide 166O, in accordance with some embodiments. At the region 50H, the metal fill layer 180 is formed on the barrier oxide 165O, in accordance with some embodiments. At the region 50I, the metal fill layer 180 is formed on the barrier oxide 164O, in accordance with some embodiments. At the region 50J, the metal fill layer 180 is formed on the barrier oxide 163O, in accordance with some embodiments. At the region 50K, the metal fill layer 180 is formed on the barrier oxide 162O, in accordance with some embodiments.

During the deposition process for forming the metal fill layer 180, fluorine atoms in the gate dielectric layer 126F1 may escape from the gate dielectric layer, thereby reducing the fluorine concentrations of the gate dielectric layer 126 F1, in accordance with some embodiments. The fluorine-escaping gate dielectric layer 126F1 is denoted as 126F2, in accordance with some embodiments. In some embodiments, the average fluorine concentration of the gate dielectric layer 126F2 is lower than the average fluorine concentration of the gate dielectric layer 126F1.

In some embodiments, the metal fill layer 180 is made of Al, TiAl, TiAlC, TaAlN, TiAlN, W, Ru, Al, Cu, Co, another suitable conductive material, and/or a combination thereof. In some embodiments, the metal fill layer 180 is formed using ALD, CVD, PVD, electroplating process, another suitable technique, and/or a combination thereof.

Figure 8J:
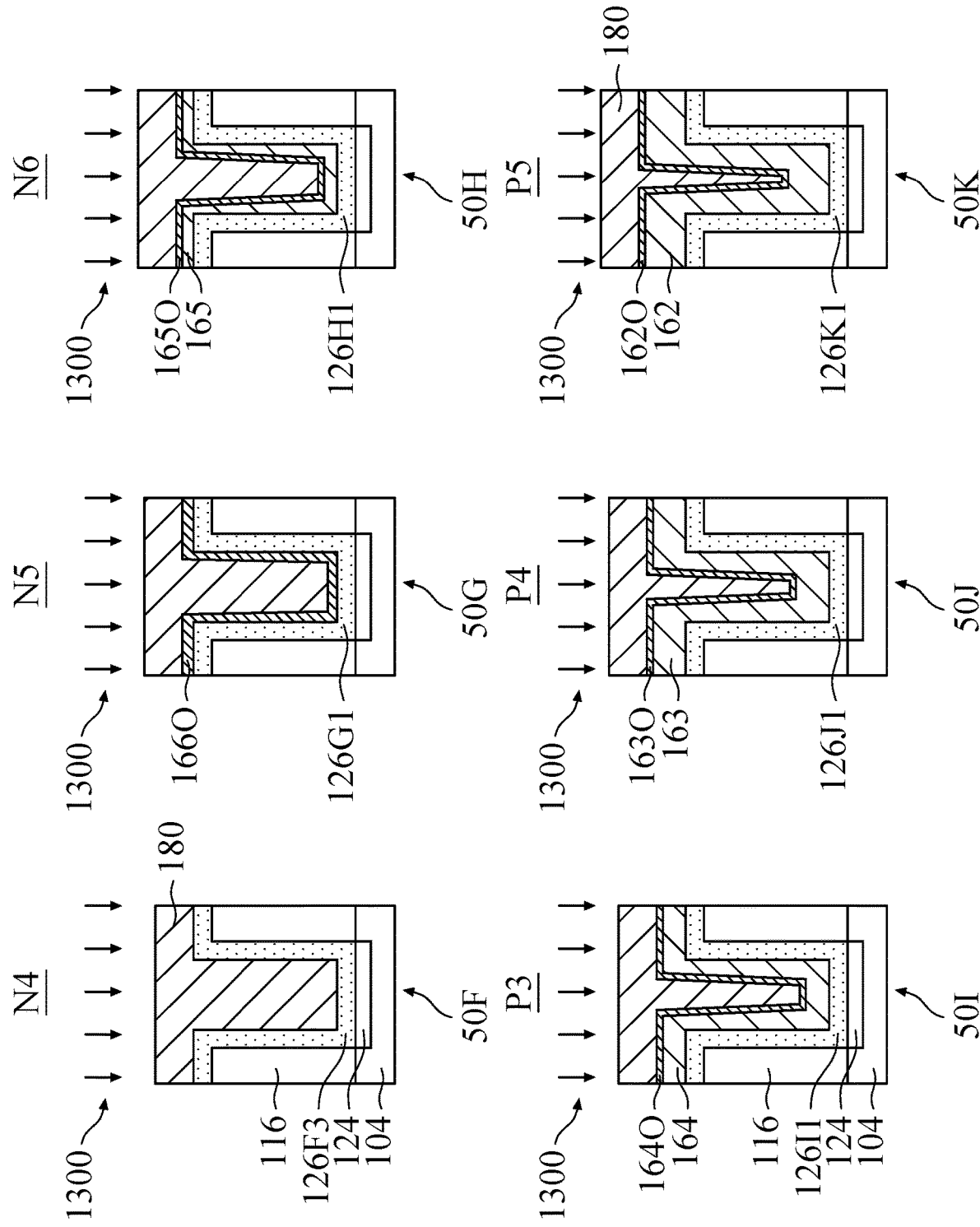

FIG. 8J is a cross-sectional view illustrating some portions of the semiconductor structure 100 after a fluorination treatment 1300, in accordance with some embodiments.

A fluorination treatment 1300 is performed on the semiconductor structure 100 to incorporate and/or dope fluorine into the gate dielectric layer 126F2, as shown in FIG. 8J, in accordance with some embodiments. In some embodiments, the fluorine-doped gate dielectric layer 126F2 is denoted as 126F3.

The fluorination treatment 1300 is a soak annealing process, in accordance with some embodiments. The semiconductor structure 100 is placed in a process chamber and soaked in a fluorine-containing gas, in accordance with some embodiments. In some embodiments, the fluorine-containing gas includes $NF_3$, $F_2$, another suitable fluorine-containing gas, and/or a combination thereof. In some embodiments, the parameters of the soak annealing process of the fluorination treatment 1300 are substantially the same as the parameters of the soak annealing process of the fluorination treatment 1250.

In alternative embodiments, the parameters of the soak annealing process of the fluorination treatment 1300 are different than the parameters of the soak annealing process of the fluorination treatment 1250. For example, the duration of the fluorination treatment 1300 may be longer or shorter than the duration of the fluorination treatment 1250.

In some embodiments in which the gate dielectric layer 126F is made of hafnium-containing dielectric material, the ratio of the average fluorine concentration to the average hafnium concentration of the fluorine-doped gate dielectric layer 126F3 is greater than 0.01, for example in a range from about 0.01 to about 0.5, for example in a range from about 0.05 to about 0.1.

In accordance with the embodiments of the present disclosure, more than one fluorination treatments are performed for different device regions.

The first fluorination treatment 1250 is used for the gate dielectric layer 126G-126K in the regions 50G-50K in which the n-type transistors N5 and N6 and the p-type transistors P3, P4 and P5 are formed, and is performed immediately after the formation of the barrier layers, in accordance with some embodiments. The second fluorination treatment 1300 is used for the gate dielectric layer 126F in the region 50F in which the n-type transistor N4 is formed, and is performed immediately after the formation of the metal fill layer 180, in accordance with some embodiments. As a result, the gate dielectric layer in all device regions may be doped with sufficient fluorine. The defects (e.g., void, broken bonds, etc.) in the gate dielectric layers 126F-126K may be sufficiently repaired by fluorine atoms, which may improve the quality of the gate dielectric layers, thereby enhancing the reliability of semiconductor devices, e.g., TDDB.

As described above, a method for forming a semiconductor structure having various devices with different threshold voltages is provided. The aspect of the present disclosure is directed to incorporating fluorine into gate dielectric layers of the gate stacks for various devices. The semiconductor structure includes a first transistor N2 which includes a gate dielectric layer 126B, a barrier layer 134 over the gate dielectric layer 126B, and a metal fill layer 138 over the barrier layer 134, and a second transistor N1 includes a gate dielectric layer 126A, and a metal fill layer 138 over and in contact with the gate dielectric layer 126A. The method includes performing more than one fluorination treatments. A first fluorination treatment 1000 is performed after the formation of the barrier layer 134 to incorporate fluorine into the gate dielectric layer 126B of the first transistor N2. A second fluorination treatment 1100 is performed after the formation of the metal fill layer 138 to incorporate fluorine into the gate dielectric layer 126A of the second transistor N1. Therefore, the gate dielectric layers in all device regions may be incorporated with sufficient fluorine. The defects (e.g., void, broken bonds, etc.) in the gate dielectric layers may be sufficiently repaired by fluorine atoms, which may improve the quality of the gate dielectric layers, thereby enhancing the reliability of semiconductor devices.

Embodiments of a method for forming a semiconductor structure are provided. The method may include forming a first gate dielectric layer over a first fin structure and a second gate dielectric layer over a second fin structure, forming a barrier layer over the first gate dielectric layer, treating the substrate with a first fluorine-containing gas, forming a work function layer over the second gate dielectric layer, and treating the substrate with a second fluorine-containing gas. Therefore, the first and second gate dielectric layers may be doped with sufficient fluorine, thereby enhancing the reliability of semiconductor devices.

In some embodiments, a method for forming a semiconductor structure is provided. The method includes forming a first fin structure over a first region of a substrate and a second fin structure over a second region of the substrate, forming a first gate dielectric layer around the first fin structure and a second gate dielectric layer around the second fin structure, forming a barrier layer over the first gate dielectric layer, treating the substrate with a first fluorine-containing gas, forming a work function layer over the second gate dielectric layer after treating the substrate with the first fluorine-containing gas, and treating the substrate with a second fluorine-containing gas after forming the work function layer over the second gate dielectric layer.

In some embodiments, a method for forming a semiconductor structure is provided. The method includes forming a first fin structure and a second fin structure over a substrate, forming a first gate dielectric layer over the first fin structure and a second gate dielectric layer over the second fin structure, forming a barrier layer covering the second gate dielectric layer while exposing the first gate dielectric layer, and soaking the substrate in a first fluorine-containing gas after forming the barrier layer to diffuse fluorine into the first gate dielectric layer and the second gate dielectric layer. The method also includes forming a first gate metal fill layer over the first gate dielectric layer and a second gate metal fill layer over the barrier layer after soaking the substrate in the first fluorine-containing gas, and soaking the substrate in a second fluorine-containing gas after forming the first gate metal fill layer to diffuse fluorine into the first gate dielectric layer.

In some embodiments, a semiconductor structure is provided. The semiconductor structure includes a first first-type transistor on a substrate, and the first first-type includes a first fin structure, a first gate dielectric layer over the first fin structure, and a first gate metal fill layer over the first gate dielectric layer. The semiconductor structure also includes a second first-type transistor on the substrate, and the second first-type transistor includes a second fin structure, a second gate dielectric layer over the second fin structure, a barrier layer over the second gate dielectric layer, and a second gate metal fill layer over the barrier layer. The first gate dielectric layer contains fluorine and hafnium, the first gate dielectric layer has a first average fluorine concentration and a first average hafnium concentration, a first ratio of the first average fluorine concentration to the first average hafnium concentration is greater than 0.01. The second gate dielectric layer contains fluorine and hafnium, the second gate dielectric layer has a second average fluorine concentration and a second average hafnium concentration, and a second ratio of the second average fluorine concentration to the second average hafnium concentration is greater than 0.01 and lower than the first ratio.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a first fin structure over a first region of a substrate and a second fin structure over a second region of the substrate;
    forming a first gate dielectric layer around the first fin structure and a second gate dielectric layer around the second fin structure;
    forming a barrier layer over the first gate dielectric layer;
    treating the substrate with a first fluorine-containing gas;
    forming a work function layer over the second gate dielectric layer after treating the substrate with the first fluorine-containing gas;
    treating the substrate with a second fluorine-containing gas after forming the work function layer over the second gate dielectric layer; and
    forming a first metal fill layer over and in contact with the barrier layer and forming a second metal fill layer over and in contact with the work function layer after treating the substrate with the second fluorine-containing gas.

2. The method for forming the semiconductor structure as claimed in claim 1, wherein:
    the substrate is treated with the first fluorine-containing gas so that fluorine diffuses into the second gate dielectric layer,
    the second gate dielectric layer after treating the substrate with the first fluorine-containing gas has a first average fluorine concentration,
    the second gate dielectric layer after forming the work function layer over the second gate dielectric layer has a second average fluorine concentration, and
    the second average fluorine concentration is lower than the first average fluorine concentration.

3. The method for forming the semiconductor structure as claimed in claim 2, wherein:
    the substrate is treated with the second fluorine-containing gas so that fluorine diffuses into the second gate dielectric layer,
    the second gate dielectric layer after treating the substrate with the second fluorine-containing gas has a third average fluorine concentration, and
    the third average fluorine concentration is higher than the second average fluorine concentration.

4. The method for forming the semiconductor structure as claimed in claim 1, wherein:
    the substrate is treated with the first fluorine-containing gas so that fluorine diffuses into the first gate dielectric layer,
    amplified fluorine concentration is defined as fluorine concentration of the first gate dielectric layer multiplied by 20,
    the first gate dielectric layer has a hafnium concentration,
    the first gate dielectric layer includes a first portion and a second portion that is closer to the barrier layer than the first portion,
    in the first portion of the first gate dielectric layer, the hafnium concentration is greater than the amplified fluorine concentration, and
    in the second portion of the first gate dielectric layer, the amplified fluorine concentration is greater than the hafnium concentration.

5. A method for forming a semiconductor structure, comprising:
    forming a first fin structure, a second fin structure and a third fin structure over a substrate;
    forming a first gate dielectric layer over the first fin structure, a second gate dielectric layer over the second fin structure and a third gate dielectric layer over the third fin structure;
    forming a barrier layer covering the second gate dielectric layer while exposing the first gate dielectric layer, wherein the third gate dielectric layer is exposed from the barrier layer;
    soaking the substrate in a first fluorine-containing gas after forming the barrier layer to diffuse fluorine into the first gate dielectric layer and the second gate dielectric layer, wherein the substrate is soaked in the first fluorine-containing gas to diffuse fluorine into the third gate dielectric layer;
    forming a work function layer covering the third gate dielectric layer while exposing the first gate dielectric layer and the barrier layer after soaking the substrate in the first fluorine-containing gas;
    forming a first gate metal fill layer over the first gate dielectric layer, a second gate metal fill layer over the barrier layer, and a third gate metal fill layer over the work function layer after soaking the substrate in the first fluorine-containing gas; and
    soaking the substrate in a second fluorine-containing gas after forming the first gate metal fill layer to diffuse fluorine into the first gate dielectric layer.

6. The method for forming the semiconductor structure as claimed in claim 5, wherein:
    after soaking the substrate in the first fluorine-containing gas, the first gate dielectric layer has a first average fluorine concentration,
    after forming the first gate metal fill layer over the first fin structure, the first gate dielectric layer has a second average fluorine concentration, and
    the second average fluorine concentration is lower than the first average fluorine concentration.

7. The method for forming the semiconductor structure as claimed in claim 6, wherein after soaking the substrate in the second fluorine-containing gas, the first gate dielectric layer has a third average fluorine concentration, and the third average fluorine concentration is greater than the second average fluorine concentration.

8. The method for forming the semiconductor structure as claimed in claim 7, wherein:
first amplified average fluorine concentration is defined as the third average fluorine concentration multiplied by 20, hafnium in the first gate dielectric layer has a first average hafnium concentration, and a first ratio of the first amplified average fluorine concentration to the first average hafnium concentration is greater than 1, and
after soaking the substrate in the first fluorine-containing gas, the second gate dielectric layer has a fourth average fluorine concentration, second amplified average fluorine concentration is defined as the fourth average fluorine concentration multiplied by 20, hafnium in the second gate dielectric layer has a second average hafnium concentration, and a second ratio of the second amplified average fluorine concentration to the second average hafnium concentration is in a range from about 0.2 to about 1.

9. The method for forming the semiconductor structure as claimed in claim 5, wherein the first gate metal fill layer is in direct contact with the first gate dielectric layer.

10. The method for forming the semiconductor structure as claimed in claim 5, wherein:
after soaking the substrate in the first fluorine-containing gas, the third gate dielectric layer has a fifth average fluorine concentration,
after forming the work function layer covering the third gate dielectric layer, the third gate dielectric layer has a sixth average fluorine concentration, and
the sixth average fluorine concentration is lower than the fifth average fluorine concentration.

11. The method for forming the semiconductor structure as claimed in claim 5, further comprising
after forming the work function layer and before forming the third gate metal fill layer, soaking the substrate in a third fluorine-containing gas to diffuse fluorine into the third gate dielectric layer.

12. The method for forming the semiconductor structure as claimed in claim 5, further comprising:
forming a capping layer over the first gate dielectric layer and the second gate dielectric layer;
annealing the first gate dielectric layer and the second gate dielectric layer; and
removing the capping layer to expose the first gate dielectric layer and the second gate dielectric layer.

13. The method for forming the semiconductor structure as claimed in claim 5, wherein forming the barrier layer comprises:
forming a barrier material over the first gate dielectric layer and the second gate dielectric layer, wherein a portion of the barrier material formed over the first gate dielectric layer is oxidized to form a first barrier oxide;
forming a mask layer covering a portion of the barrier material formed over the second gate dielectric layer;
removing the first barrier oxide to expose the first gate dielectric layer while the portion of the barrier material formed over the second gate dielectric layer remains to form the barrier layer; and
removing the mask layer to expose the barrier layer.

14. A method for forming a semiconductor structure, comprising:
forming a fin structure in which first semiconductor layers and second semiconductor layers are alternatingly stacked;
removing the first semiconductor layers of the fin structure;
forming a gate dielectric layer to surround the second semiconductor layers of the fin structure;
incorporating fluorine into the gate dielectric layer to form a first fluorine-doped gate dielectric layer;
forming a first metal layer to surround the first fluorine-doped gate dielectric layer, wherein fluorine escapes from the first fluorine-doped gate dielectric layer to form a first fluorine-escaping gate dielectric layer; and
incorporating fluorine into the first fluorine-escaping gate dielectric layer to form a second fluorine-doped gate dielectric layer.

15. The method for forming the semiconductor structure as claimed in claim 14, wherein a ratio of an average fluorine concentration to an average hafnium concentration of the first fluorine-doped gate dielectric layer is in a range from about 0.01 to about 0.5.

16. The method for forming the semiconductor structure as claimed in claim 14, wherein a ratio of an average fluorine concentration to an average hafnium concentration of the first fluorine-escaping gate dielectric layer is less than 0.01.

17. The method for forming the semiconductor structure as claimed in claim 14, further comprising:
removing the first metal layer before the second fluorine-doped gate dielectric layer is formed;
forming a second metal layer to surround the second fluorine-doped gate dielectric layer, wherein fluorine escapes from the second fluorine-doped gate dielectric layer to form a second fluorine-escaping gate dielectric layer; and
incorporating fluorine into the second fluorine-escaping gate dielectric layer to form a third fluorine-doped gate dielectric layer.

18. The method for forming the semiconductor structure as claimed in claim 17, wherein the second metal layer is in direct contact with the third fluorine-doped gate dielectric layer.

19. The method for forming the semiconductor structure as claimed in claim 1, further comprising:
forming a first source/drain feature doped with an n-type dopant on the first fin structure; and
forming a second source/drain feature doped with a p-type dopant on the second fin structure.

20. The method for forming the semiconductor structure as claimed in claim 1, wherein treating the substrate with the first fluorine-containing gas is performed at a temperature in a range from about 300° C. to about 450° C.

* * * * *